(12) United States Patent
Schaus et al.

(10) Patent No.: US 8,364,428 B2
(45) Date of Patent: Jan. 29, 2013

(54) JUNCTION-PHOTOVOLTAGE METHOD AND APPARATUS FOR CONTACTLESS DETERMINATION OF SHEET RESISTANCE AND LEAKAGE CURRENT OF SEMICONDUCTOR

(75) Inventors: Frederic Schaus, Eupen (BE); Trudo Clarysse, Antwerp (BE)

(73) Assignee: IMEC, Leuven (BE)

( * ) Notice: Subject to any disclaimer, the term of this patent is extended or adjusted under 35 U.S.C. 154(b) by 61 days.

(21) Appl. No.: 12/620,349

(22) Filed: Nov. 17, 2009

(65) Prior Publication Data
US 2010/0153033 A1    Jun. 17, 2010

Related U.S. Application Data

(63) Continuation of application No. PCT/EP2008/056132, filed on May 19, 2008.

(60) Provisional application No. 60/939,015, filed on May 18, 2007.

(51) Int. Cl.
*G01R 13/02* (2006.01)
*G01R 13/04* (2006.01)
*G01R 13/14* (2006.01)
*G01R 13/22* (2006.01)

(52) U.S. Cl. .............. 702/57; 702/64; 702/69; 702/74

(58) Field of Classification Search ............ 702/57, 702/127, 134, 136, 118, 172; 324/522; 347/14; 438/567
See application file for complete search history.

(56) References Cited

U.S. PATENT DOCUMENTS

| | | | |
|---|---|---|---|
| 7,019,513 B1* | 3/2006 | Faifer et al. | 324/754.23 |
| 7,414,409 B1* | 8/2008 | Faifer et al. | 324/522 |
| 7,714,596 B2* | 5/2010 | Chen et al. | 324/715 |
| 7,898,280 B2* | 3/2011 | Kamieniecki | 324/762.01 |

OTHER PUBLICATIONS

Clarysse et al, Accurate sheet resistance measurement on ultra-shallow profiles, Doping Engineering for Device Fabrication, Materials Research Society Symposium Proceedings, 912:197-202, 2006.
Clarysse et al., Insights in junction photo-voltage based sheet resistance measurements for advanced CMOS, Proceedings of the INSIGHT-07 workshop, J. Vac. Sci. Technol. B 26, 420 (Feb. 1, 2008).
Faifer et al, Influence of Halo implant on leakage current and sheet resistance of ultra-shallow p-n junctions; proceedings of the INSIGHT 2007 workshop, Napa (CA), 2007.
Faifer et al, Influence of Halo implant on leakage current and sheet resistance of ultra-shallow p-n junctions; in proceedings of the INSIGHT 2007 workshop, Napa (CA), J. Vac. Sci. Technol. B25(5), pp. 1588-1592, Sep./Oct. 2007.

(Continued)

*Primary Examiner* — Michael Nghiem
*Assistant Examiner* — Felix Suarez
(74) *Attorney, Agent, or Firm* — Knobbe Martens Olson & Bear LLP

(57) ABSTRACT

A junction-photovoltage method and apparatus for contactless determination of an electrical/physical parameter of a semiconductor structure having at least one p-n junction located at a surface is disclosed. In one aspect, the method includes illuminating the surface with the p-n junction with a light beam of a first wavelength to create excess carriers at the surface. The method also includes modulating the light intensity of the light beam at a single predefined frequency. The method also includes determining a first photo-voltage at a first position inside the illuminated area and a second photo-voltage at at least a second position outside the illuminated area. The method also includes calculating an electrical/physical parameter of the semiconductor structure based on the first and second photo-voltage.

18 Claims, 50 Drawing Sheets

OTHER PUBLICATIONS

Faifer et al, Noncontact sheet resistance and leakage current mapping for ultra-shallow junctions; J. Vac. Sci. Technol. B24, 414-420, Jan./Feb. 2006.

Faifer et al., Leakage Current and Dopant Activation Characterization of SDE/Halo CMOS Junctions with Non-contact Junction Photo-voltage Metrology, presented at Frontiers of Characterization and Metrology for Nanoelectronics, NIST, Gaithersburg, MD, Mar. 27-29, 2007; American Institute of Physics 2007.

Fréderic Schaus, Master Thesis "Modelling of non-contact sheet resistance and leakage current measurements on advanced CMOS structures" from the University of Liège, Academic Year 2006/2007.

Gerald Lucovsky; Photoeffects in nonuniformly irradiated p-n junctions. Journal of Applied Physics, 31(6):1088-1095, Jun. 1960.

International Search Report dated Mar. 12, 2009 for PCT/EP2008/056132.

Thomas Zangerle, Model for the interpretation of non-contact sheet resistance and leakage measurements on ultra shallow junction profiles. Master's thesis, Universite de Liege, 2006.

ITRS roadmap; available at http://www.itrs.net/; accessed on Jun. 8, 2011.

Mathematica software package; available at www.wolfram.com; accessed on Jun. 8, 2011.

Scilab open source platform for numerical calculation; available at www.scilab.org; accessed on Jun. 8, 2011.

Taurus medici user guide, Version Y-20D6.06, Synopsys, Jun. 2006 available at http://www.stanford.edu/~jqguo/md_Y-2006.06_ug.pdf; accessed Jun. 8, 2011.

* cited by examiner

Timecurve for $J_s = 2.6 \cdot 10^{-11} [A/cm^2]$

Timecurve for $J_s = 3.9 \cdot 10^{-5} [A/cm^2]$

Structure $R_s, G_s, C_s$ → Scilab/Medici simulator → V1c, V2c, Rc / V11, V21, V12, V22 → Mathematica: System of equations → $R'_s, G'_s, C'_s$

FIG. 19

JUNCTION-PHOTOVOLTAGE METHOD AND APPARATUS FOR CONTACTLESS DETERMINATION OF SHEET RESISTANCE AND LEAKAGE CURRENT OF SEMICONDUCTOR

CROSS REFERENCE TO RELATED APPLICATIONS

This application is a continuation of PCT Application No. PCT/EP2008/056132, filed May 19, 2008, which claims priority under 35 U.S.C. §119(e) to U.S. provisional patent application 60/939,015 filed on May 18, 2007. Each of the above applications is incorporated herein by reference in its entirety.

BACKGROUND OF THE INVENTION

1. Field of the Invention

The invention relates to the field of a junction-photovoltage method and an apparatus for contactless determination of an electrical and/or physical parameter of a semiconductor structure comprising at least one p-n junction located at a surface. Particularly, the invention relates to a method and an apparatus for non-contact determination of sheet resistance and leakage current of a semiconductor structure comprising at least two p-n junctions located at the surface of a substrate.

2. Description of the Related Technology

It is generally known that a field effect transistor comprises a channel region controlled by a gate electrode, whereby the channel region is electrically contacted via source/drain regions located at opposite ends along the length of the channel. When scaling down device dimensions, as e.g. predicted by the International Technology Roadmap for Semiconductors (ITRS), more complex processes and structures are needed to construct source/drain regions which comply with the electrical, physical and geometrical requirements imposed.

Ideally a source/drain contact region should offer a low sheet resistance, a low contact resistance, a low leakage current, and has a limited extension into the substrate and towards the channel, such that the contact region can be fabricated in thin semiconductor surface layers without affecting the dimensions of the channel region. To this end, advanced process techniques such as cluster implant, plasma doping, non-laser melt annealing etc., can be applied allowing shallow implantation depth and high activation of the implanted species. Also additional doped regions, such as extension regions, halo and/or pocket implants are formed adjacent to the source/drain regions to limit the impact of the source/drain contact region on channel characteristics, such as the effective channel length and/or the threshold voltage.

Often multiple species are combined to form the source/drains as e.g. in recessed source/drain structures whereby a cavity created at the location of the source/drain regions is filled with carbon-doped silicon. Hence, instead of consisting of a single doped layer, these contact regions might comprise multiple, often opposite, doped layers. It thus becomes more challenging to determine in an accurate way the electrical properties of a complex contact region, in particular of the surface layers involved: sheet resistance, junction leakage current between opposed doped layers etc. as not all defects are eliminated by these advanced anneal processes.

Recently, junction photo-voltage (JPV) based tools have been introduced, which allows obtaining, in a non-physical contact way, the sheet resistance of junction isolated layers positioned near the surface of the substrate. The Junction Photo-Voltage (JPV) technique allows measuring the variation of the near-surface band bending or surface barrier of a p-n junction when being illuminated with varying intensity. In a non-contact JPV measurement technique, an electrode of the measurement apparatus is positioned adjacent to, but not physically contacting, the surface of the sample under study as to form a capacitor structure therewith. The resulting electrostatic interaction between the two plates, i.e. the electrode and the sample surface, can be observed via variations in the charge stored or in the change of the force applied. From such measurements the variation of the band bending or barrier at the surface of the sample can be deducted.

U.S. Pat. No. 7,019,513 describes a junction photo-voltage apparatus and method for simultaneously measuring the sheet resistance of an ultra-shallow (sub 50 nm) p-n junction and its leakage current. The p-n junction is a stack of an n-doped and p-doped layer formed on a substrate. In the following, the term "stack" is used as a synonym for a semiconductor structure. The basis of the measurement is to use photo-excitation of carriers in this junction and to monitor, in a spatially resolved manner, the generation/recombination and drift of these carriers with two electrodes, a first electrode at the center of the probe and a second electrode offset from the first electrode. The measurement probe disclosed thus consists out of two parts, a first, transparent circular, electrode with a radius $R_0$, through which first electrode the p-n junction can be illuminated, and a second, arc-shaped, electrode with inner and outer radii $R_1$ and $R_2$ and angle $\theta$, spaced apart from the first electrode.

The first electrode is used to probe the surface photo-voltage $V_1$ in the illuminated area underneath the first electrode, while the second electrode is used to probe the surface photo-voltage $V_2$ outside the illuminated area. When using a intensity modulated light beam with a penetration depth larger than the width of the depletion region of the junction but smaller than the sum of the width of the junction depletion region and the carrier diffusion length, a junction photo-voltage will be measured at the first and second electrodes, respectively a first voltage $V_1$ [V] and a second voltage $V_2$ [V].

These voltages probed are given by the following equations (1) (cp. equations 6, 7 and 8 in U.S. Pat. No. 7,019,513).

$$V_1 = \left| \frac{q\Phi R_s}{k^2} \left[ 1 - \frac{2}{kR_0} \frac{I_1(kR_0)K_1(kR_0)}{I_0(kR_0)K_1(kR_0) + I_1(kR_0)K_0(kR_0)} \right] \right| \quad (1)$$

$$V_2 = \frac{\varphi}{2\pi} \left| 2q \frac{\Phi R_s}{k^3 R_0^2} \frac{I_1(kR_0)[R_1 K_1(kR_1) - R_2 K_1(kR_2)]}{I_0(kR_0)K_1(kR_0) + I_1(kR_0)K_0(kR_0)} \right|$$

where $k=\sqrt{R_s G_s + i\omega R_s C_s}$, $R_s$ is the sheet resistance of the top layer of the junction [Ω/sq], $G_s$ is the conductance of the junction at zero bias [Ω$^{-1}$cm$^{-2}$], $C_s$ is the capacitance of the junction [Fcm$^{-2}$], $\omega=2\pi f$ [rad] with f the intensity modulation frequency of the light beam [Hz], q is the elementary charge [C], $\Phi$ is the effective light flux propagating inside the semiconductor [J$^{s-1}$], I and K are modified Bessel functions of respectively the first and second kind, and i is the imaginary unit, $R_o$ radius of the first probe [cm], $R_1$ and $R_2$ are the inner and outer radii of the second probe [cm] while $\phi$ is the angle thereof [rad].

U.S. Pat. No. 7,019,513 further describes a method for determining from a test p-n junction the sheet resistance $R_s$, junction capacitance $C_s$ and junction leakage current $J_s$, the latter being proportional to the junction conductance $G_s$. First a junction capacitance calibration wafer with negligible leakage current and known sheet resistance $R_{sc}$ is measured at a high intensity modulating frequency $f_1$ to obtain the ratio $(V_{1c}/V_{2c})$ involving $k=k_c=\sqrt{2\pi i f R_{sc} C_{sc}}$ leading to the determination of $C_{sc}$, the capacitance of the junction of the calibration wafer. Then the test p-n junction is measured to obtain the ratios $(V_{11}/V_{21})$ and $(V_{12}/V_{22})$ at a high $f_1$ and low $f_2$ intensity modulation frequency, respectively. Combined with the expression $V_{11}/V_{1c}$, one obtains three equations in the three unknown test wafer parameters $R_s$, $G_s$ and $C_s$ from which one can extract these three values uniquely.

The method and apparatus described in U.S. Pat. No. 7,019,513 however show several shortcomings. One shortcoming is that the formulas used to determine the first and second voltages are rather complex and require considerable computation time. Another shortcoming is that the method only allows determining sheet resistance $R_s$, junction capacitance $C_s$ and junction leakage current $J_s$ of a single p-n junction at the surface of a substrate, whereas advanced junctions might comprise multiple, often opposite, doped layers. Additionally, a reference measurement with a reference p-n junction is required to get a reasonable quantitative result. Further, the light beam involved has to be modulated at least two modulation frequencies.

SUMMARY OF CERTAIN INVENTIVE ASPECTS

Certain inventive aspects relate to a fast, accurate and easy to use method and apparatus for contactless determination of an electrical and/or physical parameter of a semiconductor structure that comprises at least one p-n junction, preferably at least two p-n junctions located at a surface of a substrate.

This object is achieved by a junction-photovoltage method for contactless determination of an electrical and/or physical parameter of a semiconductor structure comprising at least one p-n junction located at a surface, comprising:

a) illuminating the surface with the p-n junction of the semiconductor structure with a light beam of a first wavelength to create excess carriers at the surface;

b) modulating the light intensity of the light beam at a single predefined frequency;

c) determining a first photo-voltage at a first position inside the illuminated area and determining a second photo-voltage at least a second position outside the illuminated area; and d) calculating an electrical and/or physical parameter of the semiconductor structure based on the first photo-voltage and on the second photo-voltage.

The determining of a first and second photo-voltages is preferably done contactlessly in accordance with certain inventive aspects. It is worth noting that the junction photo-voltage technique (JPV technique) in one aspect, which will be described in more detail in the following, differs from the photo-modulated optical reflectance technique in certain aspects. For instance, a single light beam is sufficient to generate or create carriers. Another aspect is that no light signal has to be captured, but a change in electrostatic potential (i.e. junction photo-voltage) is determined or measured, respectively, with an electrode that does not touch the surface of a substrate i.e. with an electrode that is capacitively coupled to the surface of a waver that can e.g. be a calibration waver.

According to one embodiment a contactless method for measuring, in a semiconductor structure having at least one surface p-n junction, an electrical and/or physical parameter of the surface p-n junction, is disclosed, the method comprising, illuminating an area of the semiconductor structure with a light beam, the light beam having a wavelength $\lambda_i$, selected to create excess carriers at the surface p-n junction and a light intensity modulated at a frequency $f_j$, with i, j being integers, measuring, while illuminating the semiconductor structure, the photo-voltage at one position inside the illuminated area and at least one position outside the illuminated area, and determining from the measured photo-voltages electrical and/or physical parameters of at least one p-n junction, using the relationship $$V_1 = \left| \frac{qFR_s}{\beta^2}[1 - 2I_1(\beta R_0)K_1(\beta R_0)] \right|$$

$$V_2 = \left| \frac{\theta}{2\pi} \frac{2qFR_s}{\beta^2 R_0} I_1(\beta R_0)[R_1 K_1(\beta R_1) - R_2 K_1(\beta R_2)] \right|$$

with $\beta = \sqrt{R_s G_s + i\omega R_s C_s}$.

According to another embodiment, the method further comprises obtaining at least 4 different photo-voltage measurement results by selecting the number of measurement positions outside the illuminated area and/or by measuring at multiple wavelengths $\lambda_i$ and/or by measuring at multiple modulation frequencies $f_j$ or a combination thereof.

According to yet another embodiment, the method further comprises obtaining measurement results from a calibration wafer.

According to yet another embodiment, a contactless method for measuring in a semiconductor structure comprising at least two surface p-n junctions, an electrical and/or physical parameter of each of the at least two surface p-n junctions, is proposed, the method preferably comprising illuminating an area of the semiconductor structure with a light beam, the light beam having a wavelength $\lambda_i$, selected to create excess carriers at one or more of the surface p-n junctions and a light intensity modulated at a frequency $f_j$, with i, j being integers, measuring, while illuminating the semiconductor structure, the photo-voltage at one position inside the illuminated area and at least one position outside the illuminated area, and determining from the measured photo-voltage electrical and/or physical parameters of each of the surface p-n junctions, using the relationship $$V_1 = \frac{(1-x_-)V_1^+ - (1-x_+)V_1^-}{x_+ - x_-}$$

$$V_2 = \frac{(1-x_-)V_2^+ - (1-x_+)V_2^-}{x_+ - x_-}$$

where $$V_1^\pm = -\frac{\zeta_1 + x_\pm \zeta_2}{\beta_\pm^2}[1 - 2K_1(\beta_\pm R_0)I_1(\beta_\pm R_0)]$$

$$V_2^\pm = -\frac{\theta}{\pi R_0} \frac{\zeta_1 + x_\pm \zeta_2}{\beta_\pm^2} I_1(\beta_\pm R_0)[R_1 K_1(\beta_\pm R_1) - R_2 K_1(\beta_\pm R_2)].$$

According to yet another embodiment, the method further comprises illuminating the area of the semiconductor structure with a light beam of a second wavelength different from the first wavelength and performing processes b) to d). In other words, this additional process is not performed simultaneously with the previous method processes but preferably after the processes involving the first wavelength.

According to yet another embodiment, the method further comprises modulating the light intensity of the light beam at a second predefined frequency different from the single predefined frequency and performing processes c) and d). In other words, this additional process is not performed simultaneously with the previous method processes but preferably after the processes involving the modulation with the single predefined frequency. Preferably, the second predefined frequency comprises a combination frequency of the single predefined frequency and the second predefined frequency.

In one aspect, all processes of the method are carried out on a calibration wafer comprising the semiconductor structure and a substrate.

According to one embodiment, the electrical and/or the physical parameter comprises at least one of a sheet resistance, a leakage current, a junction capacitance, a junction conductance and a carrier separation rate.

Preferably, the semiconductor structure comprises a layer of an opposite dopant type for separating at least two layers of the same dopant type. Most preferably, the semiconductor structure further comprises a substrate comprising a bulk semiconductor or a semiconductor-on-insulator.

According to yet another embodiment, the calculation in process d) is performed with the first photo-voltage $V_1$ and the second photo-voltage $V_2$ for at least one p-n junction according to $$V_1 = \left|\frac{qFR_s}{\beta^2}[1 - 2I_1(\beta R_0)K_1(\beta R_0)]\right|, \text{ and}$$

$$V_2 = \left|\frac{\theta}{2\pi}\frac{2qFR_s}{\beta^2 R_0}I_1(\beta R_0)[R_1 K_1(\beta R_1) - R_2 K_1(\beta R_2)]\right|,$$

with $\beta = \sqrt{R_s G_s + i\omega R_s C_s}$.

According to yet another embodiment, the calculation in process d) is performed with the first photo-voltage $V_1$ and the second photo-voltage $V_2$ for at least one p-n junction according to $$V_1 = \frac{(1-x_-)V_1^+ - (1-x_+)V_1^-}{x_+ - x_-}$$

$$V_2 = \frac{(1-x_-)V_2^+ - (1-x_+)V_2^-}{x_+ - x_-}$$

where $$V_1^{\pm} = -\frac{\zeta_1 + x_{\pm}\zeta_2}{\beta_{\pm}^2}[1 - 2K_1(\beta_{\pm}R_0)I_1(\beta_{\pm}R_0)]$$

$$V_2^{\pm} = -\frac{\theta}{\pi R_0}\frac{\zeta_1 + x_{\pm}\zeta_2}{\beta_{\pm}^2}I_1(\beta_{\pm}R_0)[R_1 K_1(\beta_{\pm}R_1) - R_2 K_1(\beta_{\pm}R_2)].$$

Most preferably, the calculation in process d) is performed with the first photo-voltage $V_1$ and the second photo-voltage $V_2$ for at least two p-n junctions. In other words, also multilayer structures can be investigated.

In yet another embodiment, the method further comprises obtaining at least 6, preferably 8, different photo-voltage measurement results by selecting the number of measurement positions outside the illuminated area and/or by measuring at multiple wavelengths $\lambda_i$ and/or by measuring at multiple modulation frequencies $f_j$ or a combination thereof.

Another inventive aspect relates to a junction-photovoltage apparatus for contactless determination of an electrical and/or physical parameter of a semiconductor structure comprising at least one p-n junction located at a surface, comprising:

a light source for illuminating the surface with the p-n junction of the semiconductor structure with a light beam of a first wavelength to create excess carriers at the surface;

a modulator for modulating the light intensity of the light beam at a single predefined frequency;

a measuring unit for determining a first photo-voltage at a first position inside the illuminated area and determining a second photo-voltage at least a second position outside the illuminated area; and a computing unit for calculating an electrical and/or physical parameter of the semiconductor structure based on the first photo-voltage and on the second photo-voltage.

In one aspect, the determining of a first and second photo-voltages is preferably done contactlessly. According to one embodiment, an apparatus for contactless measuring in a semiconductor structure, comprising at least one p-n junction, electrical and/or physical parameters of at least one of the p-n junctions, is disclosed, the apparatus comprising means for illuminating an area of the semiconductor substrate with a light beam, the light beam having a wavelength $\lambda_i$, and a light intensity modulated at a frequency $f_j$, with i, j being integers, and means for contactless measuring, while illuminating the semiconductor structure, the photo-voltage at one position inside the illuminated area and at least one position outside the illuminated area. Preferably, the apparatus comprises means for measuring the photo-voltage at more than one position outside the illuminated area. More preferably, these means comprise at least two electrodes at different positions outside the illuminated area. Most preferably, these means comprise an electrode which can move over the semiconductor structure outside the illuminated area.

According to yet another embodiment, the measuring unit comprises at least two electrodes at least two different positions outside the illuminated area. Most preferably, the measuring unit comprises at least one electrode that is moveable over the semiconductor structure outside the illuminated area.

Preferably, the apparatus is used for a semiconductor structure comprising a layer of an opposite dopant type for separating at least two layers of the same dopant type and/or for a semiconductor structure comprising a substrate that comprises a bulk semiconductor or a semiconductor-on-insulator.

The invention will be described in more detail in the following, thereby referring to the Master Thesis "Modelling of non-contact sheet resistance and leakage current measurements on advanced CMOS structures" by Fréderic Schaus from the University of Liège, 2006/2007. It will be also referred to the paper "Insights in junction photo-voltage based sheet resistance measurements for advanced CMOS" by T. Clarysse et al., Proceedings of the INSIGHT-07 workshop. It is noted that the term "dopant type" corresponds to a layer that has either holes or electrons as majority charge carriers, in which case these layers are labeled as respectively p-type doped and n-type doped. A layer is p-type doped if the netto doping, i.e. combination of donors and acceptors, result in holes as majority carriers. A layer is n-type doped if the netto doping, i.e. combination of donors and acceptors, result in electrons as majority carriers.

Finally, it is worth noting that the method and the apparatus provides highly accurate and reliable results in a short computing time.

BRIEF DESCRIPTION OF THE DRAWINGS

These and other aspects of the invention will be apparent from and elucidated with reference to the embodiments described hereinafter.

FIG. 19 illustrates a simulation flowchart.

DETAILED DESCRIPTION OF CERTAIN ILLUSTRATIVE EMBODIMENTS

Figure 1:
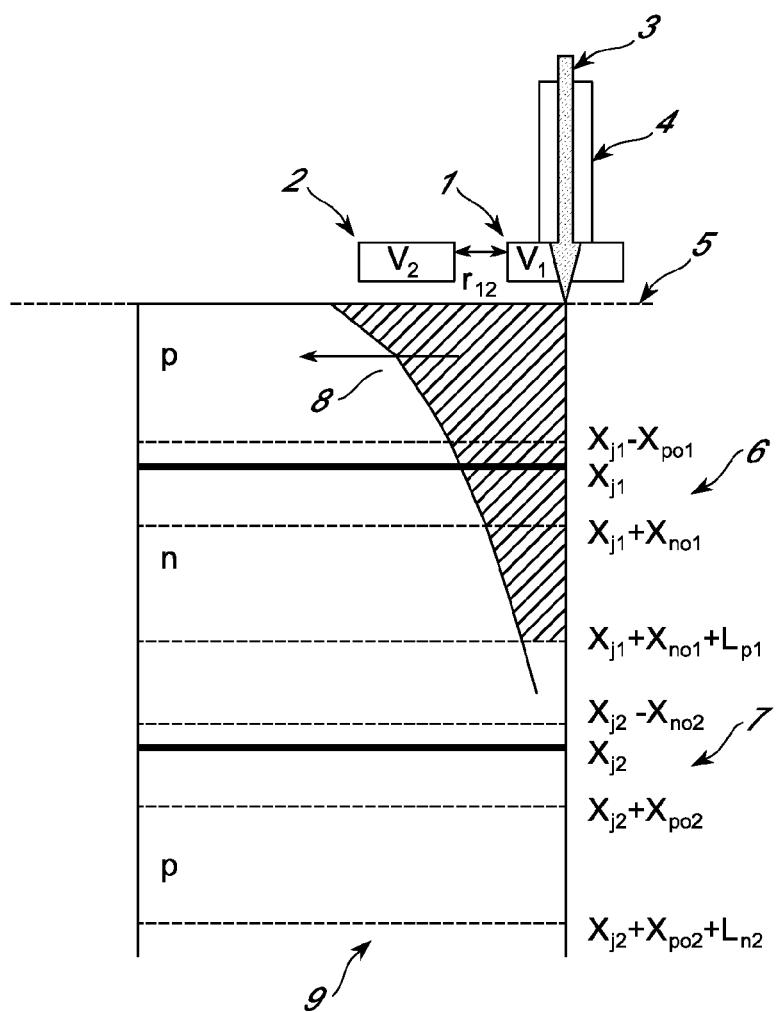
FIG. 1 depicts two p-n-junctions located at the surface of a substrate according to a first embodiment of the invention.

The present invention will be described with respect to particular embodiments and with reference to certain drawings but the invention is not limited thereto but only by the claims. Any reference signs in the claims shall not be construed as limiting the scope. The drawings described are only schematic and are non-limiting. In the drawings, the size of some of the elements may be exaggerated and not drawn on scale for illustrative purposes.

Where the term "comprising" is used in the present description and claims, it does not exclude other elements or steps. Where an indefinite or definite article is used when referring to a singular noun e.g. "a" or "an", "the", this includes a plural of that noun unless something else is specifically stated.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

The terms deeper or higher are used to denote the relative position of elements in a substrate. With deeper is meant that these elements are more distant from a main surface of the substrate from which side the measurement is to be performed.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

According to an embodiment of the invention, the semiconductor structure is located on a substrate. In one embodiment of the invention, the substrate is a bulk semiconductor substrate or a semiconductor-on-insulator substrate, such as a silicon-on-insulator (SOI) substrate or a germanium-on-insulator (GOI) substrate. The sequence of layers of the opposite dopant type can be formed by implanting n-type and p-type dopants at different depths in a semiconductor layer on the substrate. This sequence of layers of opposite dopant type can be formed by alternating depositing n-type and p-type doped layers on the substrate.

The n-type and p-type layers can be formed in a single semiconductor material, e.g. silicon, in which a homo-junction is obtained between adjacent layers. The n-type and p-type layers can be formed of different semiconductor materials, e.g. Si, SiGe, Ge, III-V materials such as GaAs, AlGaAS, in which case a hetero junction is obtained. The n-type and p-type layers can also differ in sheet resistance, doping level and defect density thereby influencing the junction leakage current.

The junction or junctions of which the electrical and or physical parameter(s) are to be extracted are formed near the surface of the substrate. The depth at which these junction(s) can be located depends on the penetration depth of the beam used to provide photo-excitation of the carriers. This penetration depth is proportional to the wavelength of the light beam. The wavelength of the light beam is selected to yield, in the test sample to be measured, a penetration depth larger than the width of the depletion region of the deepest junction to be screened, but smaller than the sum of the width of the depletion region of this deepest junction to be screened and the carrier diffusion length. This way, all junctions to be measured are subject to photo-excitation.

In a first embodiment of the invention, the electrical properties of a single p-n junction 6 near the surface of a substrate 9 is measured. The basis of the measurement is to use photo-excitation of carriers in this junction and to monitor, in a spatially resolved manner, the generation/recombination and drift of these carriers with two electrodes, a first electrode 1 at the center of the probe and a second electrode 2 offset from the first electrode as shown in FIG. 1. Due to the modulation of the intensity of the light beam 3, e.g. originating from an LED or a laser source, the surface potential at the surface 5 will also vary with time. The light beam 3 is guided through the light guide 4 to the surface 5 of the substrate 9. The measurement probe disclosed thus consists out of two parts, a first, transparent preferably circular-shaped, electrode with a radius $R_0$, through which first electrode 1 the p-n junction can be illuminated, and a second, preferably arc-shaped, electrode 2 with inner and outer radii $R_1$ and $R_2$ and angle $\theta$, spaced apart from the first electrode. The first electrode 1 is used to probe the surface photo-voltage $V_1$ in the illuminated area underneath the first electrode, while the second electrode 2 is used to probe the surface photo-voltage $V_2$ outside the illuminated area. Another electrode is used to ground the substrate. Preferably this third electrode is connected to the substrate at a main surface opposite the surface where the junction is located.

When using an intensity modulated light beam with a penetration depth larger than the width of the depletion region of the junction $(X_j+X_{no})$ but smaller than the sum of the width of the depletion region of the junction and the carrier diffusion length $(X_j+X_{no}+L_p)$, a junction photo-voltage will be measured at the first 1 and second 2 electrodes, respectively a first voltage $V_1$ [V] and a second voltage $V_2$ [V]. Here $X_j$ is the depth of the metallurgical junction, $X_{no}$ is the extension of the corresponding depletion region in to the substrate and $L_p$ is the diffusion length. These voltages probed are given by the following equations $$V_1 = \left| \frac{qFR_s}{\beta^2}[1 - 2I_1(\beta R_0)K_1(\beta R_0)] \right| \quad [V](2)$$

$$V_2 = \left| \frac{\theta}{2\pi} \frac{2qFR_s}{\beta^2 R_0} I_1(\beta R_0)[R_1 K_1(\beta R_1) - R_2 K_1(\beta R_2)] \right| \quad [V](3)$$

here $\beta=\sqrt{R_s G_s + i\omega R_s C_s}$, $R_s$ is the sheet resistance of the top layer of the junction [$\Omega$/sq], $G_s$ is the conductance of the junction at zero bias [$\Omega^{-1}$cm$^{-2}$], $C_s$ is the capacitance of the junction [Fcm$^{-2}$], $\omega=2\pi$ f [rad] with f the intensity modulation frequency of the light beam [Hz], q is the elementary charge [C], F is the electron-hole pair separation rate [s$^{-1}$cm$^{-2}$], I and K are modified Bessel functions of respectively the first and second kind, and i is the imaginary unit, $R_o$ radius of the first probe [cm], $R_1$ and $R_2$ are the inner and outer radii of the second probe [cm] while $\theta$ is the angle thereof [rad]. The thus obtained equations easies the determination of electrical properties of the illuminated junction thanks to the less complex formulation of the relationship found between the measured voltages and these electrical properties.

The p-n junction 6 of the test sample is measured to obtain the ratios $(V_{11}/V_{21})$ and $(V_{12}/V_{22})$ at a high $f_1$ and low $f_2$ intensity modulation frequency respectively. Using the ratio $(V_{11}/V_{1c})$ of $V_{11}$ on a test wafer to $V_{1c}$ on a calibration wafer, with negligible leakage current and known sheet resistance, both measured at high modulation frequency $f_1$ with the same wavelength as in the previous measurements, one obtains a third equation in the three unknown test wafer parameters $R_s$, $G_s$ and $C_s$. This way one obtains three equations in the three unknown test wafer parameters $R_s$, $G_s$ and $C_s$ from which one can extract these three values uniquely. The only unknown for the calibration wafer, i.e. the junction capacitance $C_{sc}$, can be obtained from the ratio $V_{1c}/V_{2c}$ measured on the calibration wafer with a high modulation frequency $f_1$, as the sheet resistance $R_{sc}$ of the calibration wafer is known and $G_{sc}$ is negligible.

Other ways of obtaining the appropriate number of independent equations can be applied. If 4 different measurement values are obtained, the four unknown test wafer parameters $R_s$, $G_s$, $C_s$, F can be extracted therefore using the formulas (2) and (3) above. Hence by selecting the number of measurement positions outside the illuminated area and/or by measuring at multiple wavelengths $\lambda_i$ and/or by measuring at multiple modulation frequencies $f_j$ or a combination thereof one can obtain at least 4 independent equations in the 4 unknown test wafer parameters.

The behavior of the analytical equations of the first embodiment correspond well with Synopsis/Medici device simulation, confirming the correctness of the found analytical equations 2 and 3.

In this first embodiment the concept disclosed is applied to a multi stack structure, i.e. a semiconductor structure with several layers and/or at least two p-n junctions, a first p-n junction 6 and a second p-n junction 7. This multi-stack structure is preferably a dual junction structure consisting of a substrate having a first p-type (or n-type) doped layer on top of a second n-type (or p-type) doped layer on top of a p-type (or n-type) doped substrate. The sheet resistances of all junction isolated layers, as well as the junction leakage current of all junctions can be extracted in a non-contact way, i.e. the first 1 and second 2 electrodes are capacitively coupled with the surface 5 of the substrate 9. This may be beneficial in characterizing semiconductor structures comprising multiple layers of opposite dopant type, such as source-drains or their extension implanted into well, halo or pocket implants. The measurement set-up discussed in the first embodiment can also be used in other measurement methods.

The wavelength of the light beam 3 is selected to yield, in the test sample to be measured, a penetration depth larger than at least the width of the depletion region of the first junction 6 and at most the width of the depletion region of the deepest junction to be screened, but smaller than the sum of the width of the depletion region of this deepest junction to be screened and the carrier diffusion length. This way, all junctions to be measured are subject to photo-excitation, i.e. to photo-generation 8, and can contribute to the junction photo-voltage measured at the electrodes 1 and 2 of the probe. This is illustrated in FIG. 1 and in FIG. 2 that illustrates the second embodiment of the invention. Because of the radial symmetry in the junction photo-voltage effect only half of measurement set-up is shown in these figures.

FIG. 1 shows a schematic representation of the measurement. A light beam 3 is impinging through the first, transparent, electrode $V_1$ 1 on the surface 5 of the test sample to be analyzed to create excess carries in the substrate 9. The wavelength $\lambda_i$ and the intensity modulating frequency $f_i$ of this light beam 3 can be selected as will be discussed later. Preferably, the wavelength $\lambda_i$ is selected in the range about 1000 nm to about 300 nm. Preferably, the modulation frequency $f_i$ is in the range 200 Hz to 1 MHz, preferably between 2 kHz and 100 kHz. The higher this frequency the smaller the junction photo-voltage signal measured at a given position on the test sample. A second electrode $V_2$ 2 is placed at certain distance $r_{12}$ from the first electrode 1.

The test sample comprises a first junction 6 between a first, p-type, layer and a second, n-type layer. The first junction 6 has a metallurgical junction depth $X_{j1}$ and a depletion region with an extension width $X_{po1}$ into the first layer and an extension width $X_{no1}$ into the second layer. The extension widths depend on the doping levels of the first and second layer. $L_{p1}$ is the hole diffusion length in the second layer, while $L_{n1}$ is the electron diffusion length in the first layer. It is assumed that $L_{n1} \ll X_{j1}$. The test sample further comprises a second junction 7 between the second, n-type, layer and a third, p-type layer. The second junction 7 has a metallurgical junction depth $X_{j2}$ and a depletion region with an extension width $X_{no2}$ into the second layer and an extension width $X_{po2}$ into the third layer. The extension widths depend on the doping levels of the second and third layer. $L_{p2}$ is the hole diffusion length in the second layer, while $L_{n2}$ is the electron diffusion length in the third layer.

In FIG. 1 the wavelength $\lambda_i$ of the light beam is selected to only generate excess carriers near the first junction 6 thereby leaving the second junction 7 essentially unaffected. Hence $X_{j1}+X_{no1} <$ penetration depth $(\lambda_i) < X_{j1}+X_{no1}+L_{p1}$.

Figure 2:
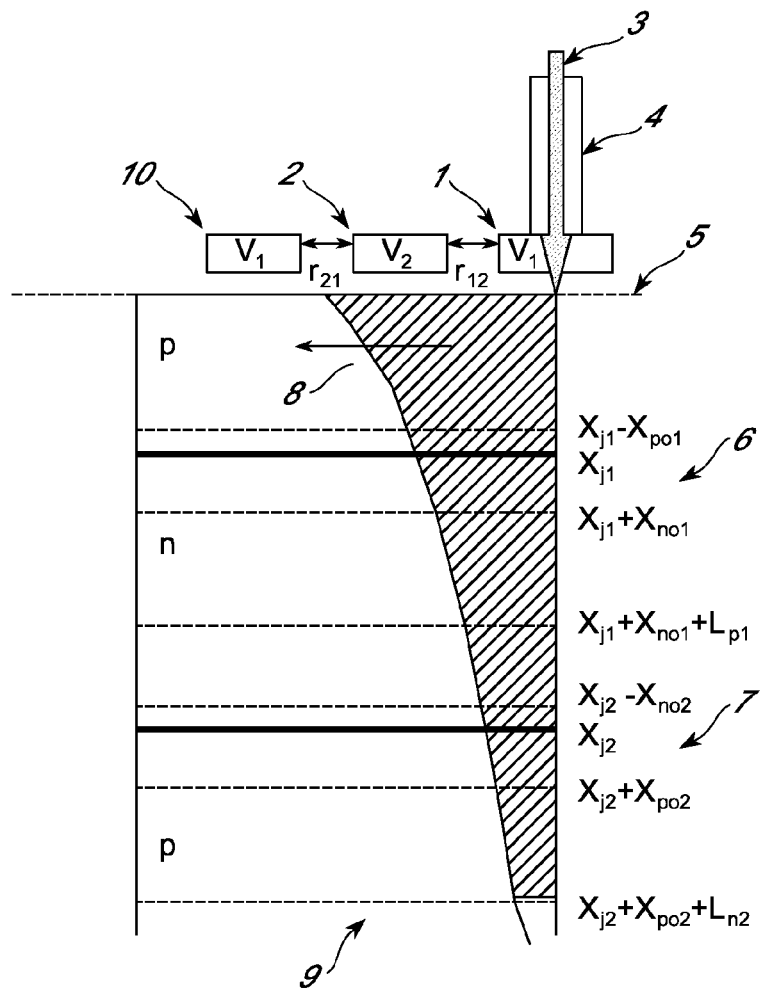
FIG. 2 depicts two p-n-junctions located at the surface of a substrate according to a second embodiment of the invention.

FIG. 2 shows a schematic representation of the measurement according to a second embodiment of the invention. A light beam 3 is impinging through the first, transparent, electrode 1 $V_1$ on the surface of the test sample to be analyzed to create excess carries in the substrate 9. The wavelength $\lambda_i$ and the intensity modulating frequency $f_i$ of this light beam can be selected as will be discussed later. Preferably, the wavelength $\lambda_i$ is selected in the range from about 1000 nm to about 300 nm. Preferably, the modulation frequency $f_i$ is in the range 200 Hz to 1 MHz, preferably between 2 kHz and 100 kHz. The higher this frequency the smaller the junction photo-voltage signal measured at a given position on the test sample. A second electrode $V_2$ 2 is placed at certain distance $r_{12}$ from the first electrode 1. In this second embodiment the probe comprises more than two electrodes, i.e. it can comprise a number of i electrodes, where the i-th electrode 10 is shown in FIG. 2. These additional electrodes are positioned at a radial distance $r_{21}$ from the previous electrode, closer to the light beam 3.

The test sample comprises a first junction 6 between a first, p-type, layer and a second, n-type layer. The first junction 6 has a metallurgical junction depth $X_{j1}$ and a depletion region with an extension width $X_{po1}$ into the first layer and an extension width $X_{no1}$ into the second layer. The extension widths depend on the doping levels of the first and second layer. $L_{p1}$ is the hole diffusion length in the second layer, while $L_{n1}$ is the electron diffusion length in the first layer. It is assumed that $L_{n1} \ll X_{j1}$. The test sample further comprises a second junction 7 between the second, n-type, layer and a third, p-type layer. The second junction 7 has a metallurgical junction depth $X_{j2}$ and a depletion region with an extension width $X_{no2}$ into the second layer and an extension width $X_{po2}$ into the third layer. The extension widths depend on the doping levels of the second and third layer. $L_{p2}$ is the hole diffusion length in the second layer, while $L_{n2}$ is the electron diffusion length in the third layer.

In FIG. 2 the wavelength $\lambda_i$ of the light beam 3 is selected to generate excess carriers near the first junction 6 and the second junction 7. Hence $X_{j2}+X_{po2} <$ penetration depth $(\lambda_i)$ $< X_{j2}+X_{po2}+L_{n2}$.

In this second embodiment, this multi-stack structure is a dual junction structure consisting of a substrate having a first p-type (or n-type) doped layer on top of a second n-type (or p-type) doped layer on top of a p-type (or n-type) doped substrate. Hence, the structure, also called semiconductor structure in the following, consists of a first, upper, semiconductor layer of a first dopant type, a second semiconductor layer of a second, opposite dopant type forming a first junction 6 with the first layer and a third, even deeper, semiconductor layer of the first dopant type forming a second semiconductor junction 7 with the second layer. This stack of two junctions 6 and 7 is formed on a substrate 9 with either the first or second dopant type. The sheet resistances of both junction isolated layers, i.e. the first and second layer, as well as the junction leakage current of both junctions, i.e. the first 6 and second junction 7, can be extracted in a non-contact way. This may be beneficial in characterizing semiconductor structures comprising multiple layers of opposite dopant type, such as source-drains or their extension implanted into well, halo or pocket implants.

The analytical solution for the junction (=surface) photo-voltage $\phi_{tot}(r)$ for a dual junction configuration is given here in case of a p-n-p dual junction structure. The resulting equation (4) is as follows:

$$\Phi_{tot}(r) = \frac{(1-x_-)\Phi_{x_+}(r) - (1-x_+)\Phi_{x_-}(r)}{x_+ - x_-} \quad (4)$$

where $$x_\pm = \frac{\beta_1^2 + \beta_{12}^2 - \beta_2^2}{2\beta_{12}^2} \pm \left(\left(\frac{\beta_1^2 + \beta_{12}^2 - \beta_2^2}{2\beta_{12}^2}\right)^2 + \frac{\beta_2^2}{\beta_{12}^2}\right)^{1/2} \quad (5)$$

$$\Phi_{x_\pm}(r) = \begin{cases} -\dfrac{\zeta_1 + x_\pm \zeta_2}{\beta_\pm^2}[1 - a\beta_\pm K_1(\beta_\pm a)I_0(\beta_\pm r)], & r \leq a \\ -\dfrac{\zeta_1 + x_\pm \zeta_2}{\beta_\pm^2}\beta_\pm a I_1(\beta_\pm a) K_0(\beta_\pm r), & r > a \end{cases} \quad (6)$$

$$\beta_1 = \sqrt{R_{sp}G_{s1} + i\omega R_{sp}C_{s1}} \quad (7)$$
$$\beta_2 = \sqrt{R_{sn}G_{s2} + i\omega R_{sn}C_{s2}}$$
$$\beta_{12} = \sqrt{R_{sn}G_{s1} + i\omega R_{sn}C_{s1}}$$

$$\zeta_1 = -R_{sp}qF_1 - R_{sn}q(F_1 + F_2) \quad (8)$$

$$\zeta_2 = R_{sn}q(F_1 + F_2) \quad (9)$$

$$\beta_\pm = \beta_2 \sqrt{1 - \frac{1}{x_\pm}} \quad (10)$$

and $R_{sp}$ is the sheet resistance of the first layer being in this embodiment p-type doped, $R_{sn}$ is the sheet resistance of the second, deeper, layer being in this embodiment n-type doped, $G_{s1}$ and $G_{s2}$ are the conductance of the first and second junctions, $C_{s1}$ and $C_{s2}$ are the capacitances of the first and second junctions 6 and 7, $F_1$ and $F_2$ are the electron-hole pair separation rates of the first and second junctions 6 and 7, a is the light beam radius, r is the lateral distance from the light beam center.

The photo-voltage contributions of the two individual junctions, the top one being labeled 1 and the underlying one being labeled 2, are respectively given by:

$$\Phi_1(r) = \frac{x_- \Phi_{x_+}(r) - x_+ \Phi_{x_-}(r)}{x_- - x_+} \quad (11)$$

$$\Phi_2(r) = \frac{\Phi_{x_-}(r) - \Phi_{x_+}(r)}{x_- - x_+}$$

The photo-voltages $V_1$ and $V_2$, that will be measured at the contacts as described above for a dual layer configuration, are now given by the following expressions:

$$V_1 = \frac{(1-x_-)V_1^+ - (1-x_+)V_1^-}{x_+ - x_-} \quad (12)$$

$$V_2 = \frac{(1-x_-)V_2^+ - (1-x_+)V_2^-}{x_+ - x_-}$$

where $$V_1^\pm = -\frac{\zeta_1 + x_\pm \zeta_2}{\beta_\pm^2}[1 - 2K_1(\beta_\pm R_0)I_1(\beta_\pm R_0)] \quad (13)$$

$$V_2^\pm = -\frac{\theta}{\pi R_0}\frac{\zeta_1 + x_\pm \zeta_2}{\beta_\pm^2} I_1(\beta_\pm R_0)[R_1 K_1(\beta_\pm R_1) - R_2 K_1(\beta_\pm R_2)]$$

It is noted that $V_1$ and $V_2$ are complex numbers and, hence, can be written as $V_j = |V_j| \cdot \exp(i\psi_j)$, where $|V_j|$ is the modulus and $\psi_j$ is the phase angle relative to the modulation signal.

The junction photo-voltage (JPV) behavior both versus lateral distance (away from the center of the light beam) and as a function of modulation frequency are significantly different from the single layer case. For instance, in the single layer case the JPV increases monotonically as the modulation frequency decreases. In the dual layer case this is no longer the case.

The behavior of the analytical equations of the second embodiment corresponds well with Synopsis/Medici device simulation, confirming the correctness of the analytical equation 12.

Methods for obtaining electrical properties from the test sample, taking into account that the number of unknown electrical parameters increases with the number of junctions screened by the modulated light beam are existent. Several methods according to this second embodiment can be applied to determine the desired electrical parameters of the various junctions.

Based on either formula (4) or formula (12) it is now possible to determine in the case of a single light wavelength ($\lambda_1$) the eight unknown physical parameters $R_{sp}$, $R_{sn}$, $G_{s1}$, $G_{s2}$, $C_{s1}$, $C_{s2}$, $F_1$ and $F_2$ on a test wafer by performing eight measurements. In case two different wavelengths are used ($\lambda_1$ and $\lambda_2$), i.e. two different penetration depths, ten physical parameters need to be determined since the separation rates are wavelength dependent, i.e. $R_{sp}$, $R_{sn}$, $G_{s1}$, $G_{s2}$, $C_{s1}$, $C_{s2}$, $F_{11}$, $F_{21}$ (for $\lambda_1$), $F_{12}$, $F_{22}$ (for $\lambda_2$).

In the following some preferred measurement configurations are discussed. Any eight numerically independent measurements for a single wavelength or ten independent measurements for two wavelengths will lead to a mathematical solution of the above presented equations and therefore of the above listed physical unknowns. In order to perform the needed (eight or ten) junction photo-voltage measurements one can vary the measurement parameters: vary the modulation frequency $f_i$ and/or the wavelength $\lambda_i$ of the light beam, measure the junction photo-voltage inside the illuminated region and at one or more position outside the illuminated region, use one or more calibration wafers or a combination of these parameters.

Possible experimental setups to collect the unknown experimental values are described in the following: The p-n junctions of the test sample are measured to obtain the ratio ($|V_{1i}/V_{2i}|$), with i being an integer ranging from 1 to 6, at six intensity modulation frequencies $f_i$, ranging from low to high, for a single wavelength $\lambda_1$ of the light beam. The wavelength $\lambda_1$ is selected to penetrate the first and second junction. This will yield six equations in the eight unknown parameters.

The ratio $|V_{11}/V_{1c}|$ of $V_{11}$ on a test wafer to $V_{1c}$ on two separate calibration wafers (one with a shallow and one with a deeper single junction), both with negligible leakage current and known sheet resistance, both measured at the highest modulation frequency $f_1$ and for the same wavelength $\lambda_1$, one obtains two additional equations in the eight unknown parameters. The capacitance $C_{sc}$ for each of the two calibration wafers can be obtained from the ratios $|V_{1c}/V_{2c}|$. The p-n junctions of the test sample are measured to obtain the ratio $|V_{1i}/V_{2i}|$, with i being an integer ranging from 1 to 6, at three intensity modulation frequencies, respectively high $f_1$, intermediate $f_2$ and low $f_3$ and for two wavelengths $\lambda_1$, $\lambda_2$ of the light beam. A first wavelength $\lambda_1$ is selected to only penetrate the first junction, while a second wavelength $\lambda_2$ is selected to penetrate the first and second junction. This will yield six equations in the ten unknown parameters.

The ratio $|V_{11}/V_{1c}|$ of $V_{11}$ on a test wafer to $V_{1c}$ on two separate calibration wafers (one with a shallow and one with a deeper single junction), with negligible leakage current and known sheet resistance, both measured at high modulation frequency $f_1$ and for the same wavelengths $\lambda_1, \lambda_2$ one obtains four additional equations in the ten unknown parameters. The capacitance $C_{sc}$ for each of the two calibration wafers can be obtained from the ratios $|V_{1c}/V_{2c}|$ at the most appropriate wavelength (the one with the highest separation rate for that calibration wafer).

The depth of the junctions in the test sample and in the calibration wafer(s) can be determined by examining similar wafers via SIMS. Besides the ratios of the moduli of certain $V_x$ and $V_y$ as used in the above setups, one can also replace some of the equations by the argument (differences in phase angles) of their ratios, i.e. $\psi_x - \psi_y$. The p-n junctions of the test sample are measured to obtain the potentials $|V_1|, |V_2|$ of the two electrodes of the probe at 4 different modulating frequencies of the light beam $f_1, f_2, f_3$ and $f_4$ at a single wavelength $\lambda_1$. The wavelength $\lambda_1$ is selected to penetrate the first and second junction.

To increase the sensitivity of the measurement to the non-linear dependency of the junction photo-voltage on the lateral distance r away from the center of the illumination beam, one can apply more than two voltage electrodes when measuring the p-n junctions of the test sample. One possibility could be to use four instead of two probes, i.e. $|V_1|, |V_2|, |V_3|$ and $|V_4|$ during each measurement. The $V_1$ probe remains a circular probe with radius R0, the other ones $(V_2, V_3, V_4)$ are arcs with an inner and outer radius and corresponding specific angles. The analytical expressions for $V_3$ and $V_4$ will be similar to the one for $V_2$ (see equation 12).

The eight required experimental values could then just be the junction photo-voltage values at the probes $V_1, V_2, V_3$ and $V_4$ for two different modulation frequencies $f_1, f_2$ and a single wavelength $\lambda_1$. It is no longer necessary to use ratio's $(V_{1i}/V_{2i})$ or $(V_{11}/V_{1c})$ since we are considering $F_1$ and $F_2$ as independent unknowns, opposite to the single layer case where they were eliminated from the calculations by taking ratio's $(V_{1i}/V_{2i})$ and $(V_{11}/V_{1c})$.

One could use up to 8 electrodes such that the junction photo-voltage is measured at 8 different locations on the test sample. In this case it would be sufficient to illuminate the test sample with one wavelength $\lambda_1$ and one modulation frequency $f_1$ and measure the 8 junction photo-voltages $V_i$ with i: 1 ... 8 to obtain 8 experimental values for determining the 8 unknown parameters of the two junctions of the test sample.

In this alternative, the junction photo-voltage measurement set-up discussed must be adapted to have a probe comprising at least three electrodes, spaced apart: a first transparent electrode for illuminating the test sample and to measure the junction photo-voltage $V_1$ of this illuminated region and at least two electrodes at various distances of the first electrode to measure the junction photo-voltages $V_i$ (with i: 2 ... n, integer) at two locations in the unilluminated region. Such an adapted set-up is schematically has been shown in FIG. 2.

Figure 3:
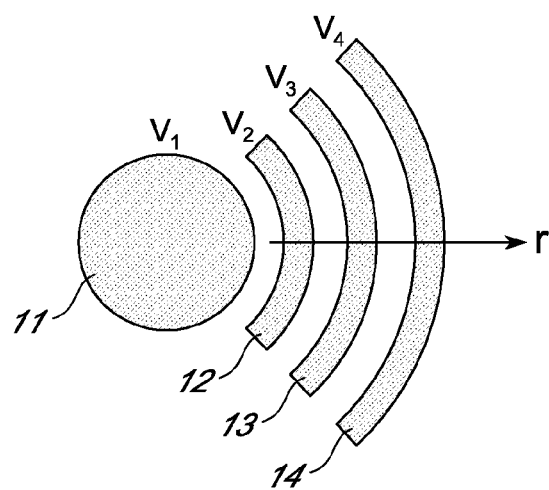
FIG. 3 illustrates a four probe configuration for electrodes according to a third embodiment of the invention.
Figure 4:
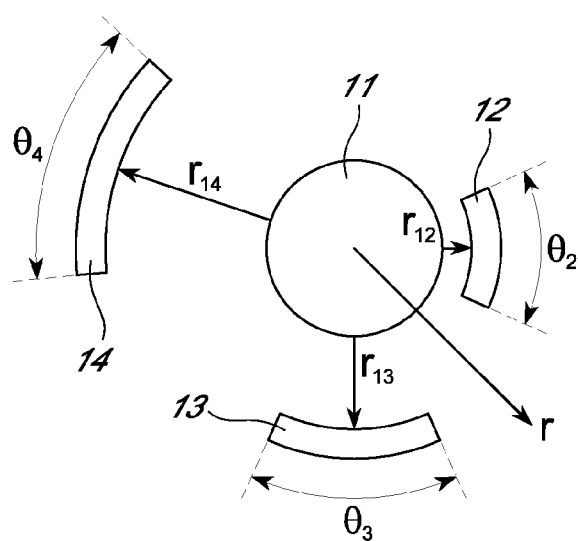
FIG. 4 illustrates a four probe configuration for electrodes according to a fourth embodiment of the invention.

Schematic set-ups of such multi-electrode probes are given in FIGS. 3 and 4 below, representing the third and fourth embodiment of the invention. The probe schematically shown in FIG. 3 consists of a first, transparent, electrode 11 for measuring the junction photo-voltage $V_1$ in the illuminated region and 3 additional electrodes 12, 13 and 14 for measuring the junction photo-voltage $V_i$ with i: 2, 3, 4 outside the illuminated region.

Because of the radial symmetry the electrodes of the probe are preferably circular or arc shaped. The size and position of each electrode can be selected independently from the other electrodes. The smaller the first electrode 11, the smaller the illuminated area will be and the less excess carriers will be generated resulting in a smaller junction photo-voltage signal. The smaller the second 12, third 13, and fourth 14 electrode, the less junction photo-voltage signal might be measured. Therefore, the area of the electrodes preferably increases with increasing radial distance r from the first electrode. This is illustrated in FIG. 4 showing a schematic probe comprising four electrodes: a first electrode 11 in the middle through which the test sample is illuminated and three electrodes 12, 13 and 14 outside the illuminated area, at different locations and with different inner radius, outer radius and angle. Typically the diameter or radii of the electrodes are in the mm or sub-millimeter range Instead of using more than two voltage electrodes during each measurement, one can use a first fixed electrode to measure the voltage $V_1$ of the illuminated region and a second movable outer electrode (V2) to scan the un-illuminated region of the test sample. By scanning the test sample in a direction from the first electrode to the edge of the sample one can obtain the detailed shape of the lateral junction photo-voltage curve. To enhance the accuracy of the junction photo-voltage measurement, one can select for instance only minimal or maximal experimental values obtained during this scan to obtain eight experimental values. One can then use a single modulation frequency $f_1$ and a single wavelength $\lambda_1$ for the light beam.

Alternatively, the junction photo-voltage measurement set-up discussed must be adapted to have a probe comprising two electrodes: a first transparent electrode for illuminating the test sample and to measure the junction photo-voltage $V_1$ of this illuminated region and at least one movable electrode to measure the junction photo-voltages on at least two locations in the unilluminated region.

Figure 5:
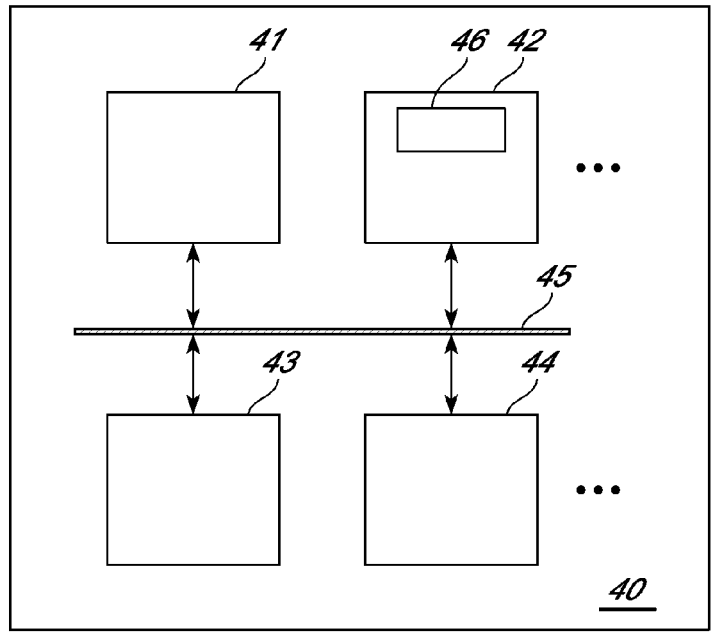
FIG. 5 illustrates a computation unit that can be used with certain embodiments.
Figure 6:
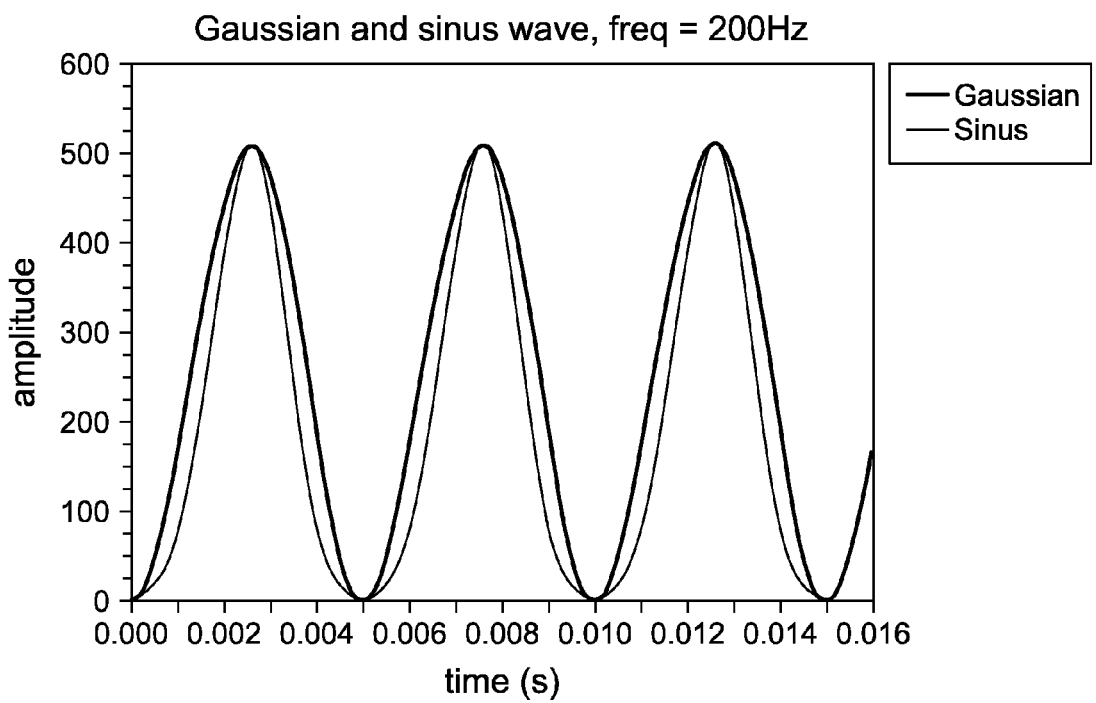
FIG. 6 illustrates a comparison between the Gaussian and the sinusoidal light intensities.
Figure 7A:
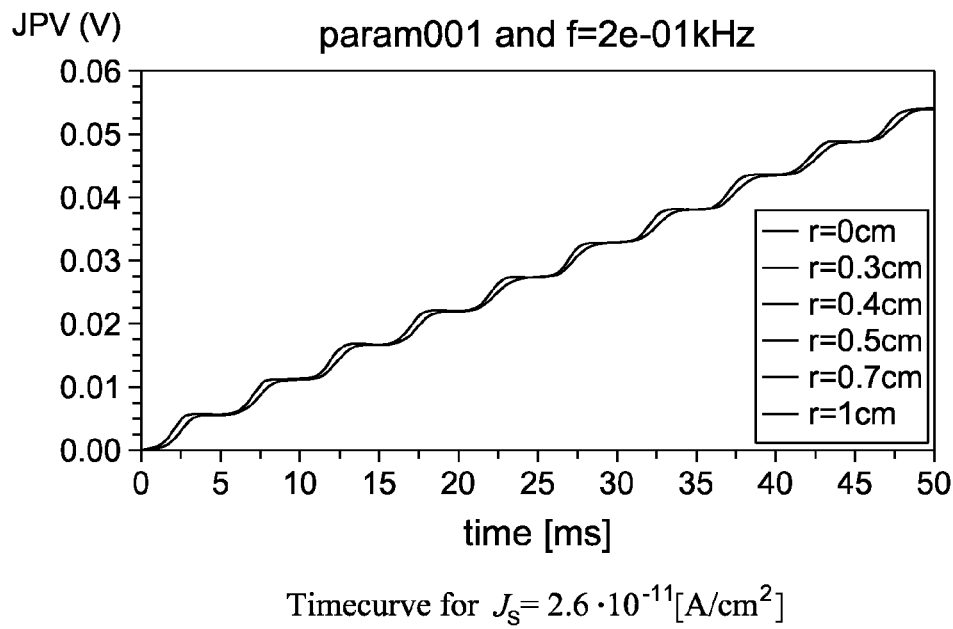
FIG. 7a-b illustrates comparison of time curves for a low-leakage structure and a leaky junction.
Figure 7B:
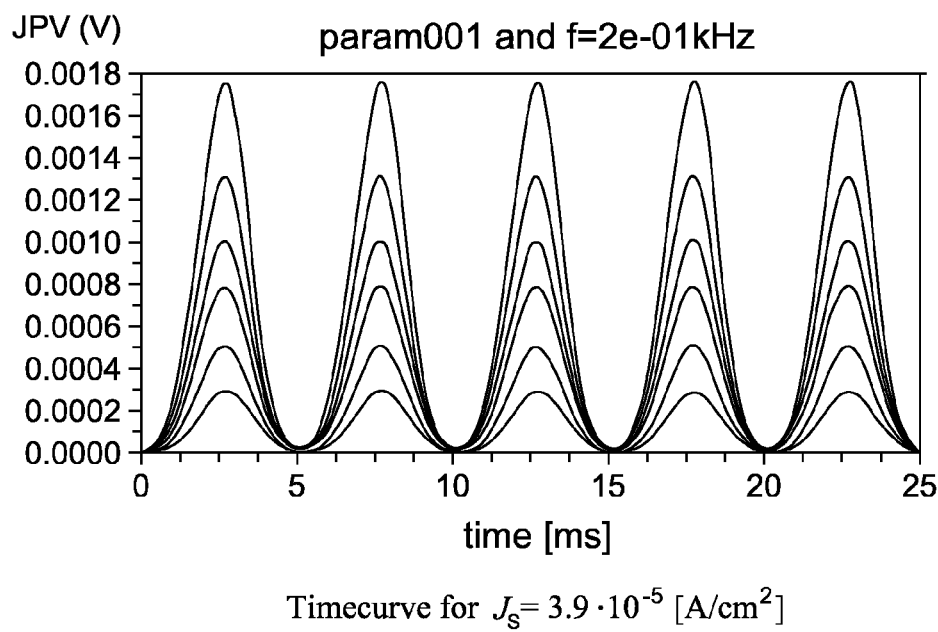
Figure 8:
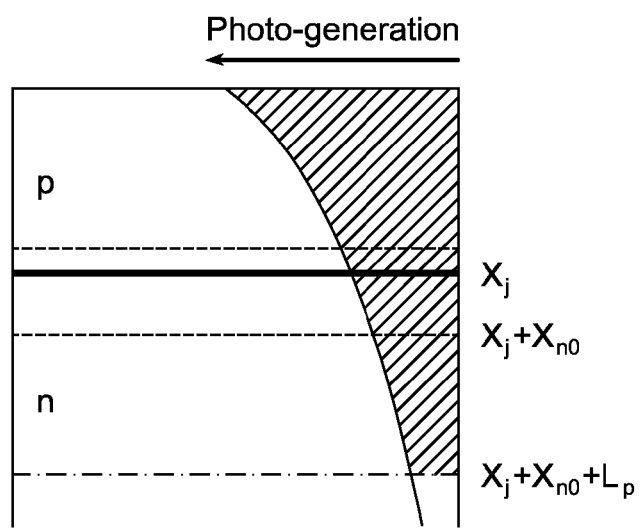
FIG. 8 illustrates computation of the carriers separation rate.
Figure 9A:
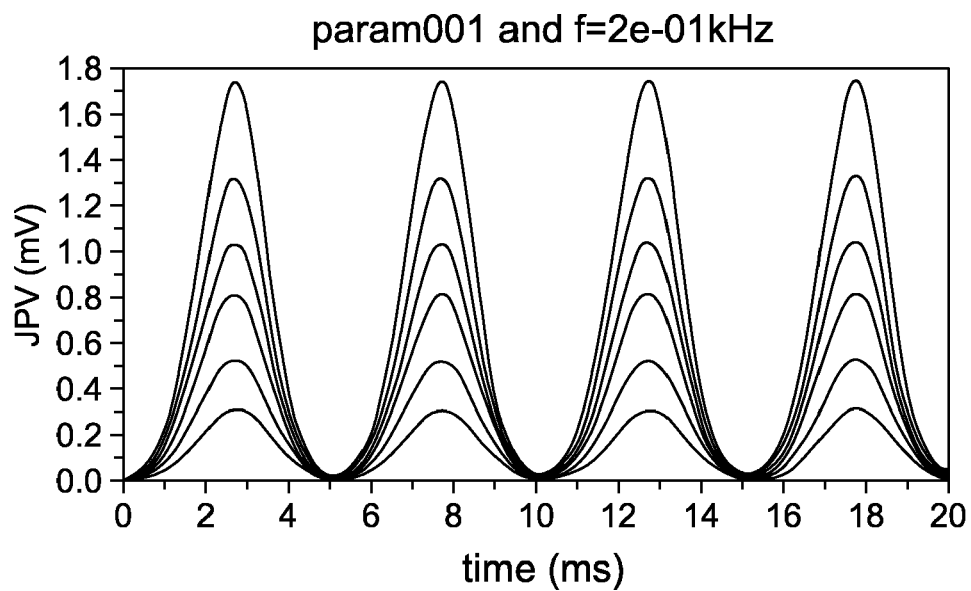
FIG. 9 is a plot of the timecurves for the different frequencies.
Figure 9B:
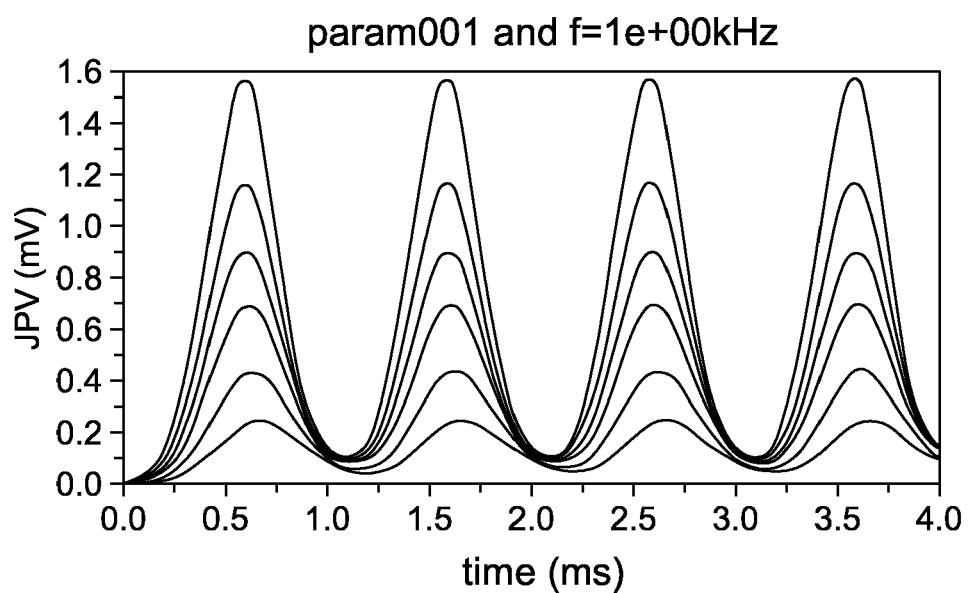
Figure 9C:
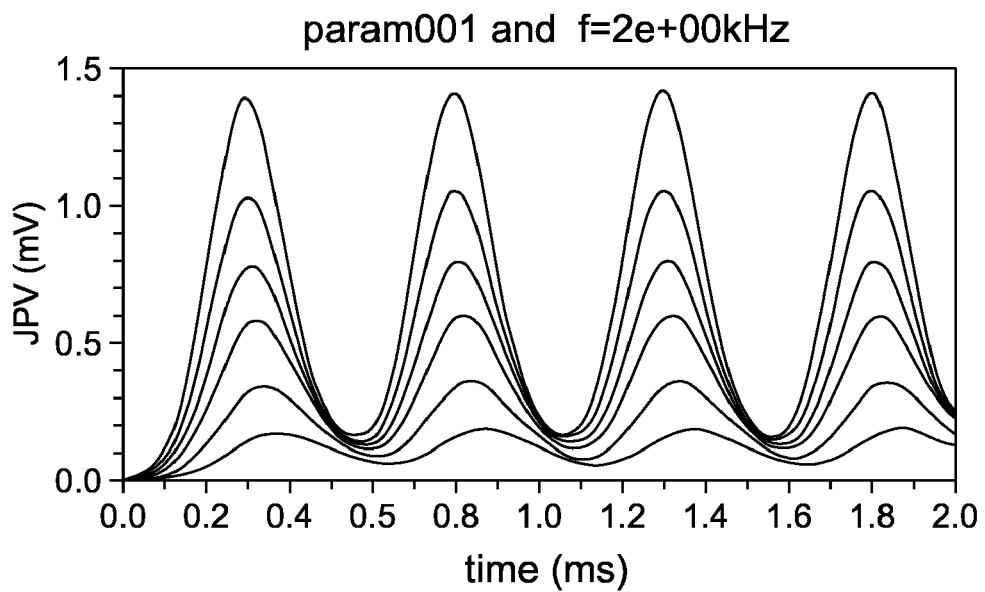
Figure 9D:
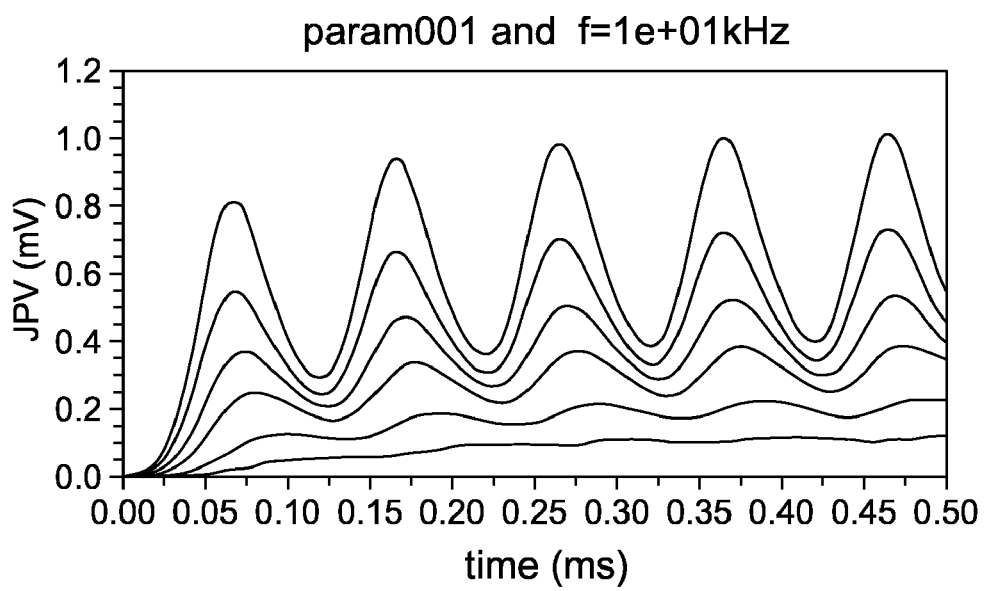
Figure 9E:
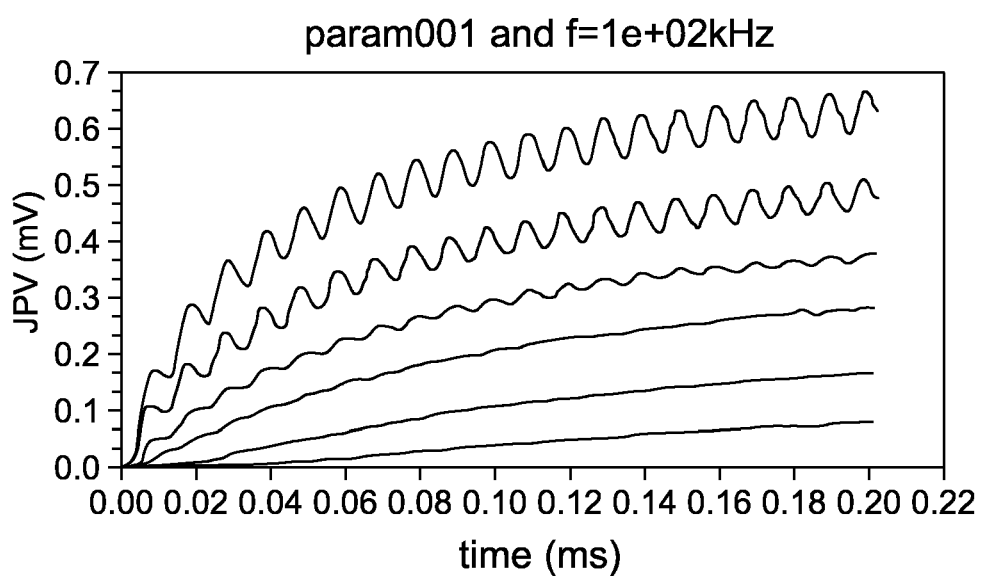
Figure 10A:
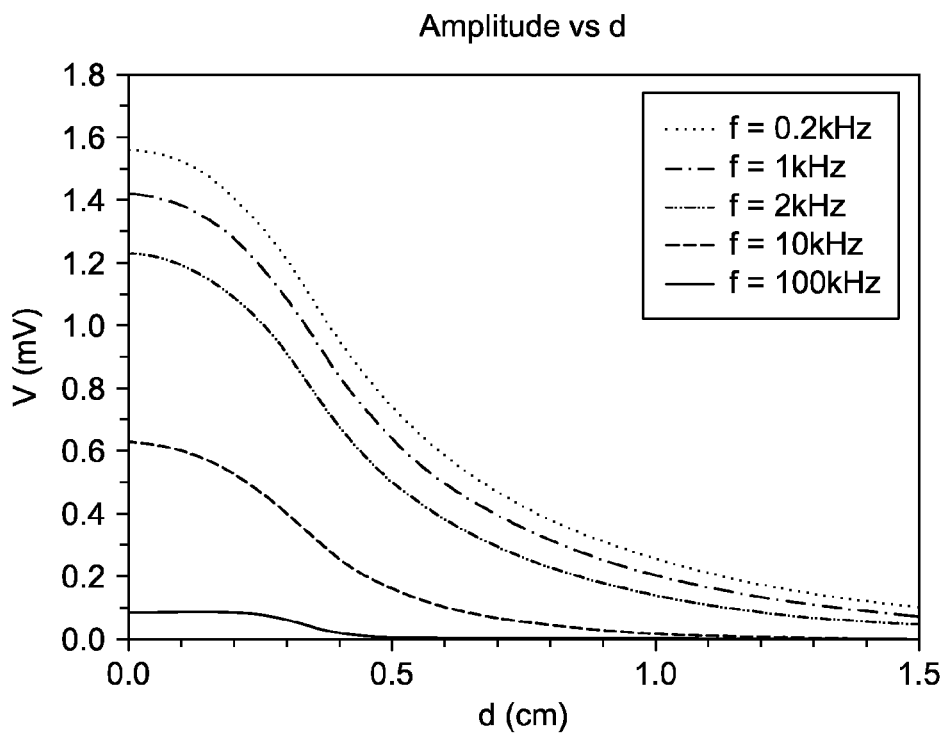
FIG. 10a-b illustrates comparison between theory and simulation.
Figure 10B:
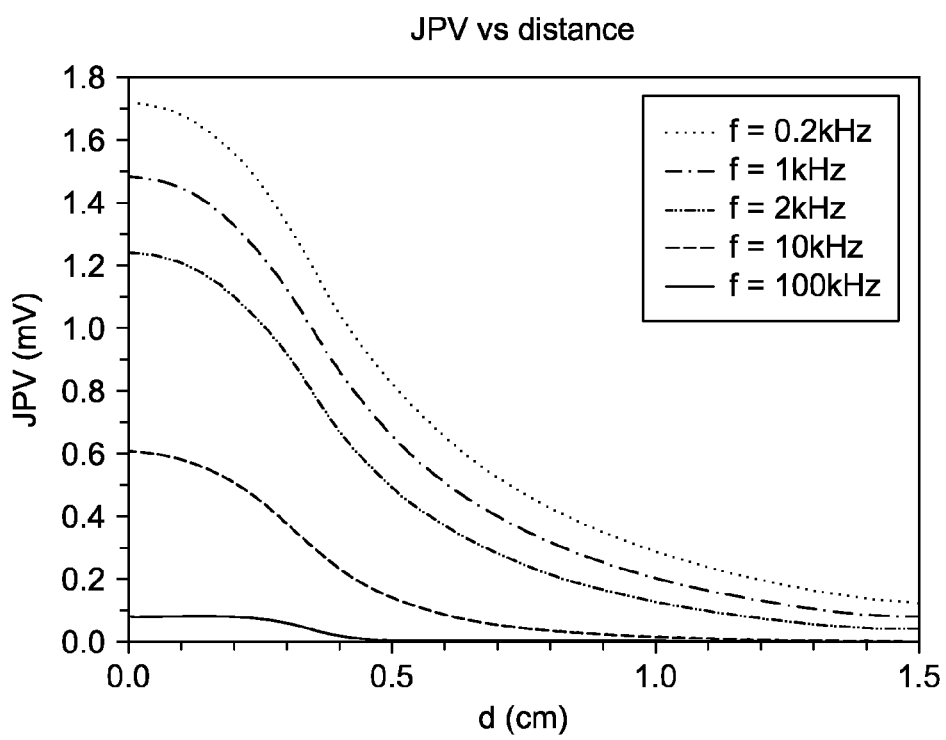
Figure 11:
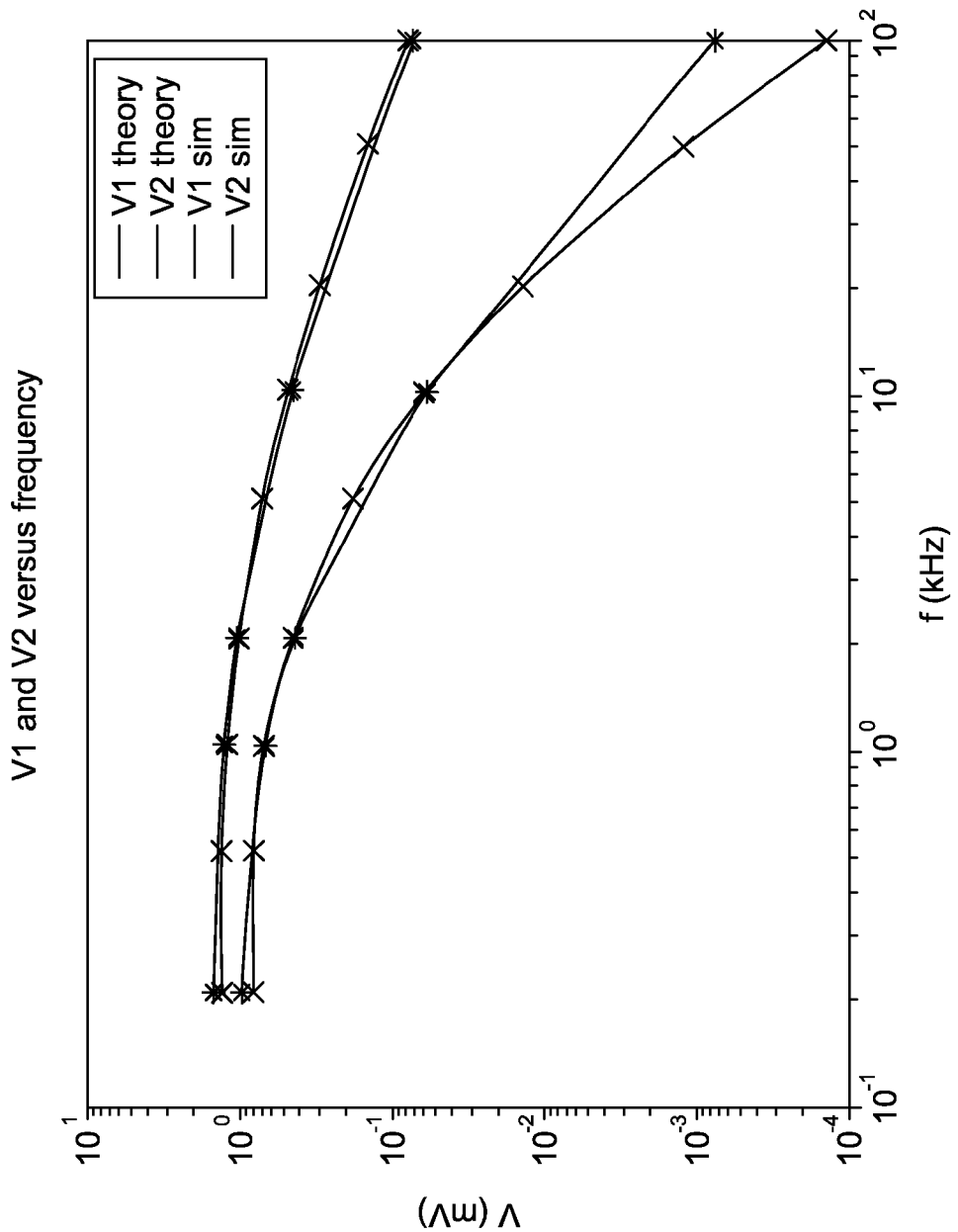
FIG. 11 illustrates comparison between theory and simulation: Amplitude of probes potential.
Figure 12:
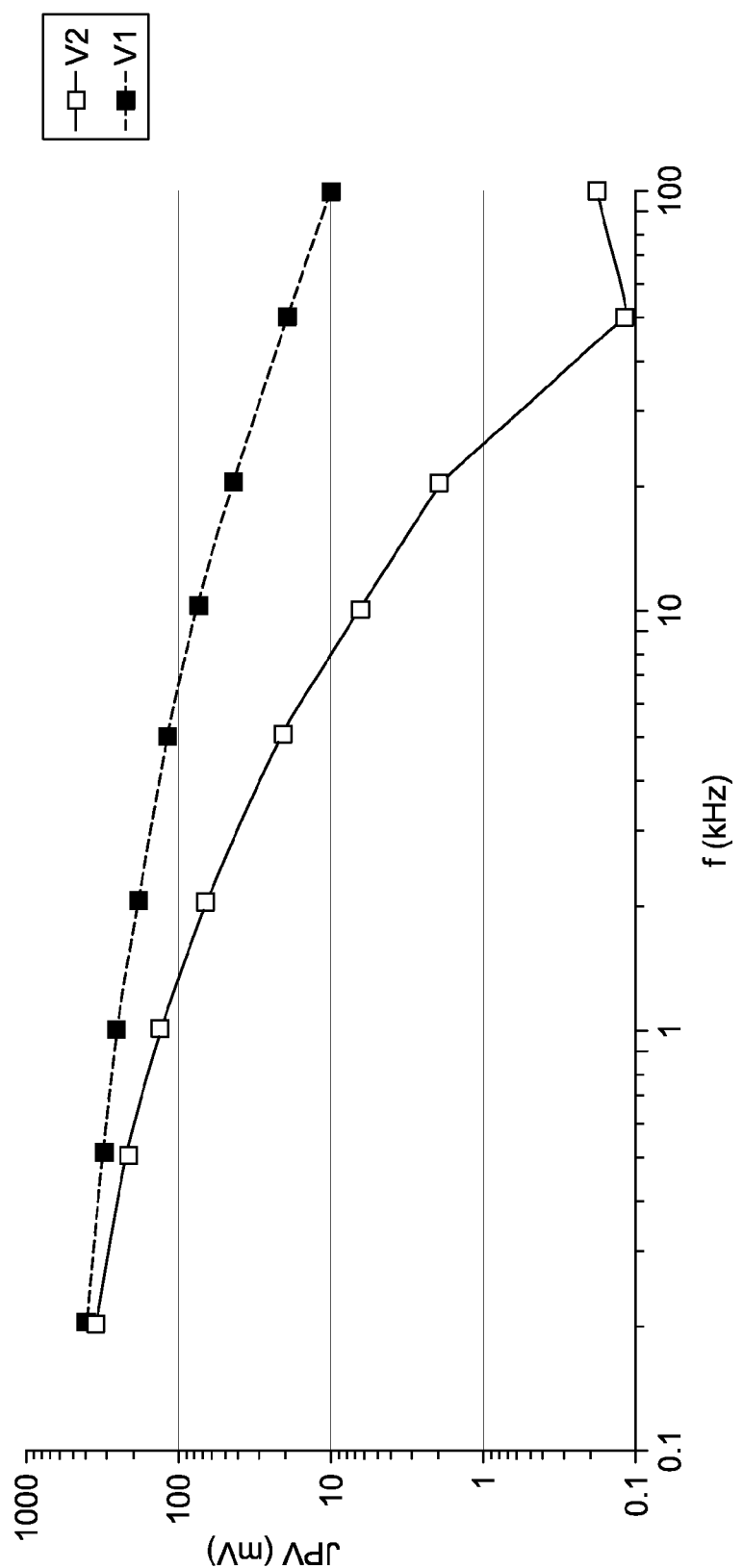
FIG. 12 illustrates experimental result for the frequency curve.
Figure 13A:
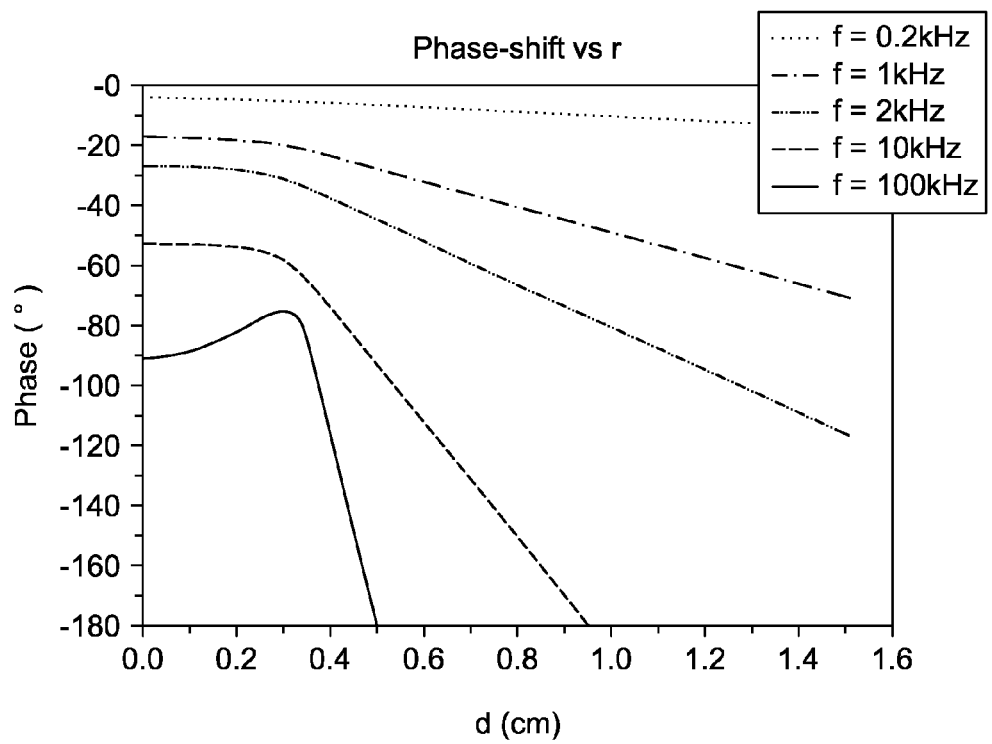
FIG. 13a-b illustrates comparison between theory and simulation: Phase of the JPV distribution.
Figure 13B:
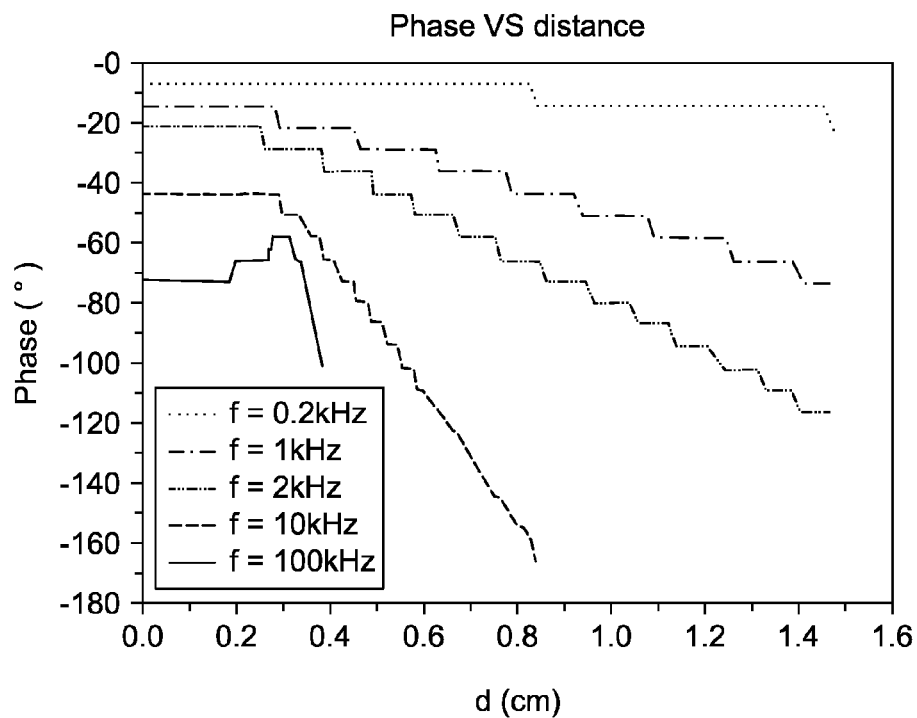
Figure 14A:
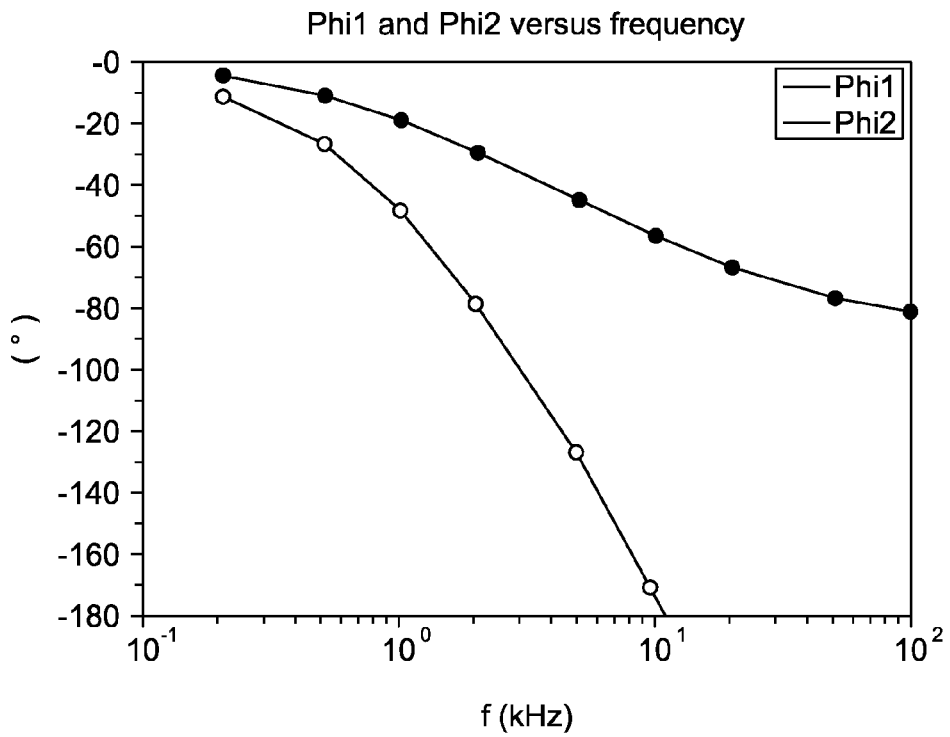
FIG. 14a-b illustrates comparison between theory and simulation: Phase of the probes potential.
Figure 14B:
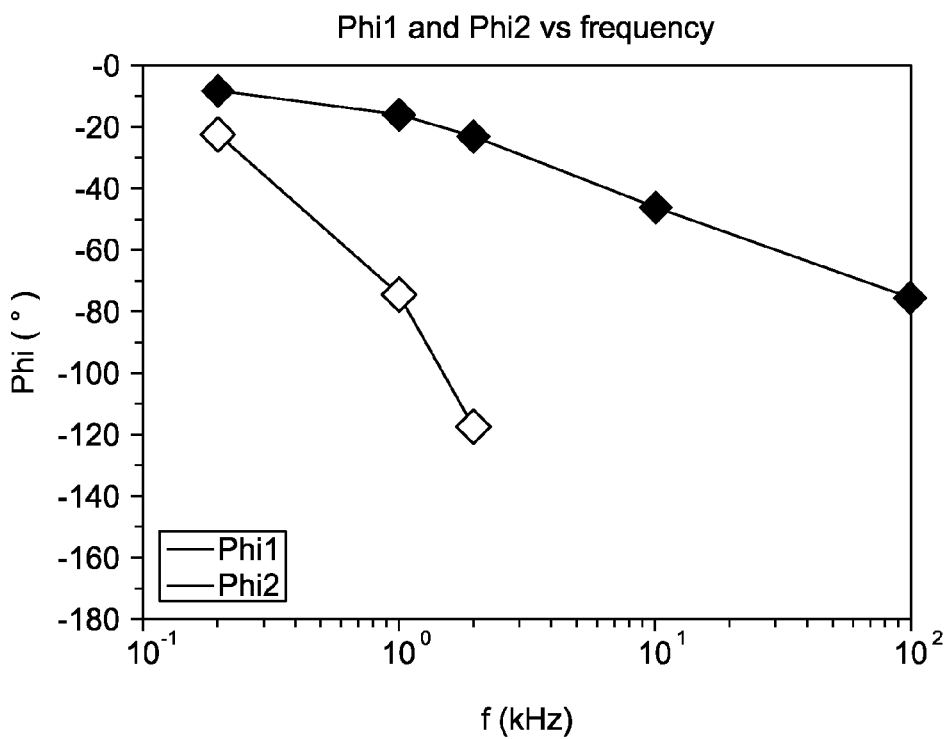
Figure 15A:
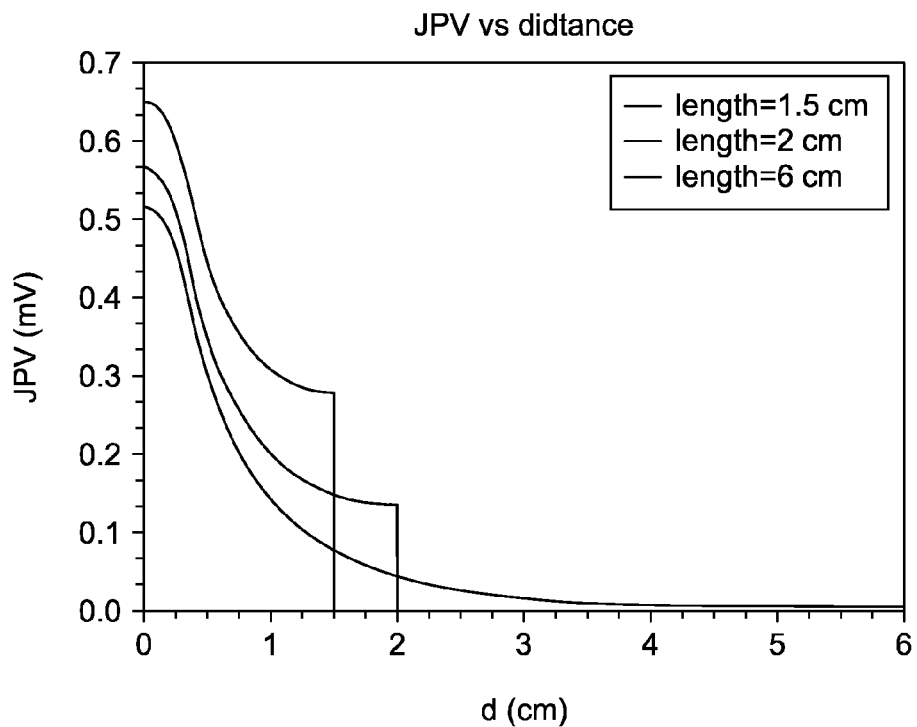
FIG. 15a-b illustrates steady state simulations showing border effects.
Figure 15B:
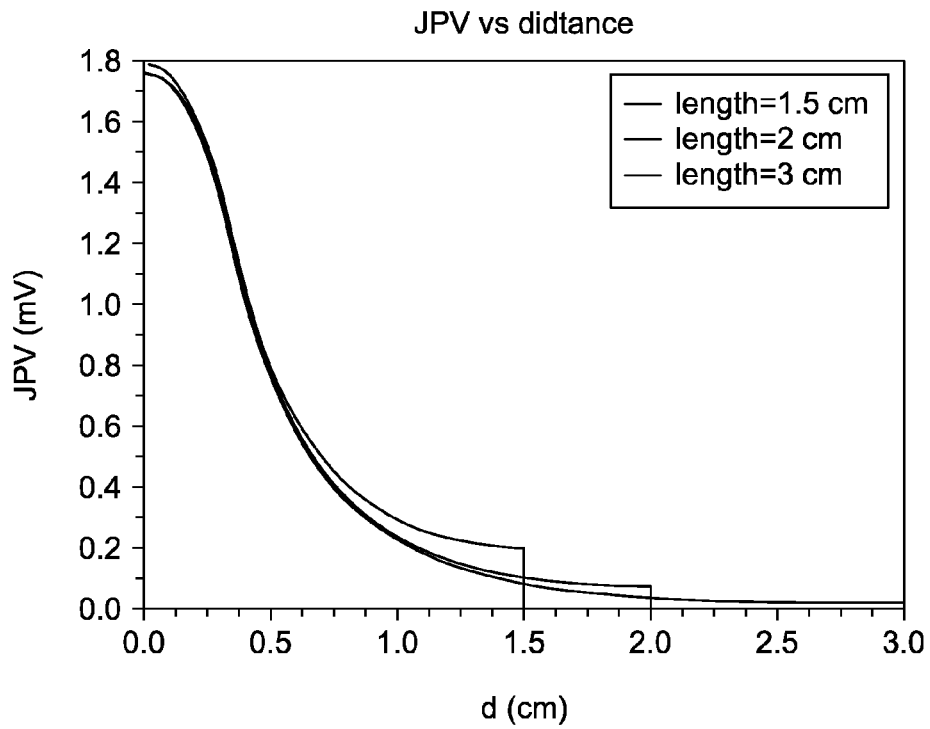
Figure 17A:
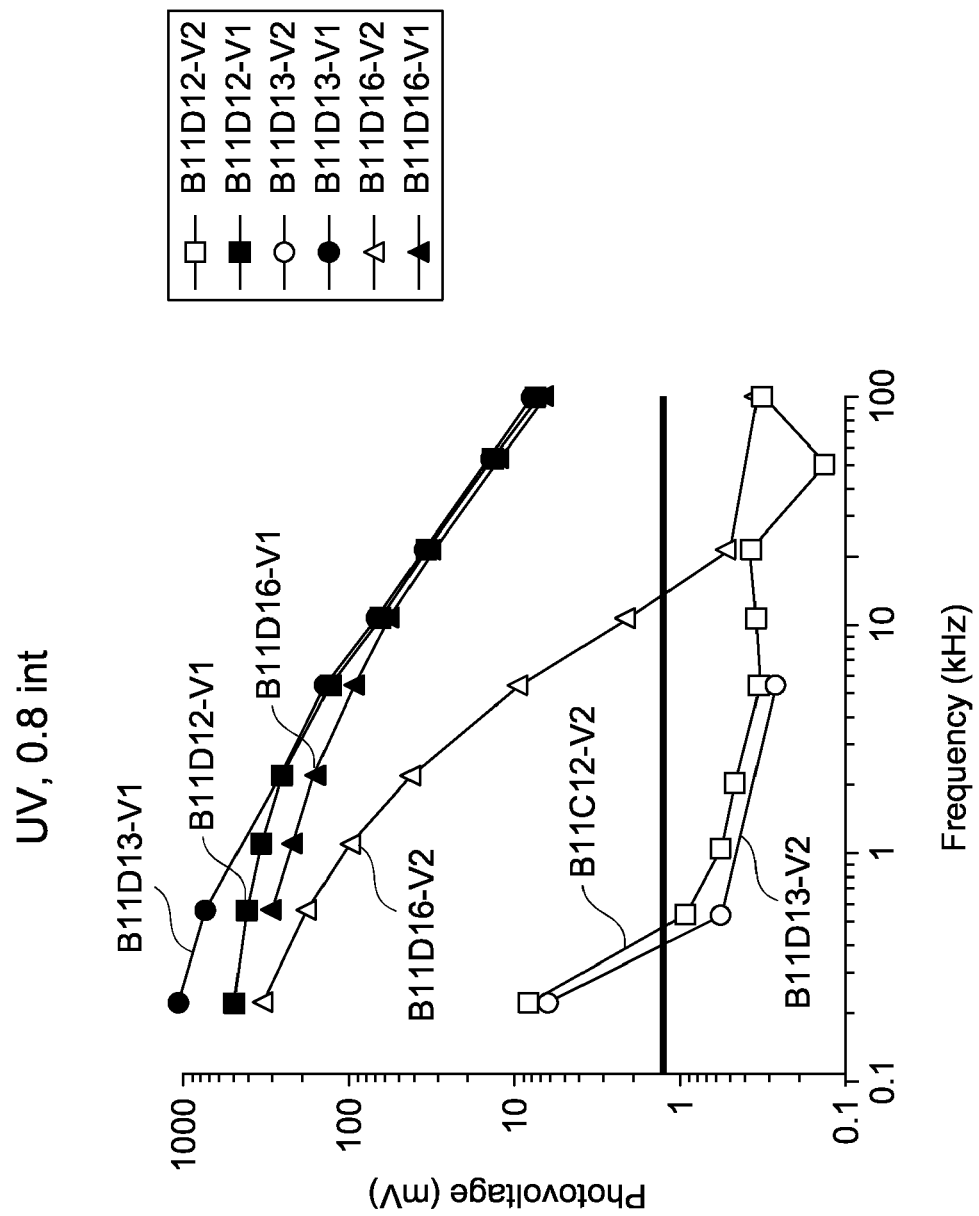
FIG. 17a-d illustrates experimental and simulated frequency curves for the three wafers.
Figure 17B:
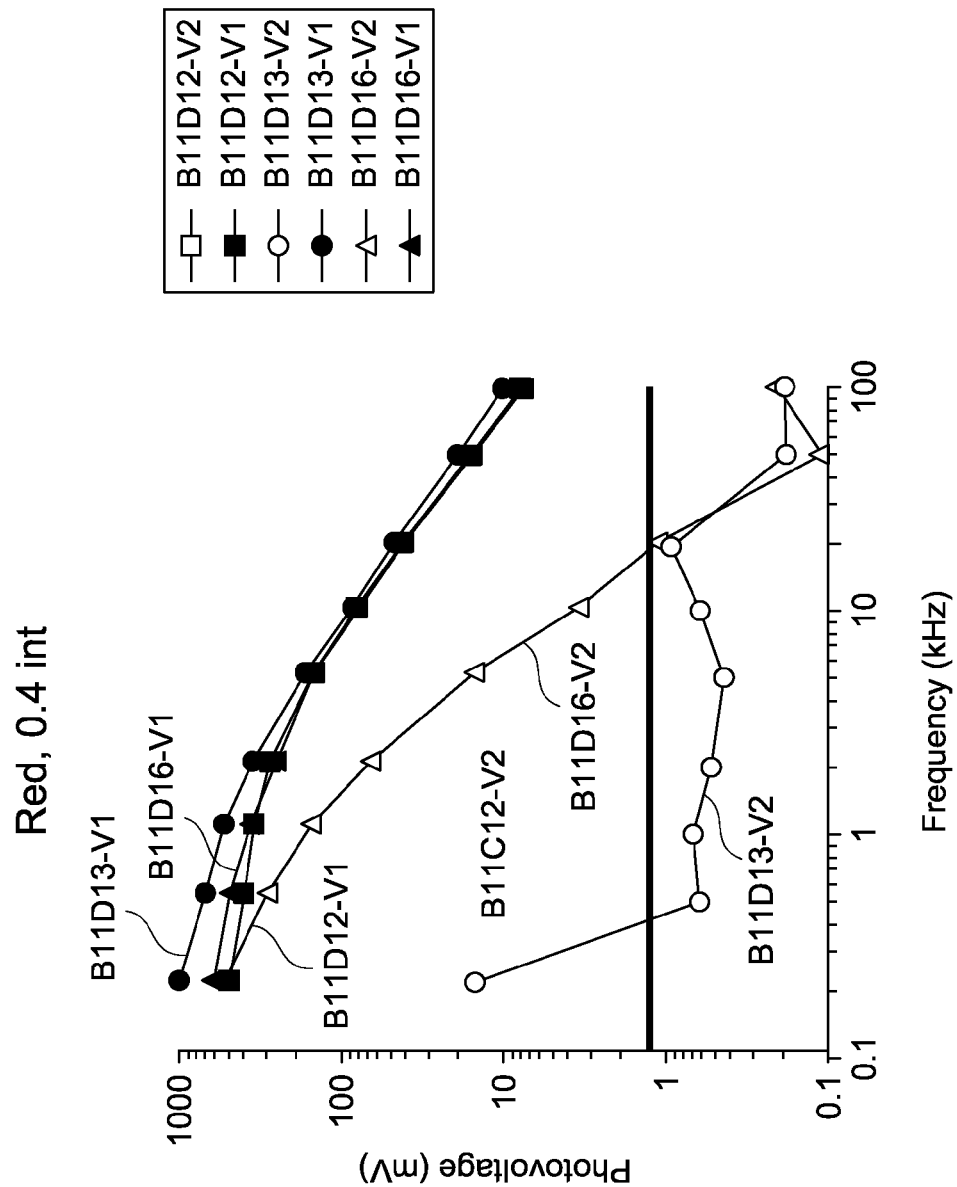
Figure 17C:
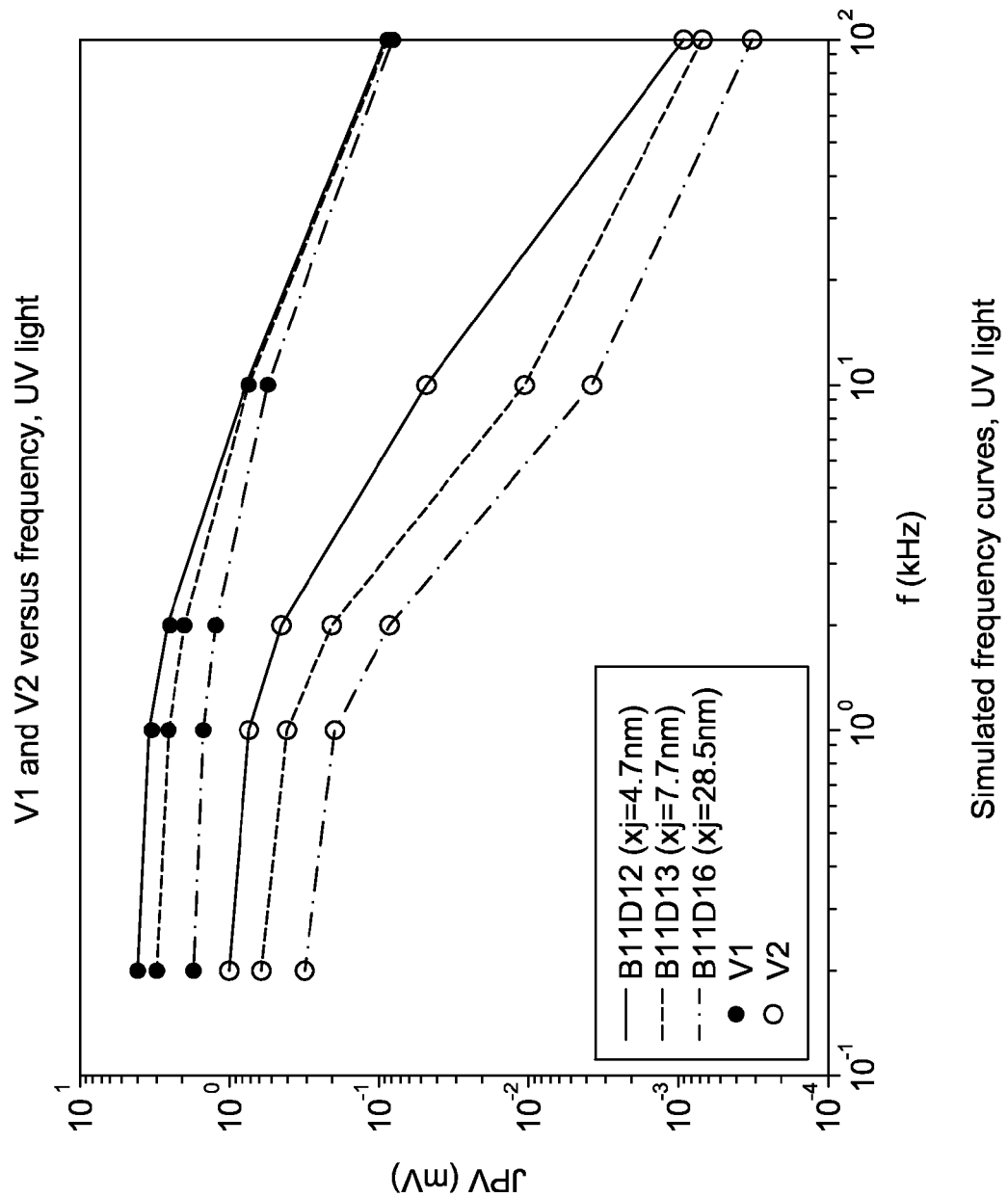
Figure 17D:
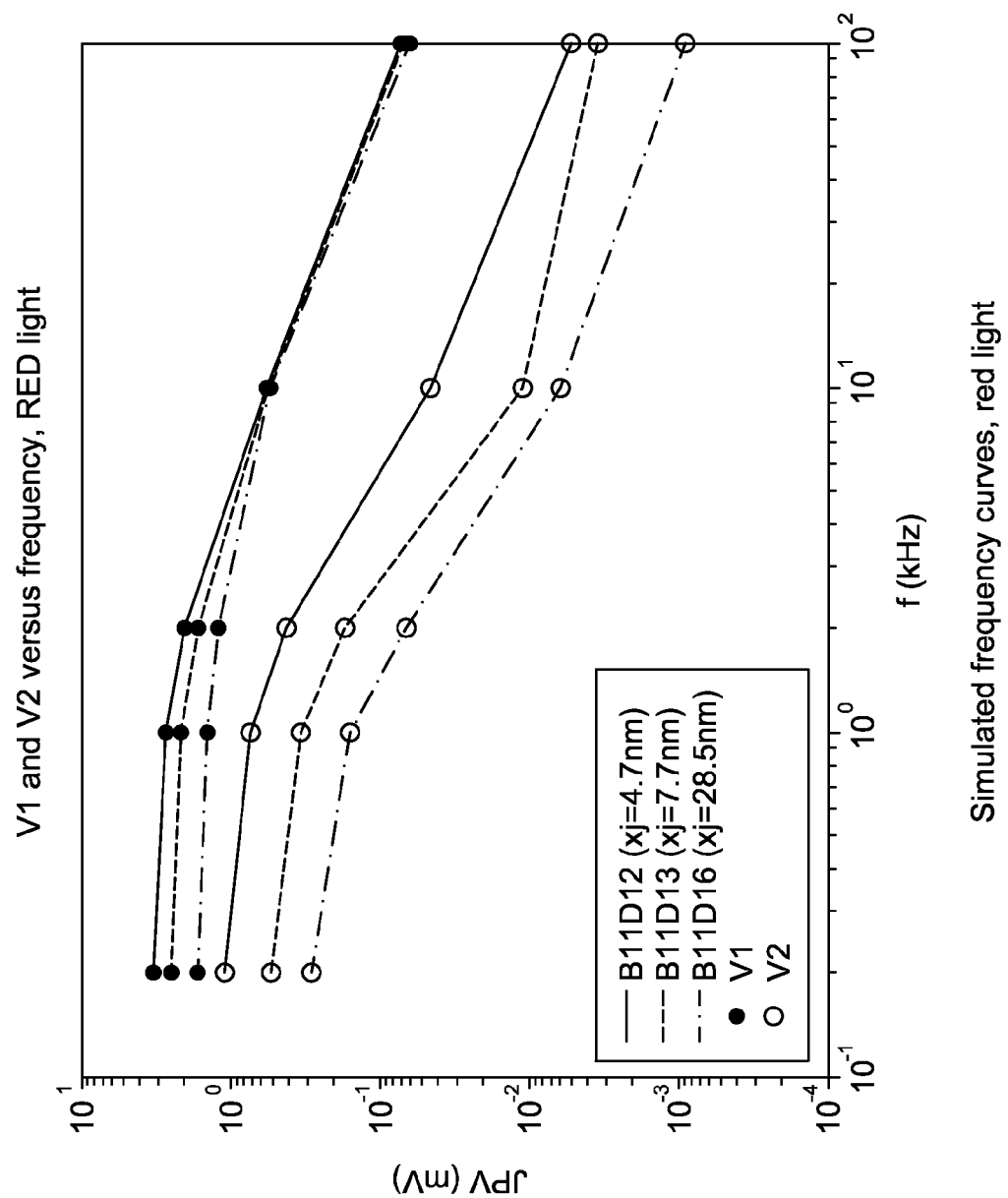
Figure 18:
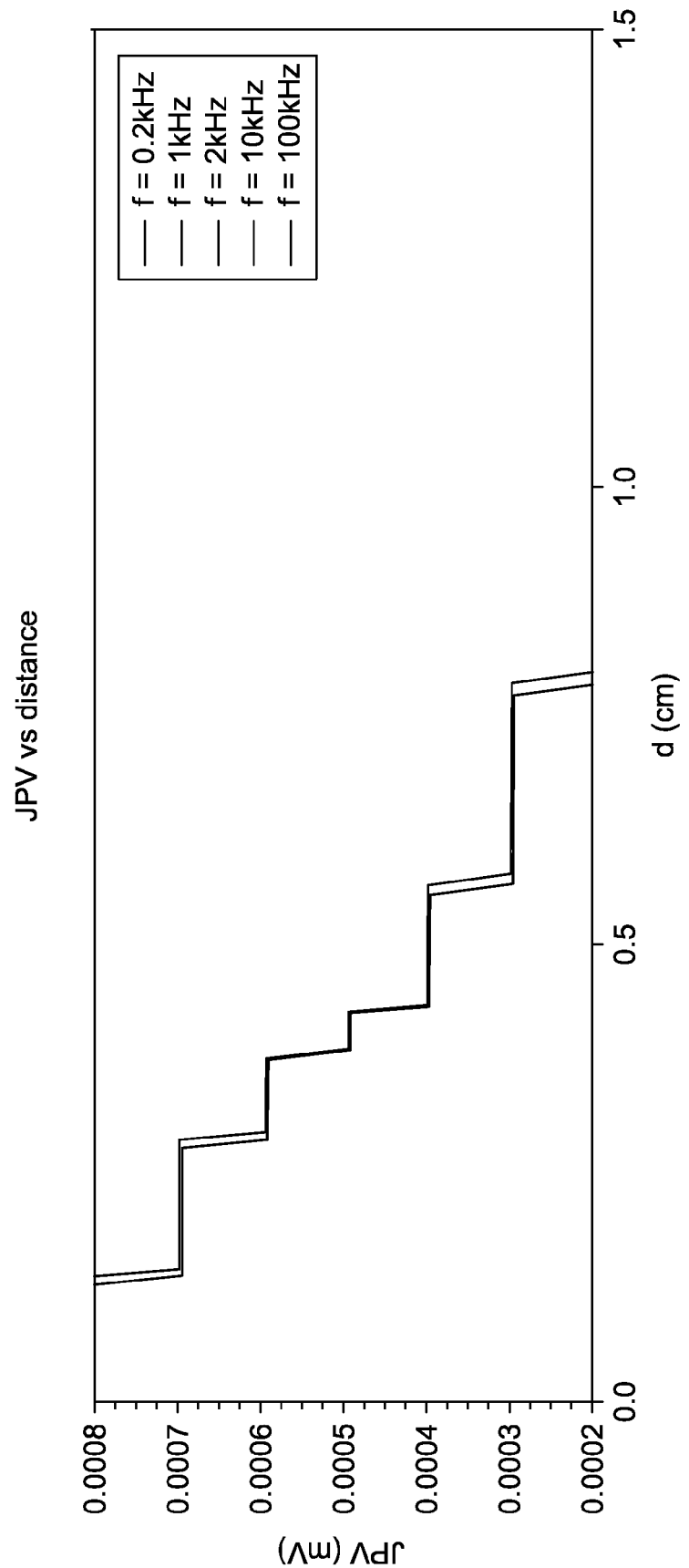
FIG. 18 illustrates lateral JPV distribution for an n++.n junction. The numerical noise indicates that we're working close to the resolution limit.
Figure 20A:
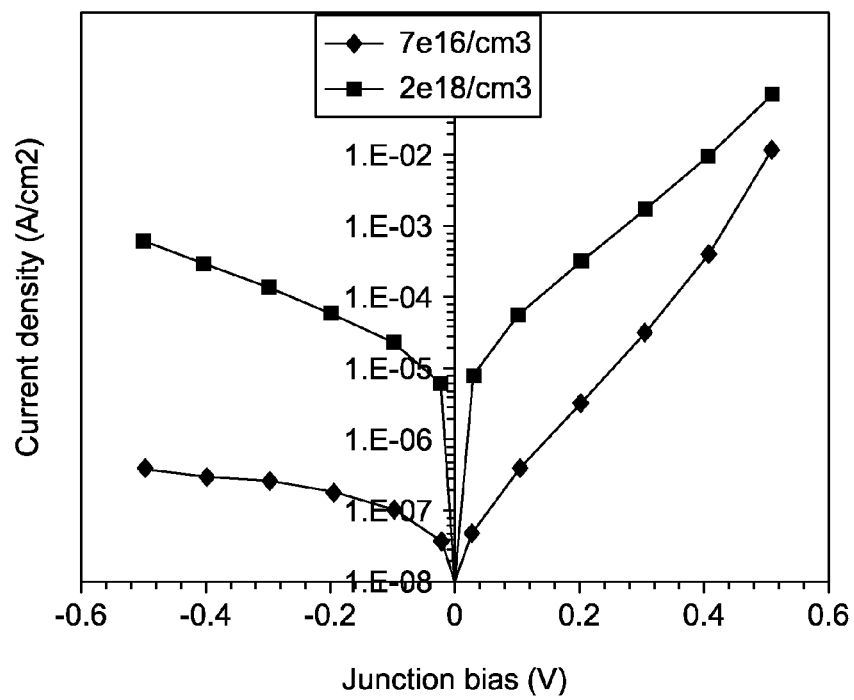
FIG. 20a-b illustrates leakage current simulations.
Figure 20B:
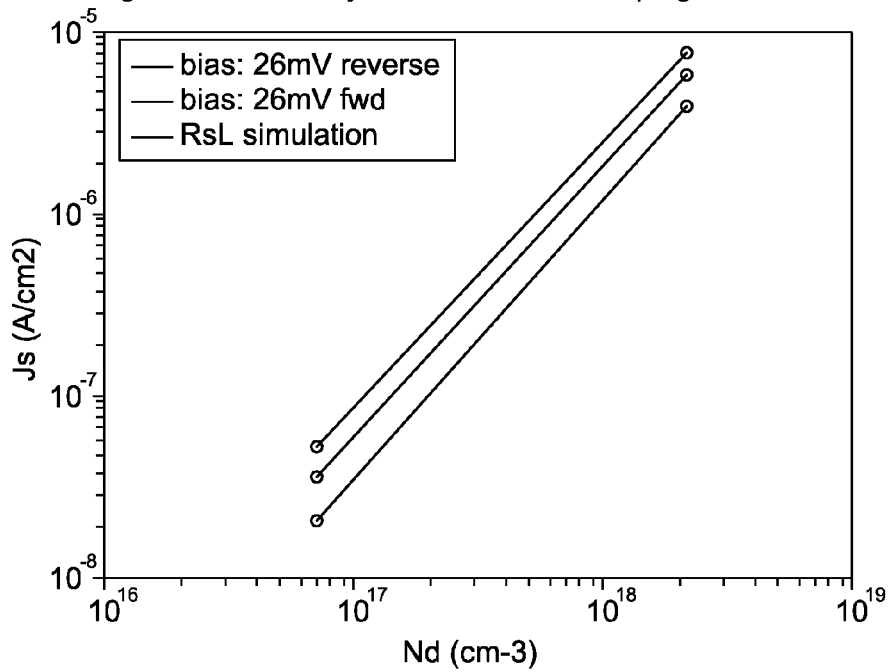
Figure 21:
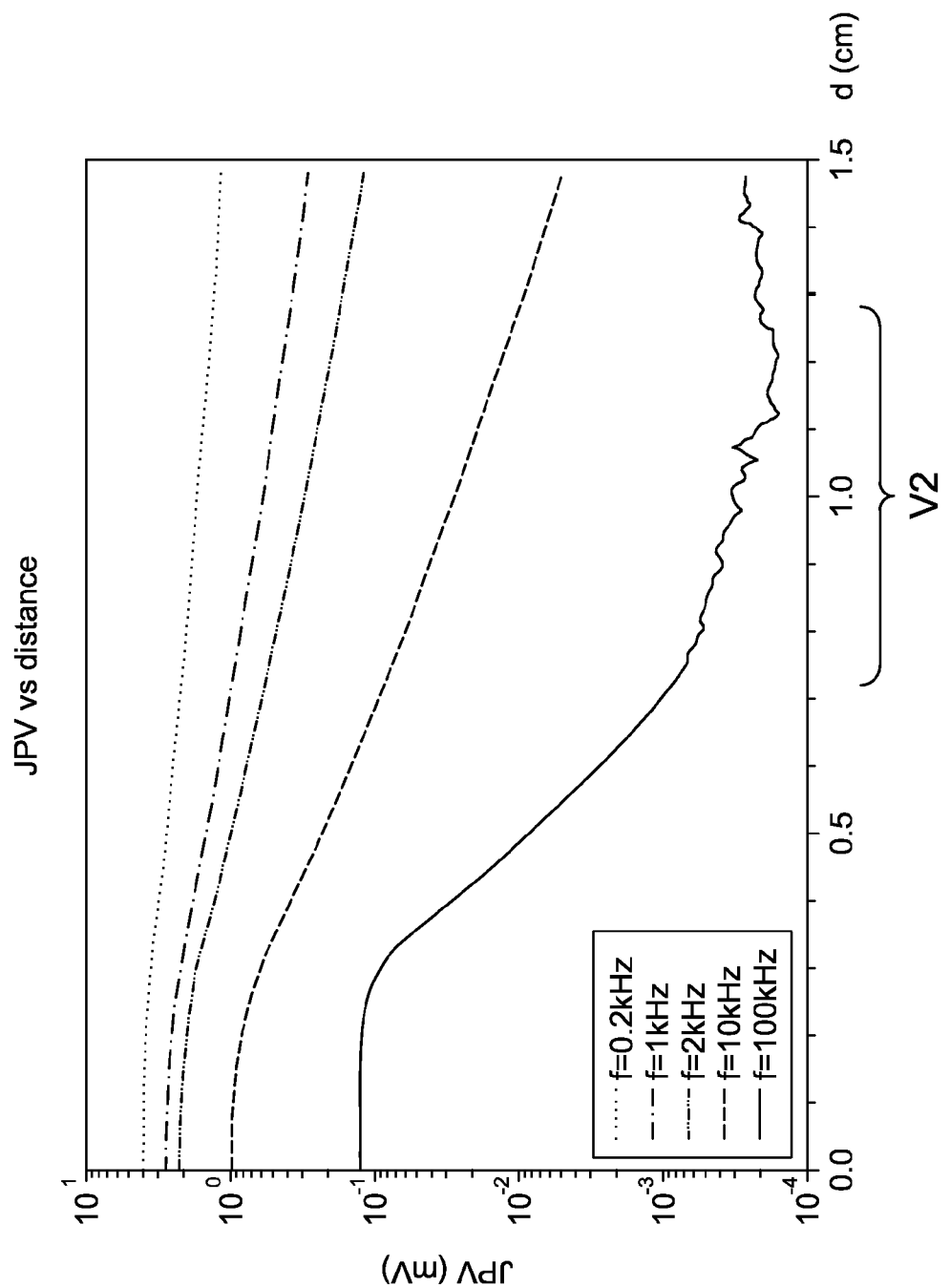
FIG. 21 illustrates JPV distribution can be affected by numerical noise.
Figure 22:
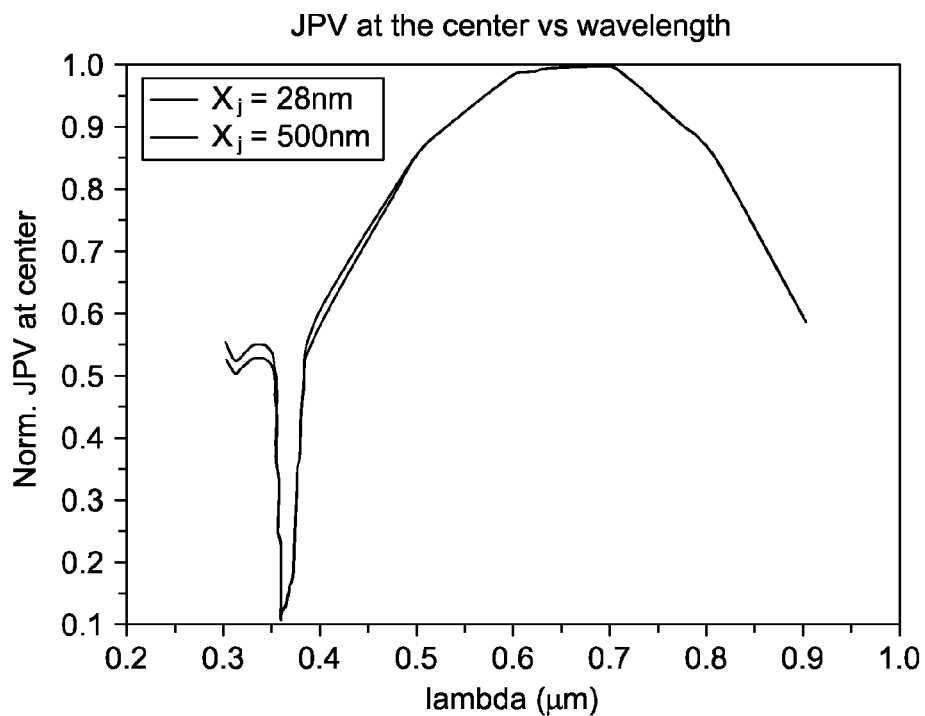
FIG. 22 illustrates JPV at the center versus light wavelength for different structures.
Figure 23:
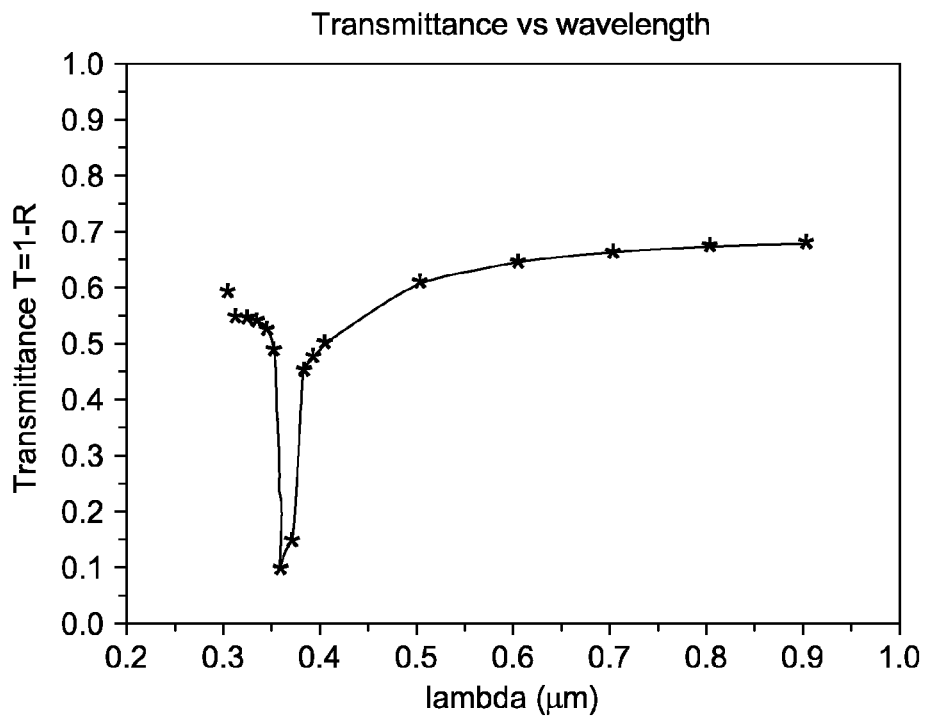
FIG. 23 illustrates transmittance versus wavelength.
Figure 24:
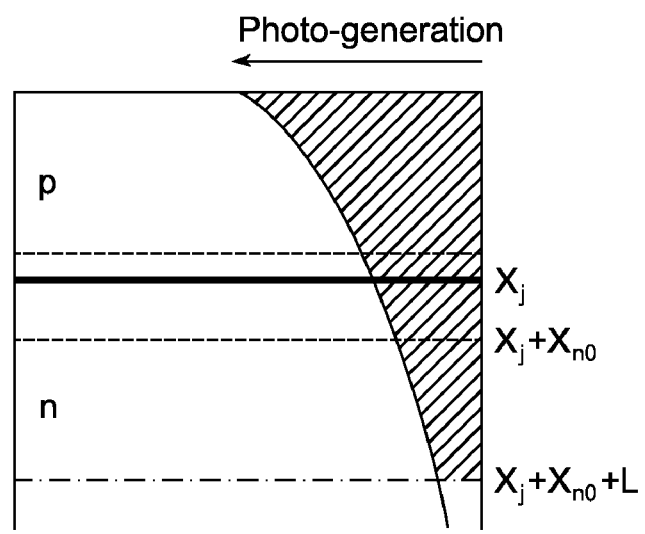
FIG. 24 illustrates computation of the carriers separation rate.
Figure 25:
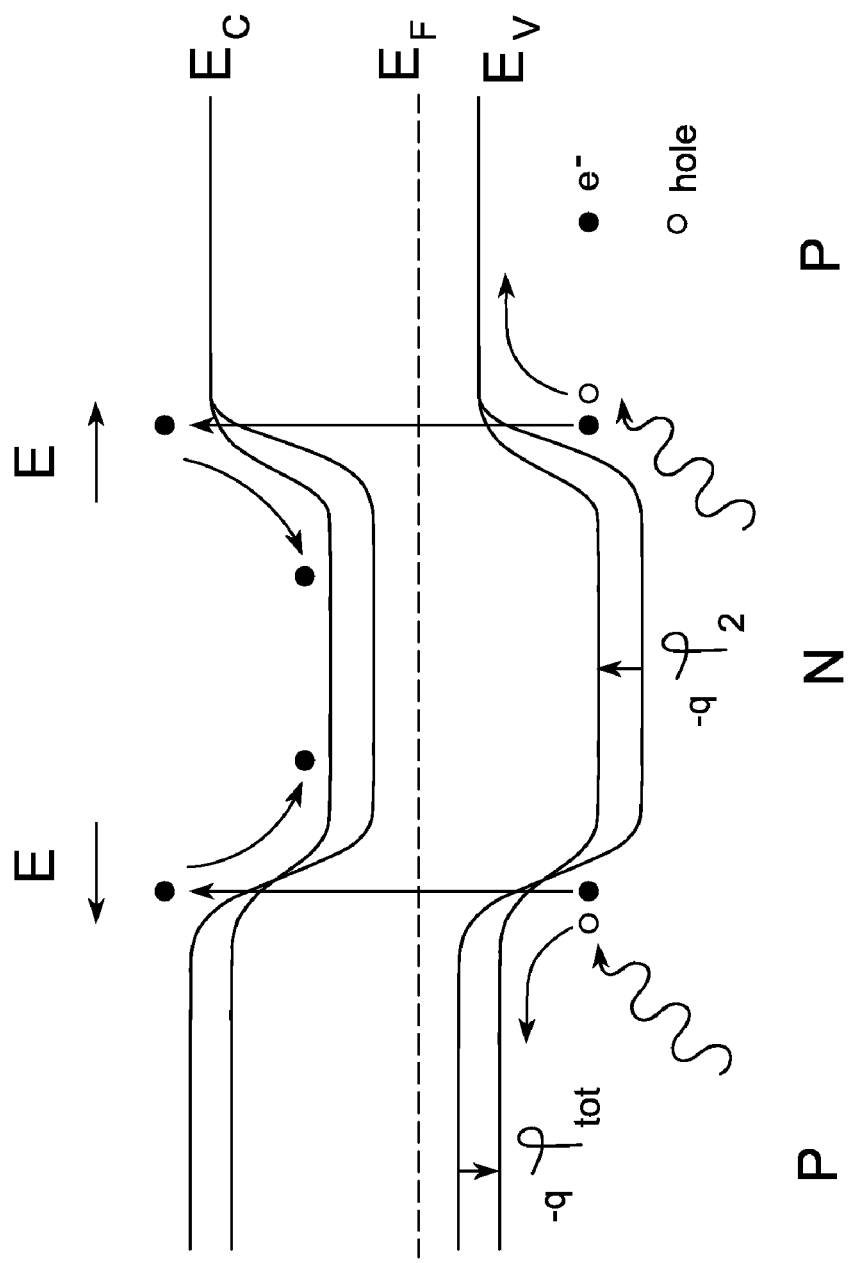
FIG. 25 illustrates energy bands for a double layer structure.
Figure 26:
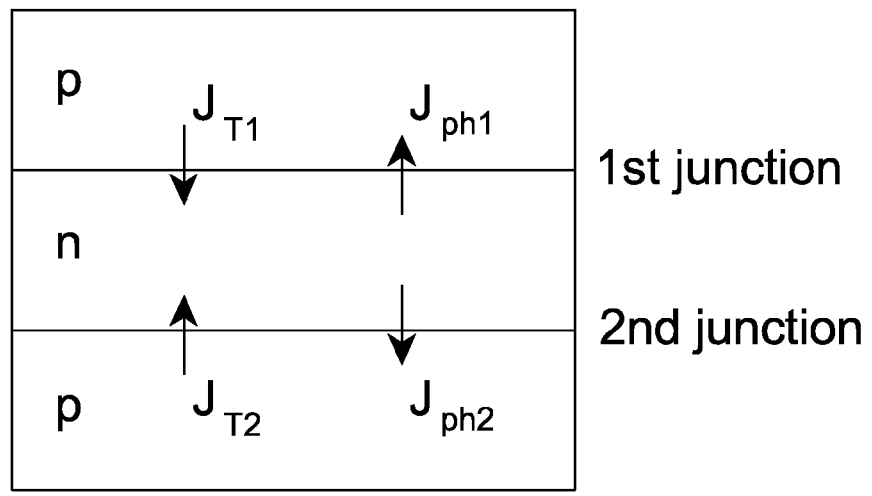
FIG. 26 illustrates currents of the p.n.p structure in the uniform illumination case.
Figure 27:
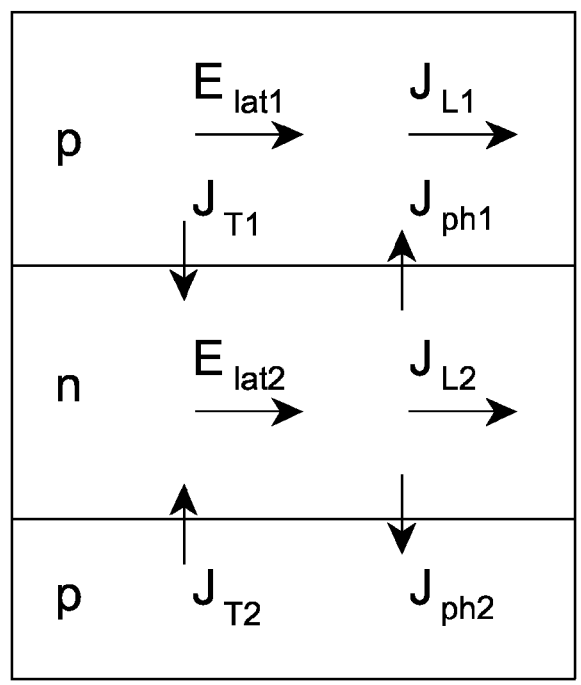
FIG. 27 illustrates currents of the p.n.p structure in the non-uniform illumination case.
Figure 28:
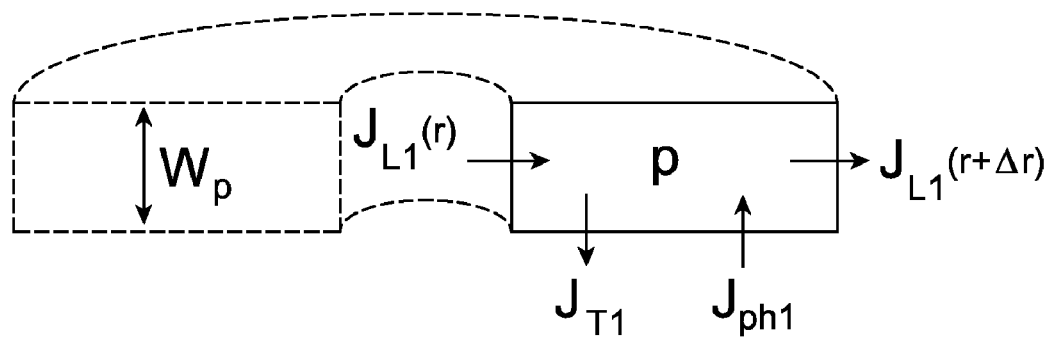
FIG. 28 illustrates cross section of the annulus with the different current densities.
Figure 29:
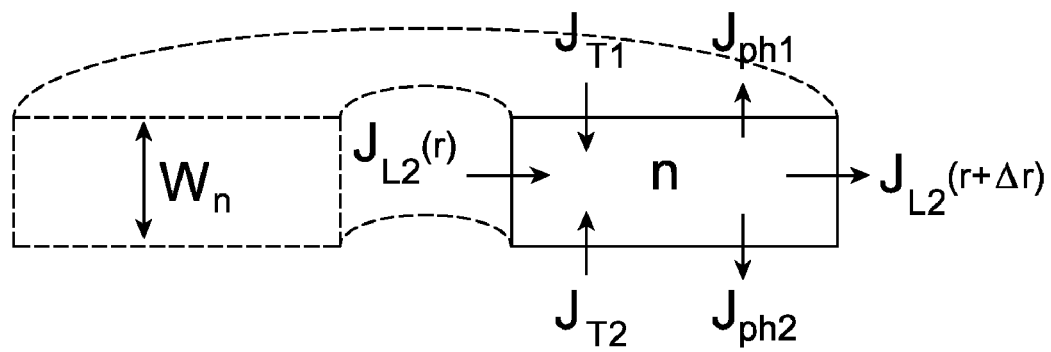
FIG. 29 illustrates cross section of the annulus with the different current densities.
Figure 30A:
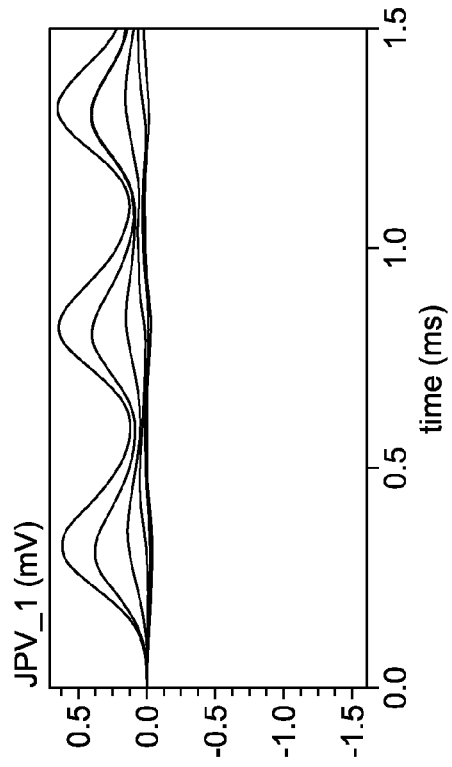
FIG. 30 illustrates simulated timecurves of the photopotentials in a p.n.p structure.
Figure 30C:
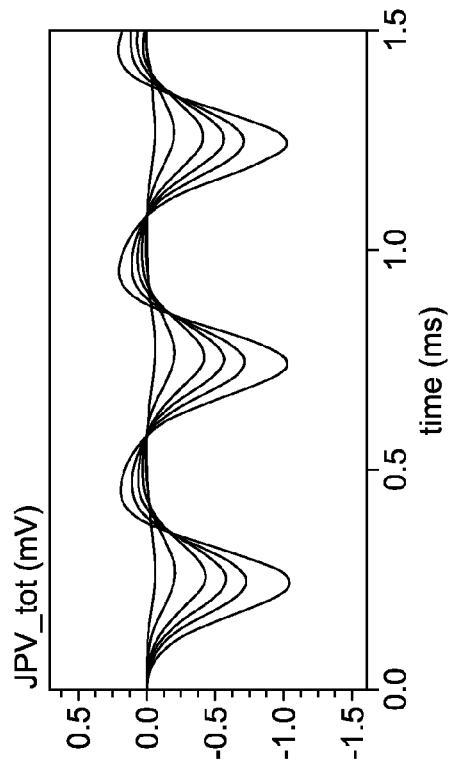
Figure 30B:
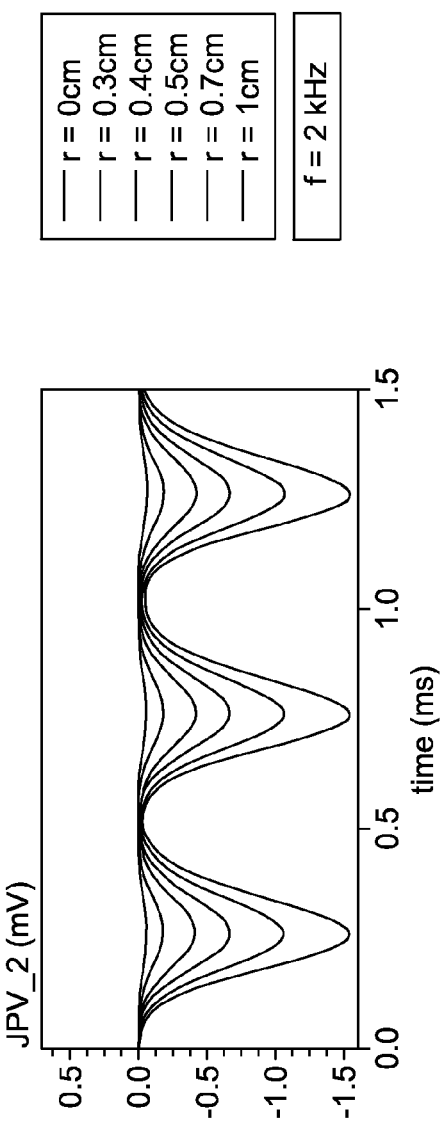
Figure 31A:
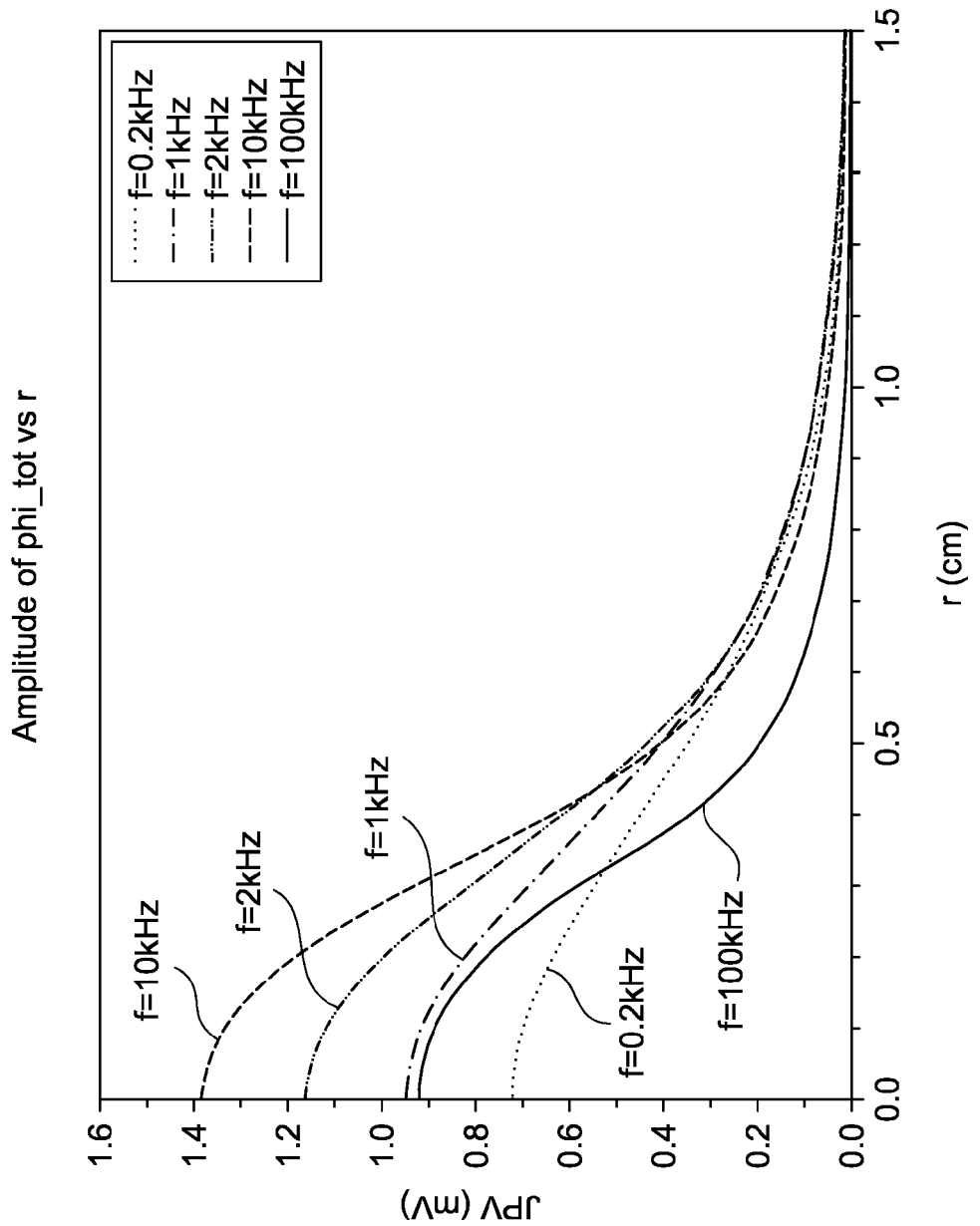
FIG. 31a-f illustrates comparison between theory (left) and simulations (right) for a double-layer structure.
Figure 31B:
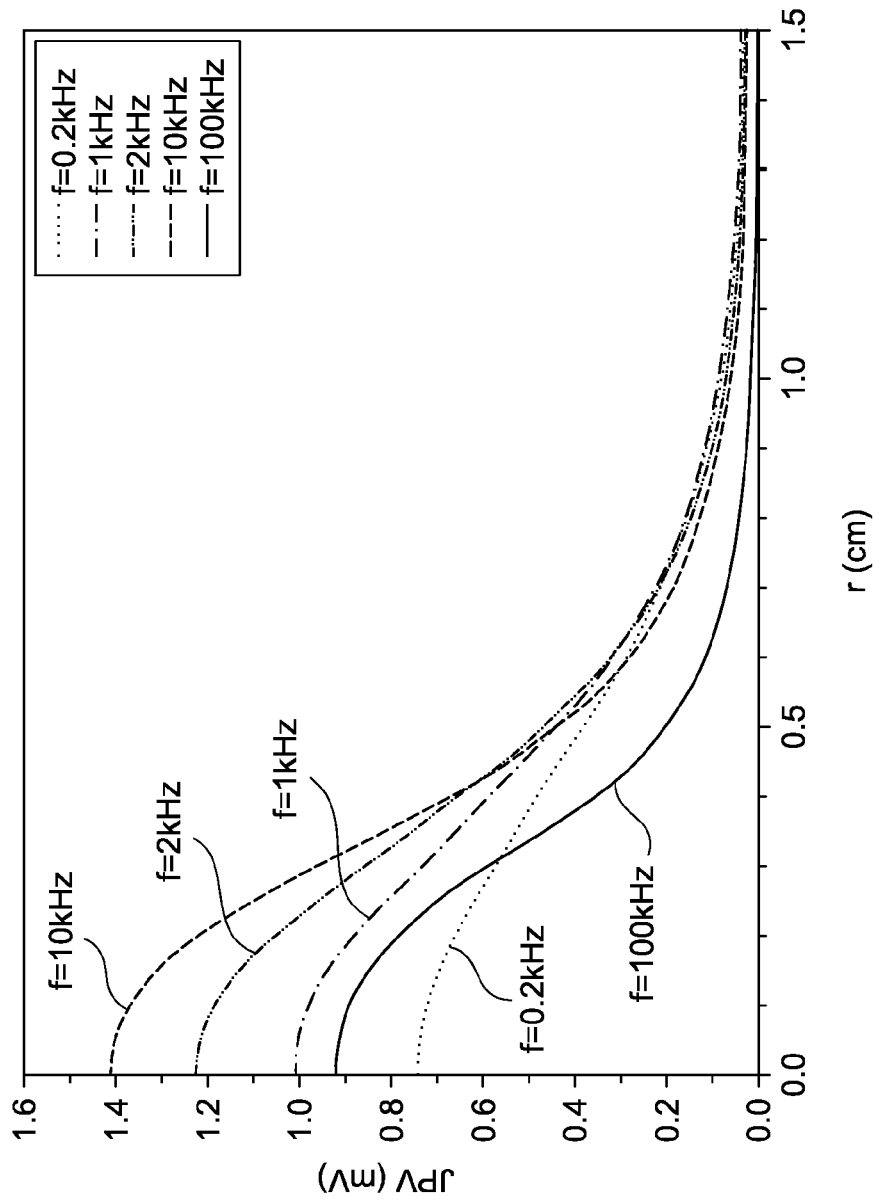
Figure 31C:
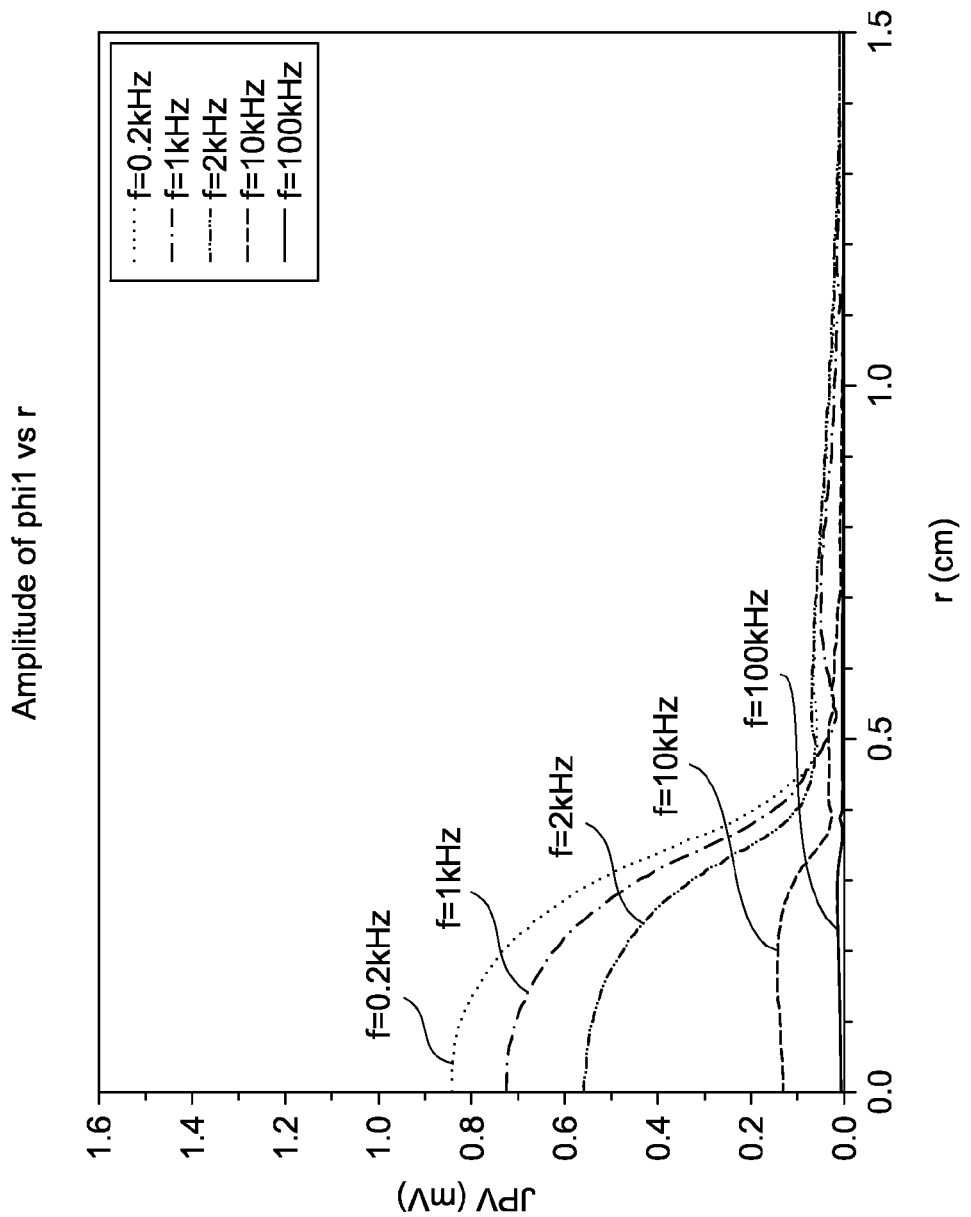
Figure 31D:
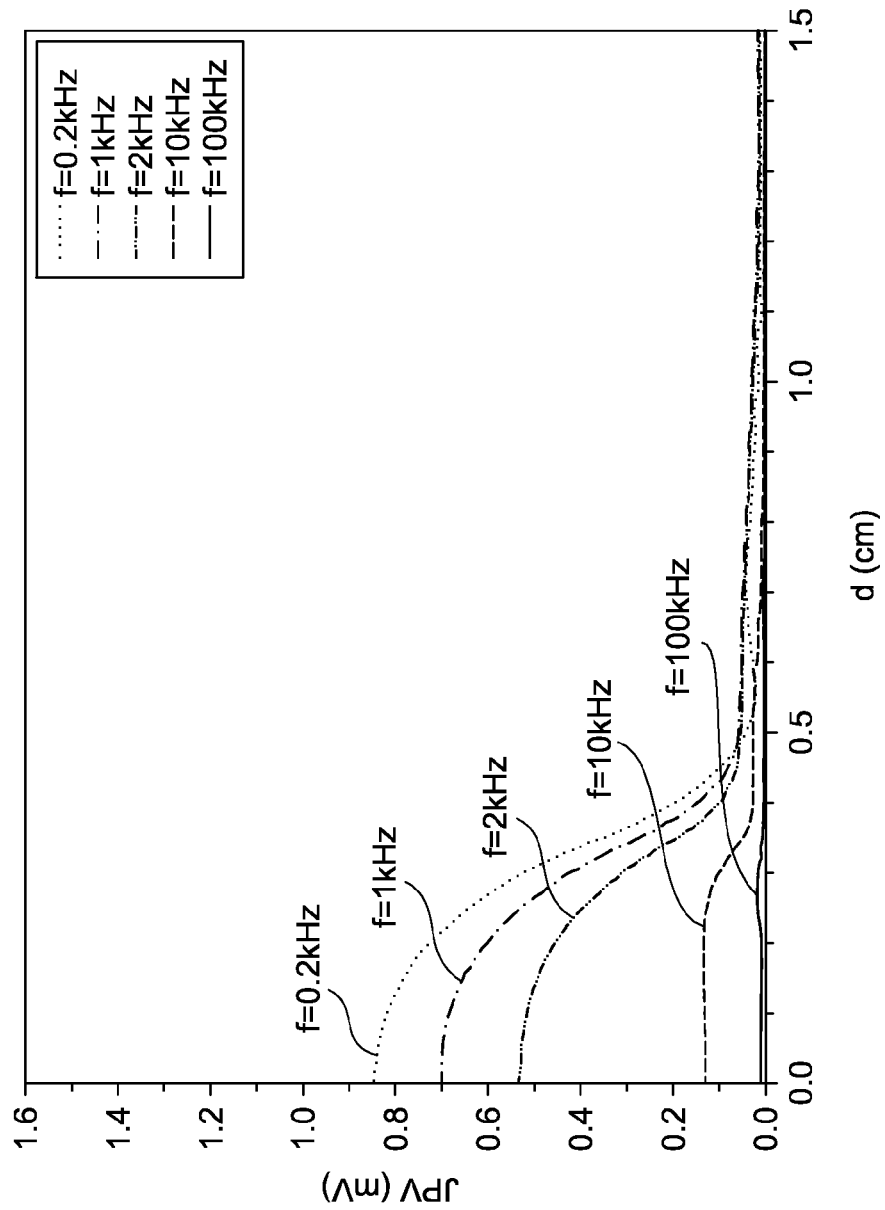
Figure 31E:
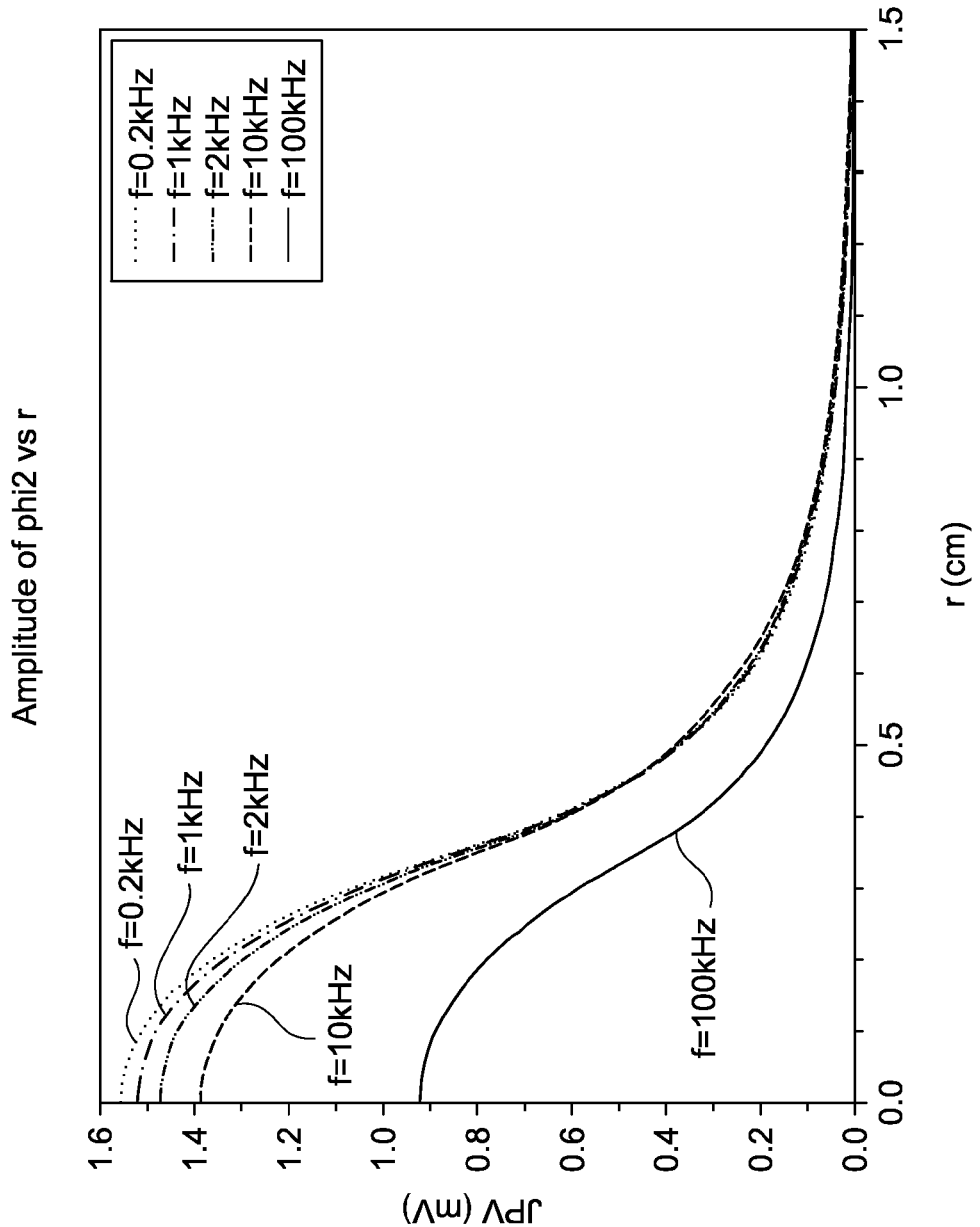
Figure 31F:
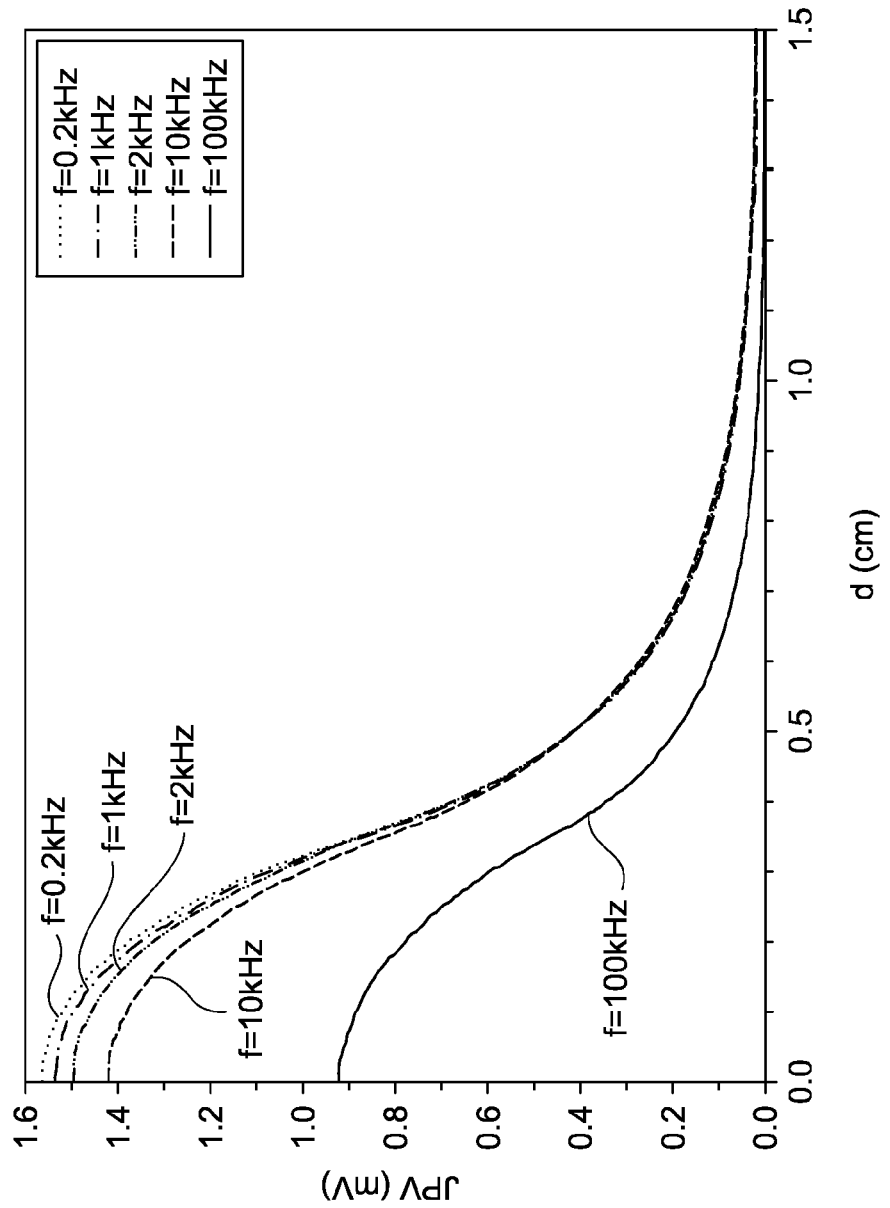
Figure 32A:
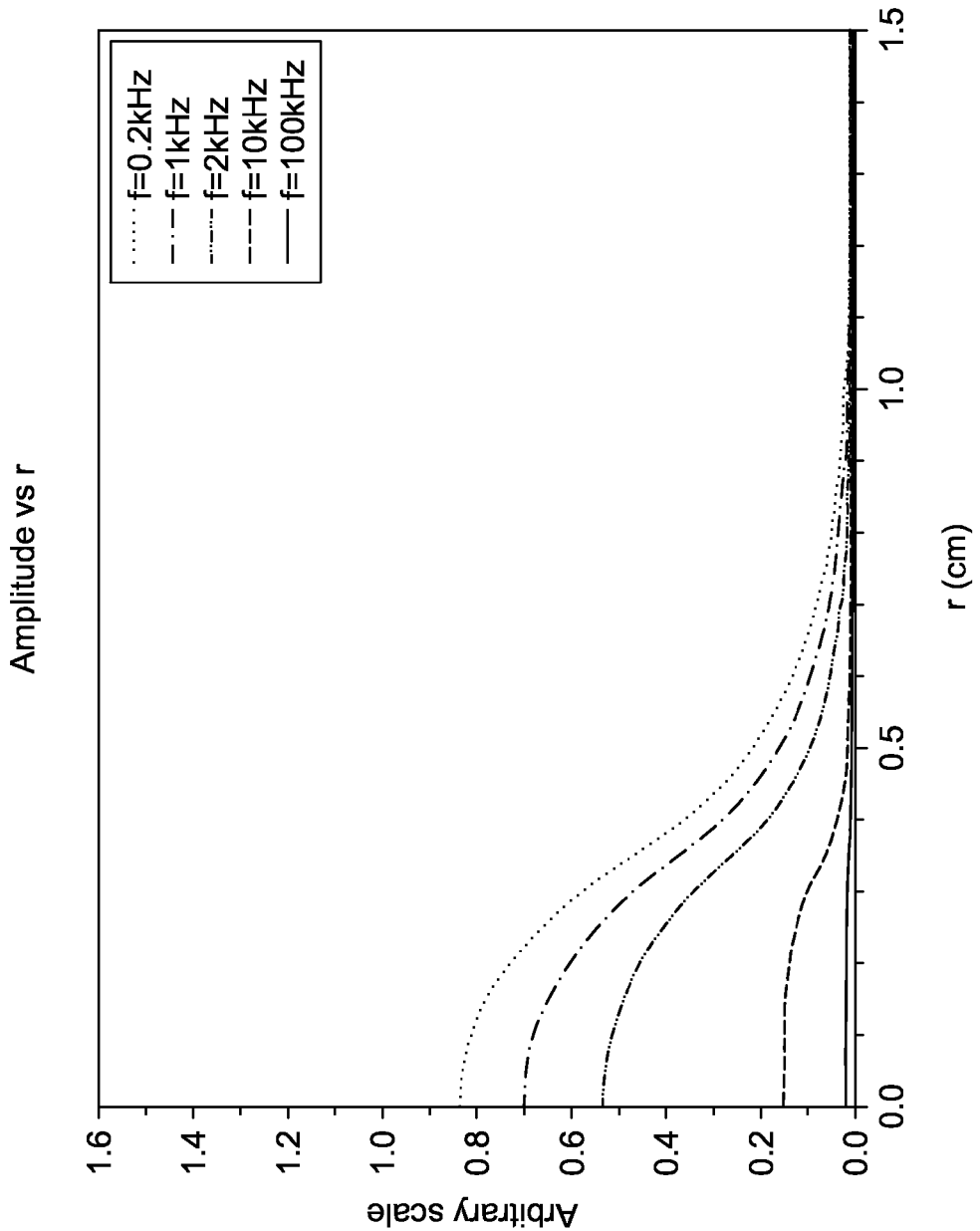
FIG. 32a-b illustrates theoretical JPV distributions for two single junctions.
Figure 32B:
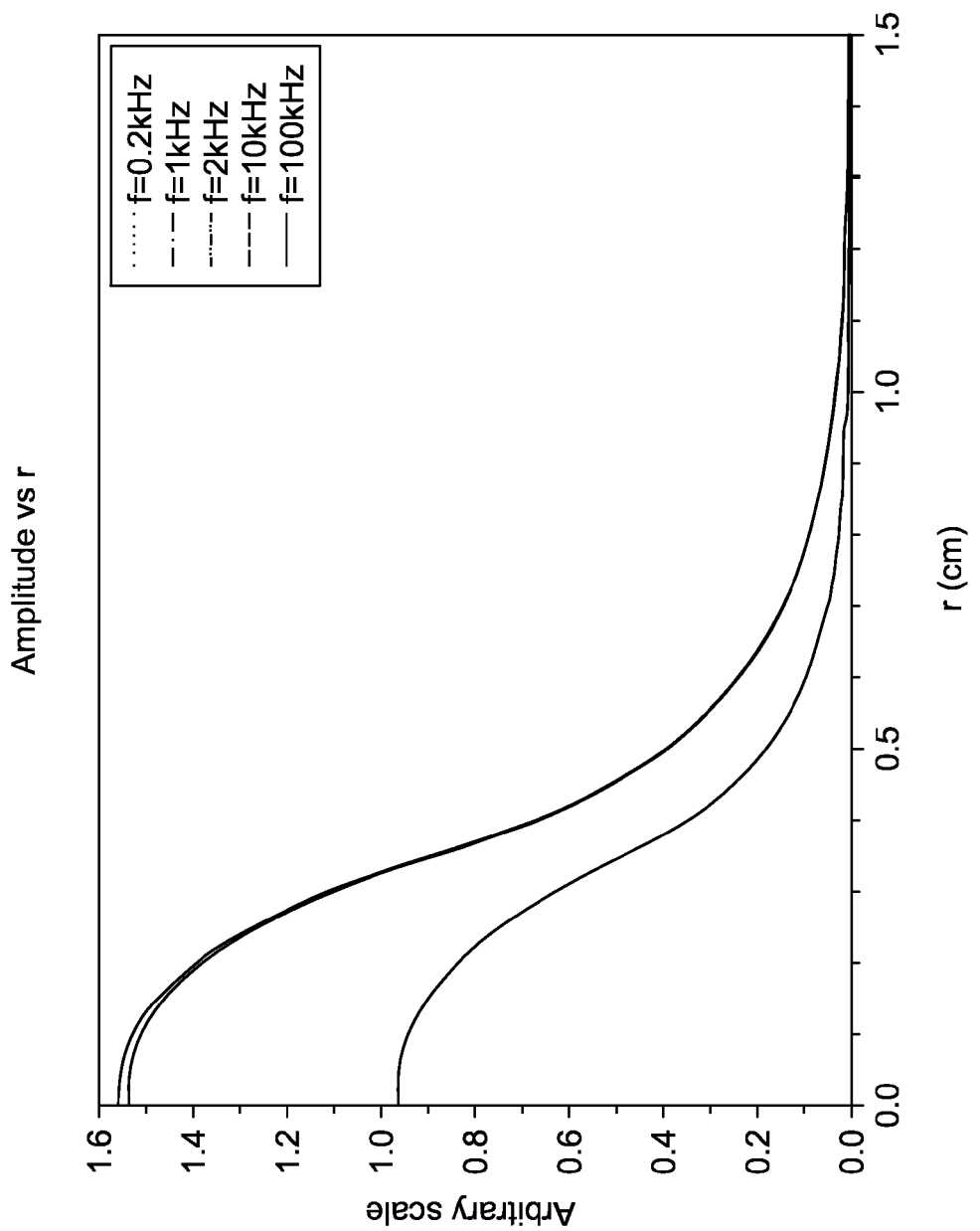
Figure 33:
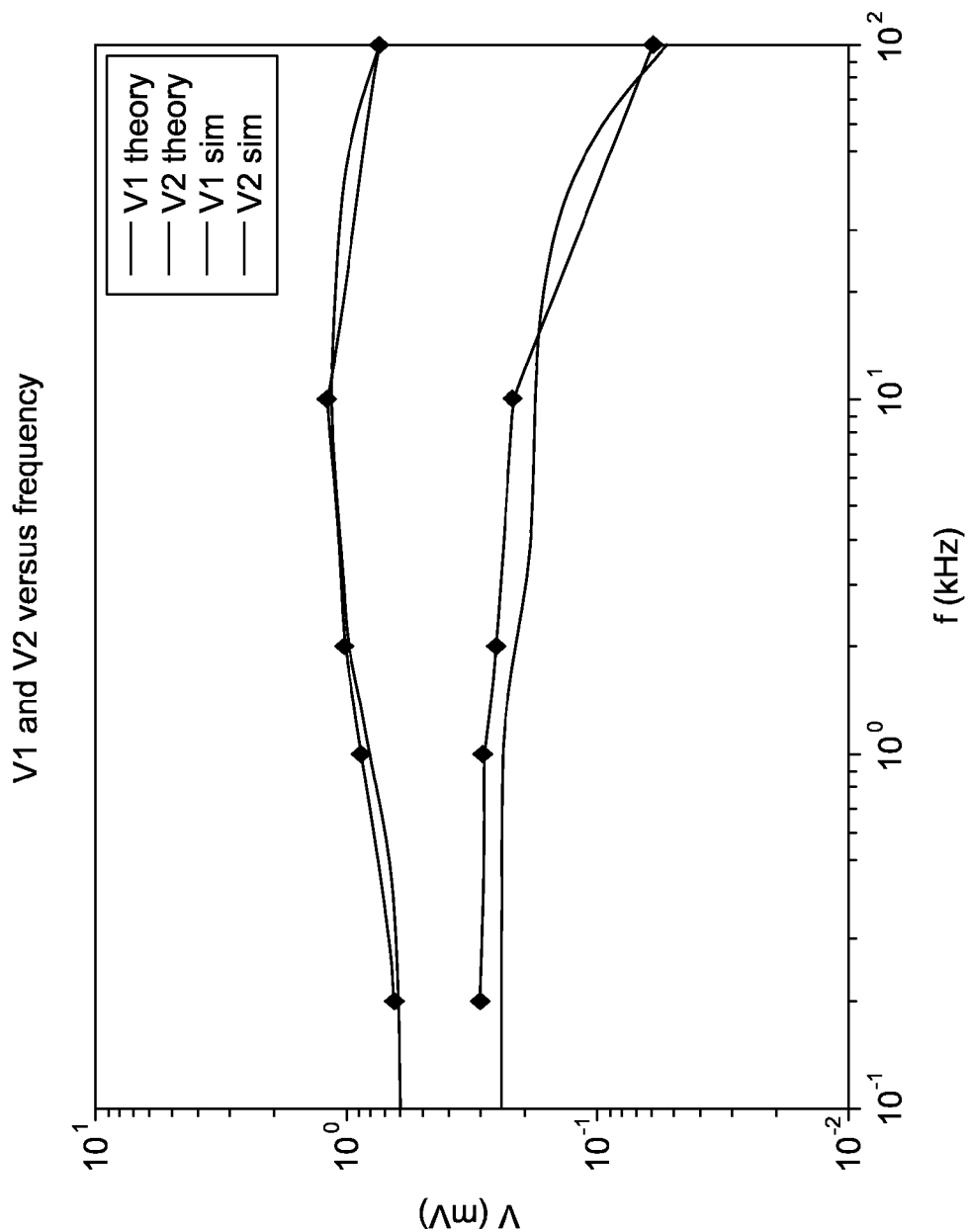
FIG. 33 illustrates comparison between analytical and simulated frequency curves for a double-layer structure.
Figure 34A:
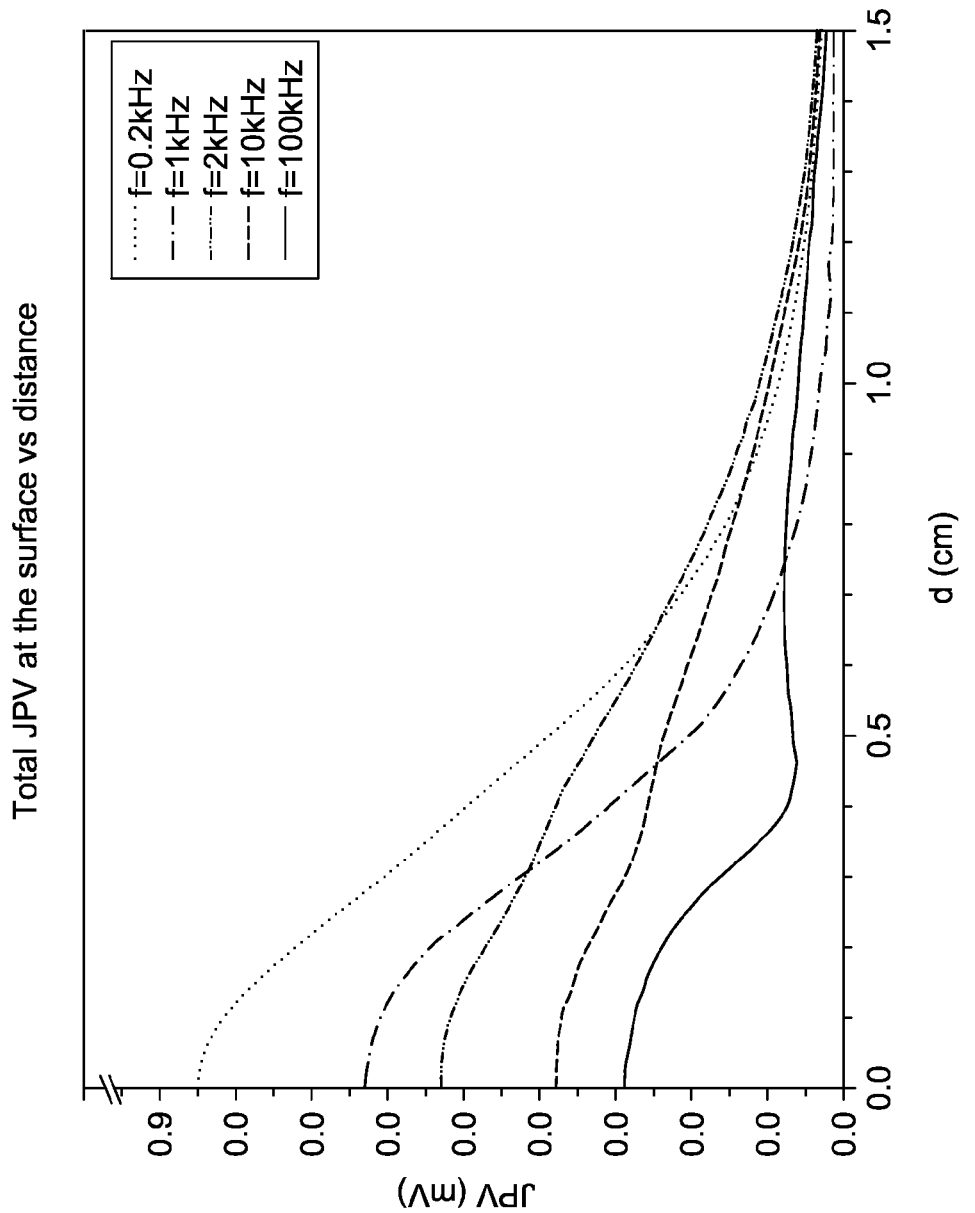
FIG. 34a-d illustrates comparison between theory (left) and simulations (right) for a double-layer structure (deeper 2nd junction).
Figure 34B:
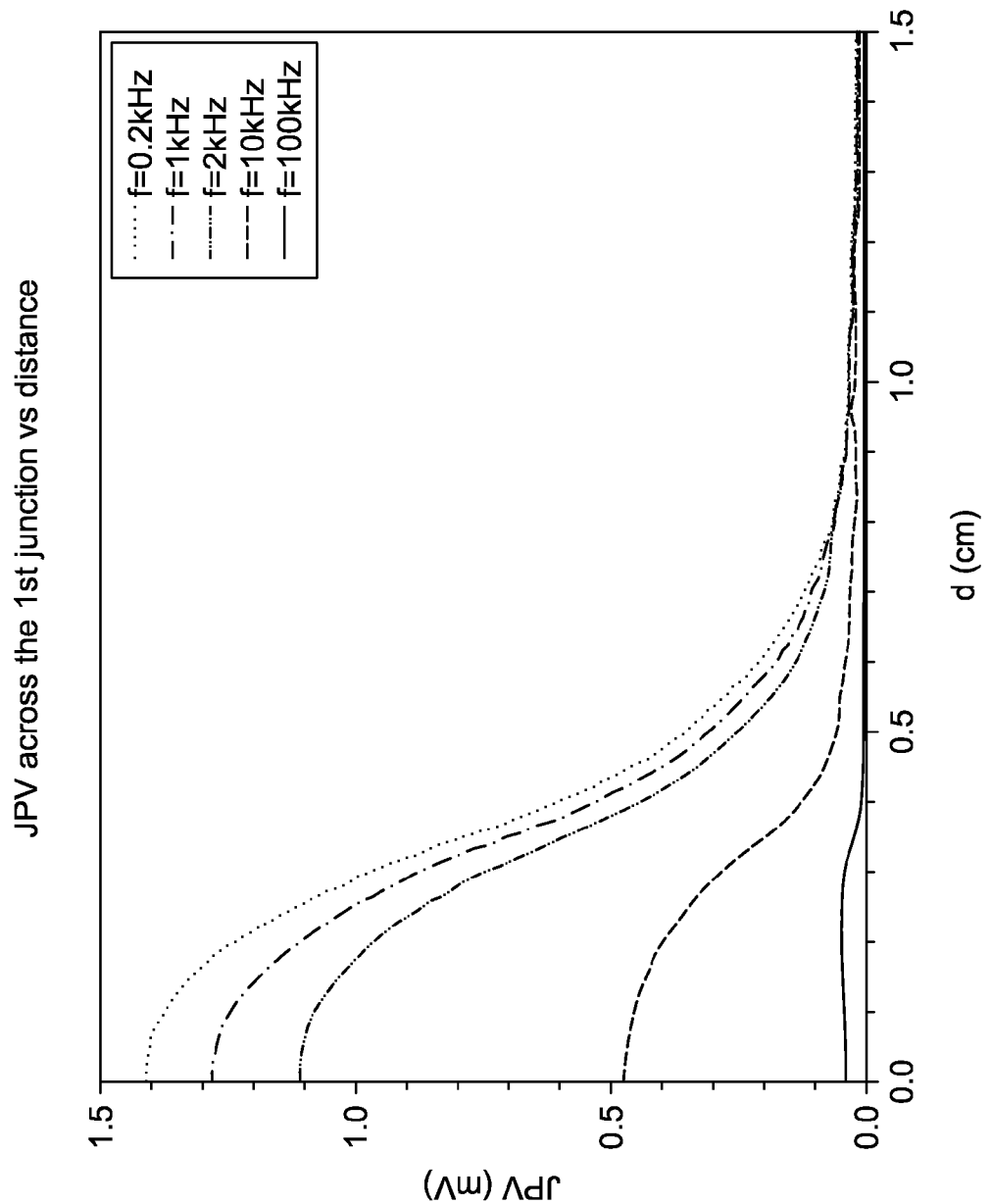
Figure 34C:
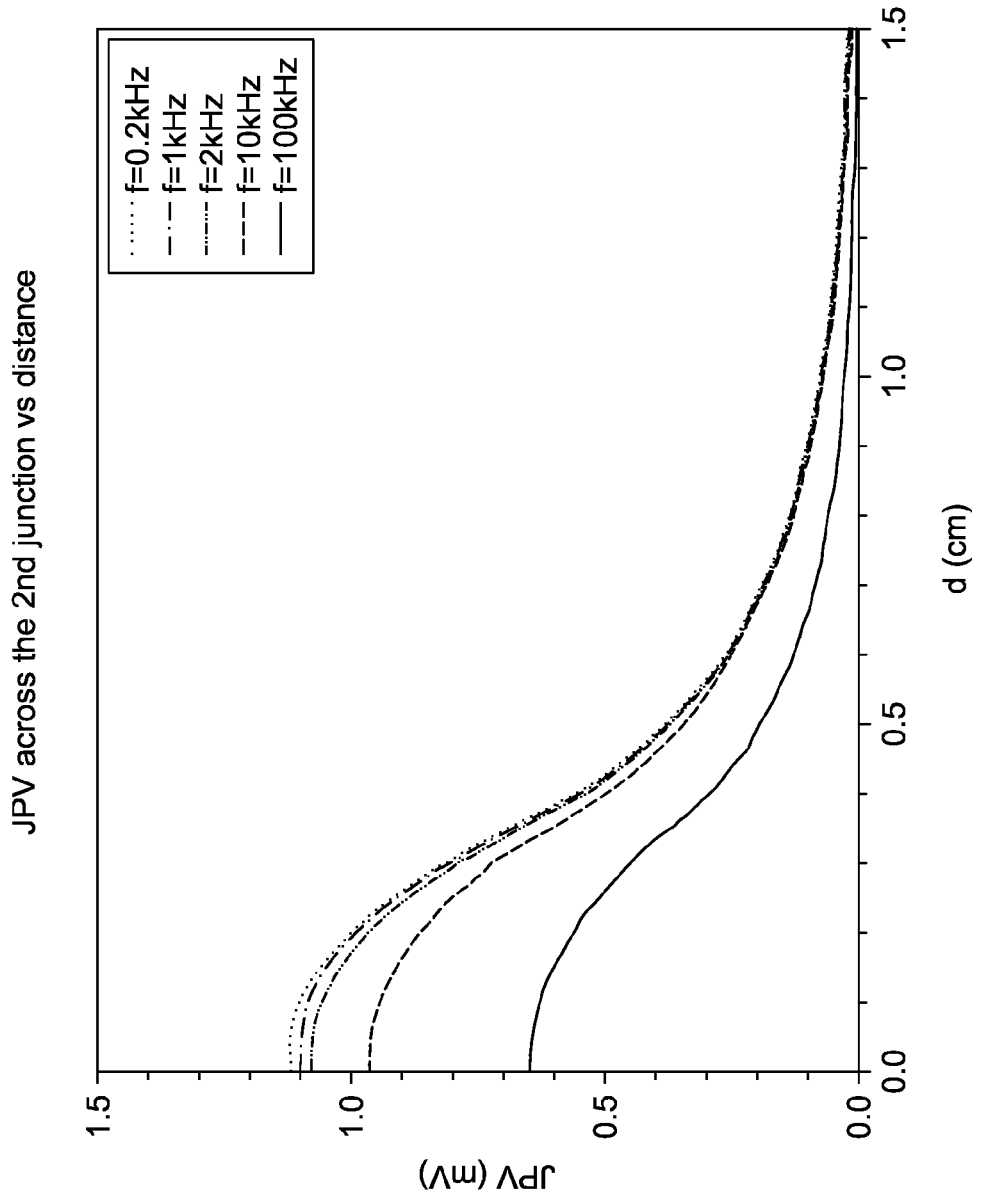
Figure 34D:
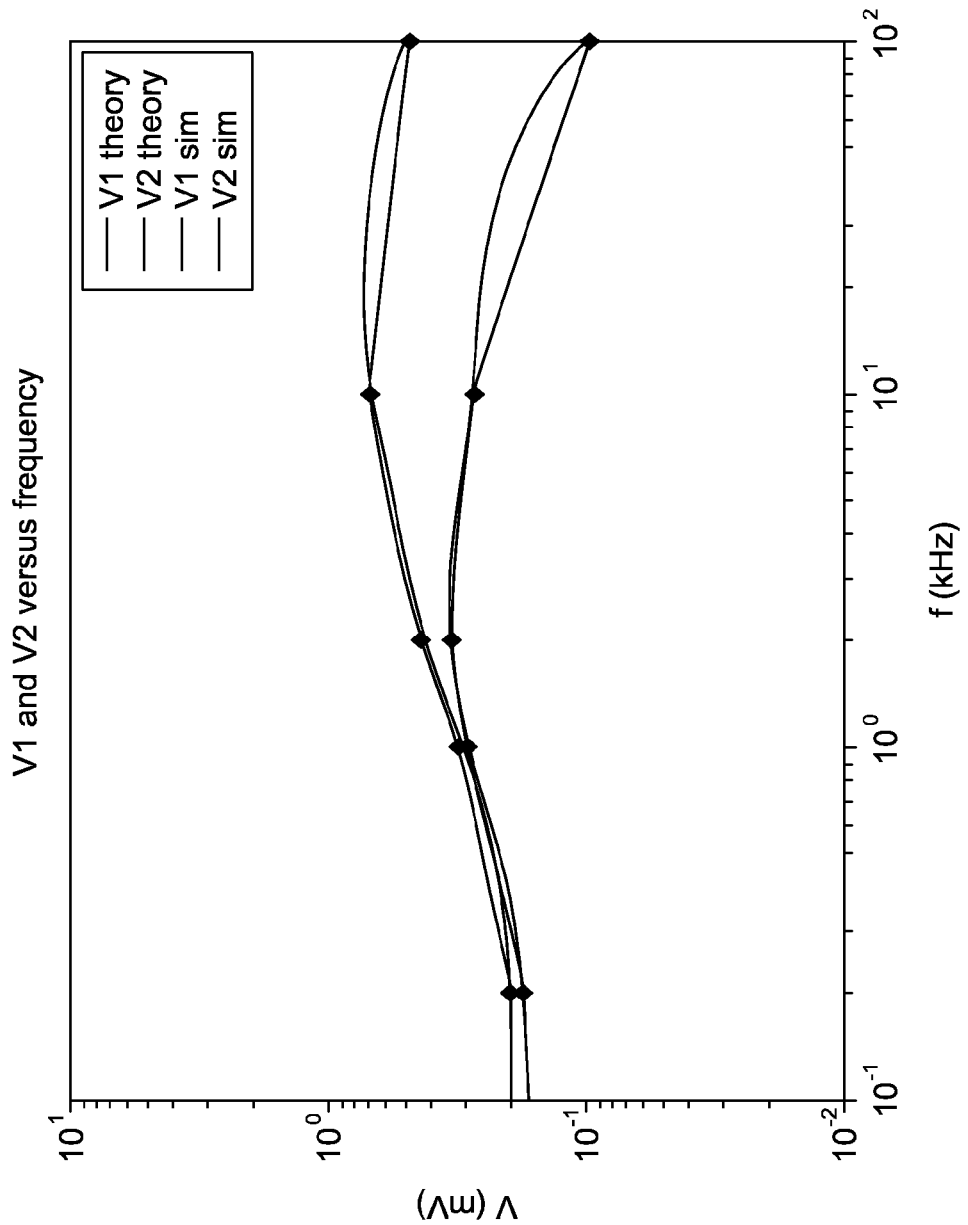
Figure 35A:
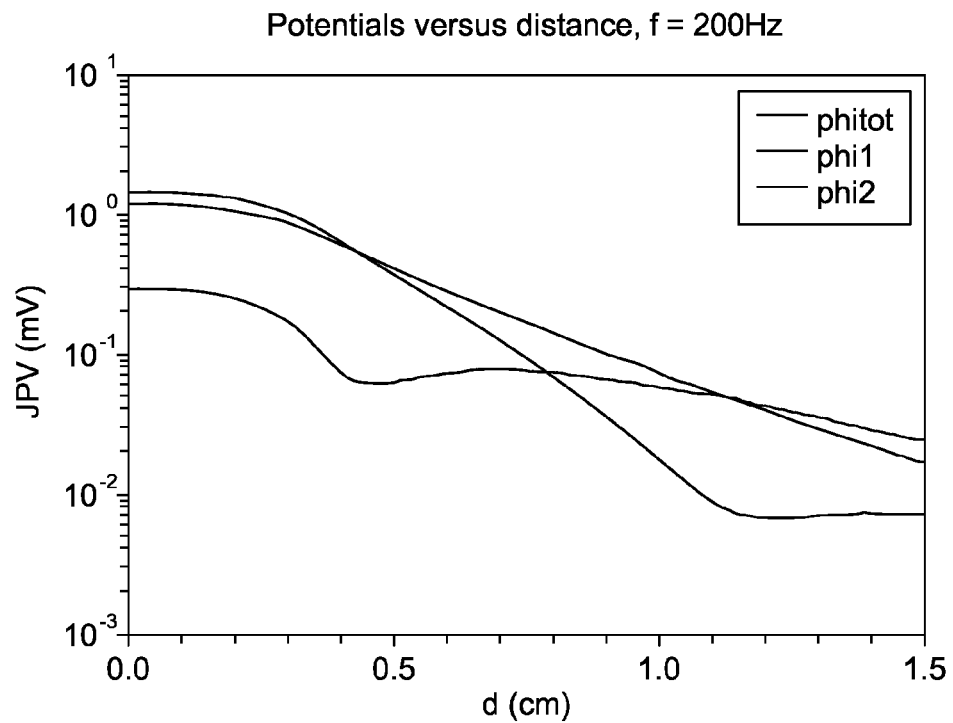
FIG. 35a-b illustrates amplitude and phase of the JPV distributions at f=0.2 [kHz].
Figure 35B:
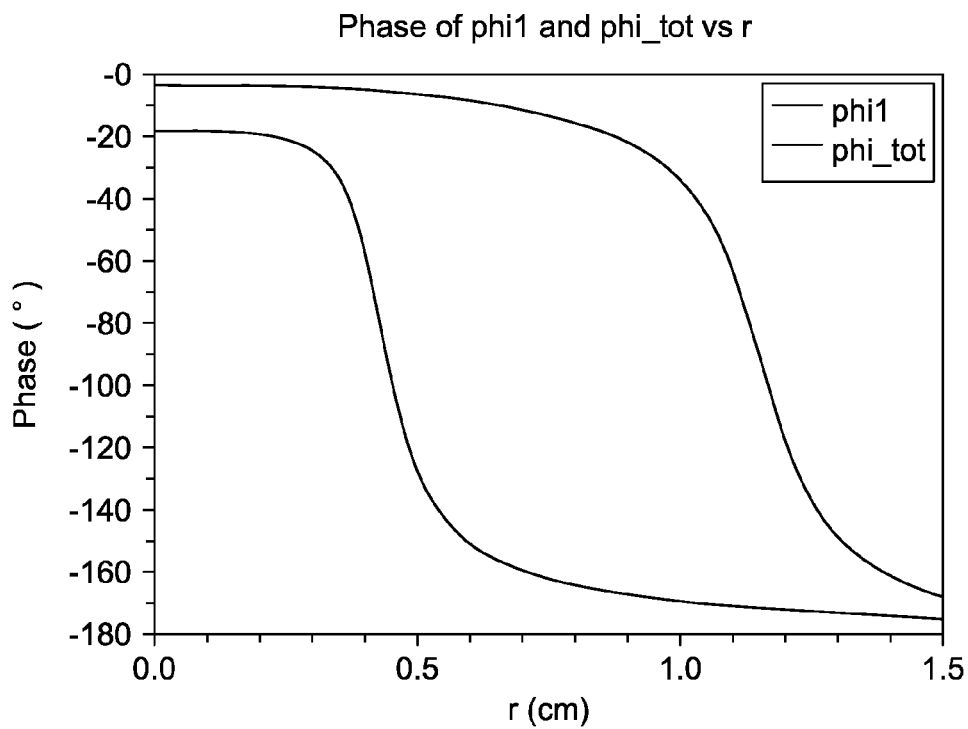
Figure 36:
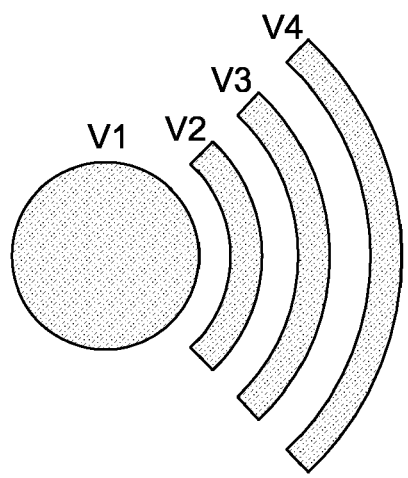
FIG. 36 illustrates possible probe geometry for a double-layer structure.
Figures 37A, 37B:
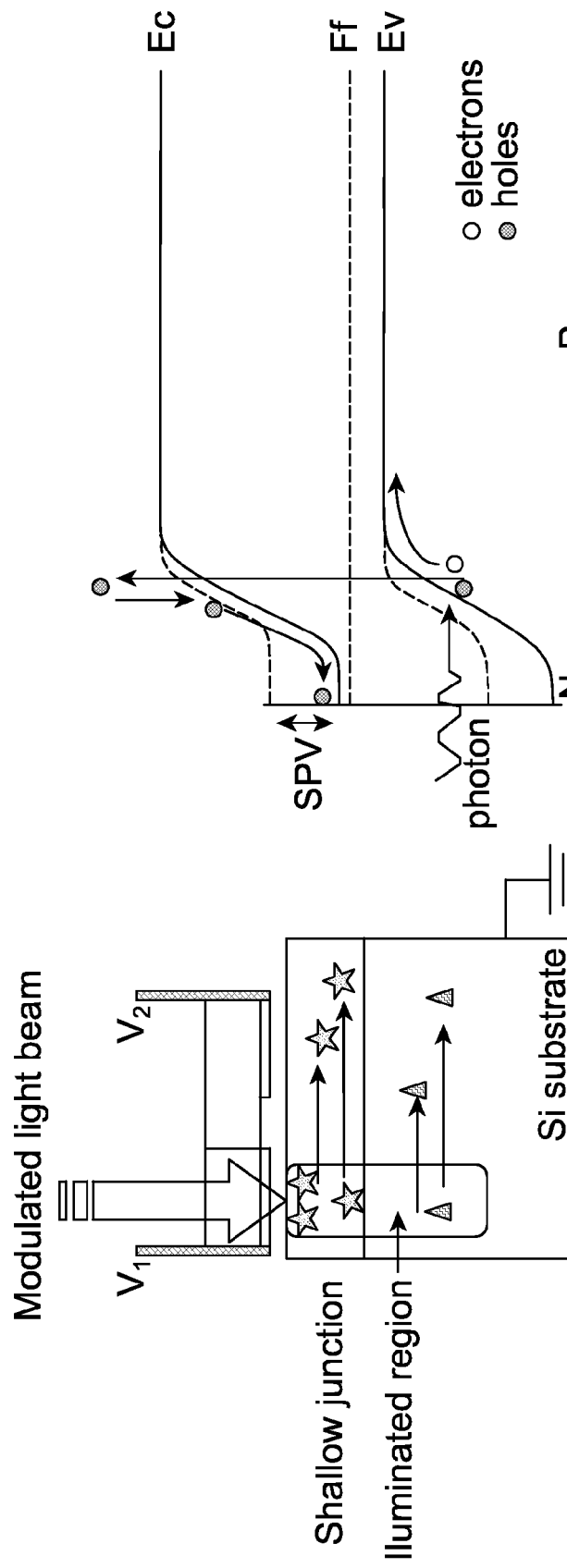
FIG. 37A-B illustrates electron-hole generation, separation and lateral drift of the excess carriers, and impact of the light and corresponding excess carriers on the band diagram and hence the surface photo-voltage, referred to as the junction photo-voltage (JPV) in this work.
Figure 38:
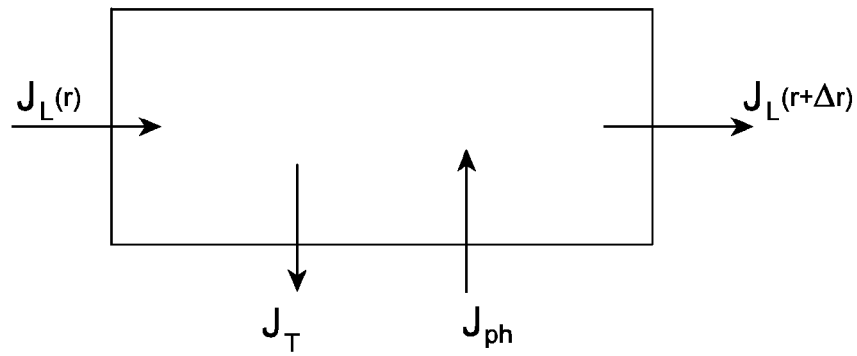
FIG. 38 illustrates different currents entering and leaving an annulus of height W during an RsL measurement.
Figure 39:
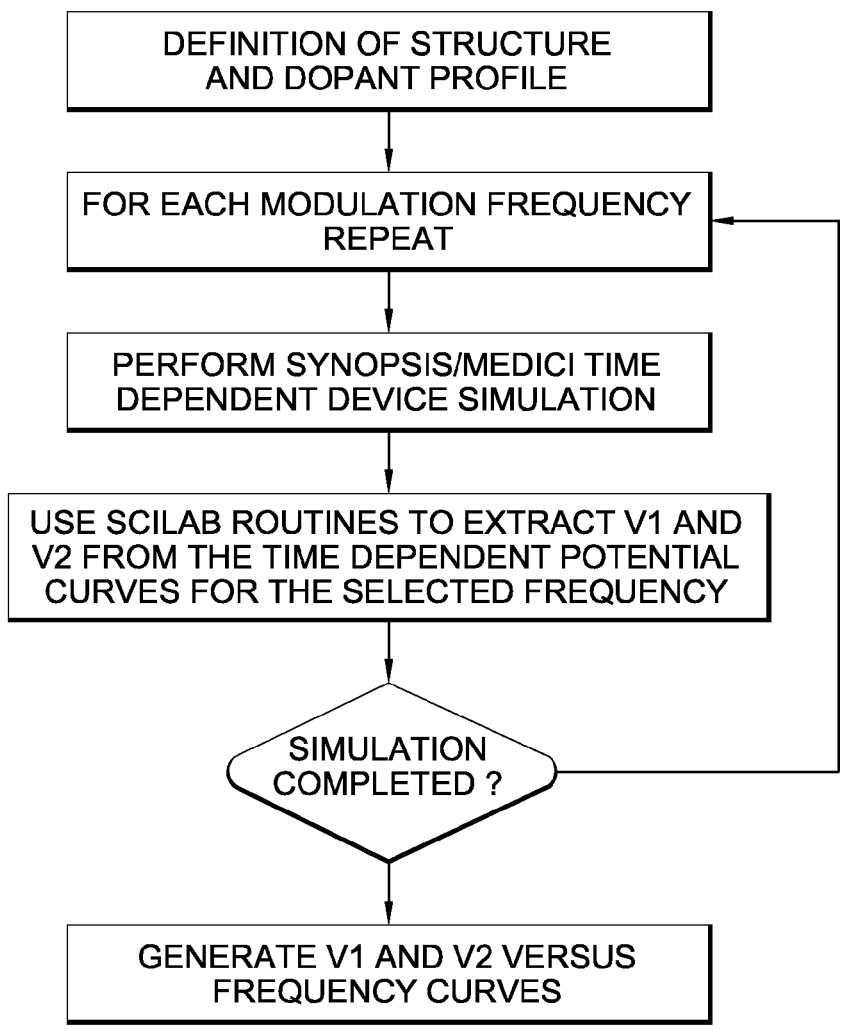
FIG. 39 illustrates JPV simulation flowchart.
Figure 40A:
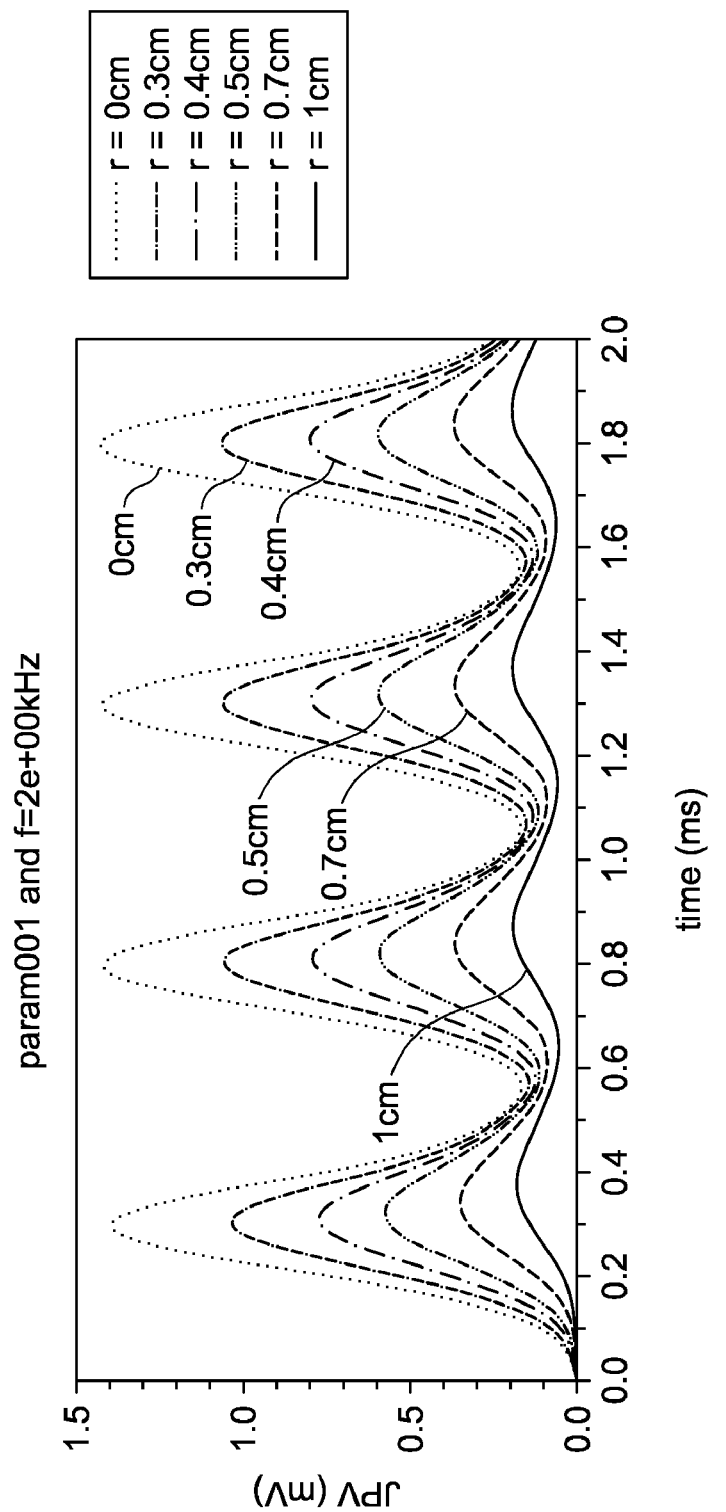
FIG. 40a-b illustrates surface potential versus time at different lateral positions, (b) Simulated, theoretical and experimental frequency curves for V1 and V2. Simulation dopant structure was p-type box profile doped $1.5e19/cm^3$ with thickness of 41 nm on top of medium doped n-type $7e17/cm^3$ layer. Light source was red light (700 nm) with an intensity of $10^{-4}$ W/cm$^2$.
Figure 40B:
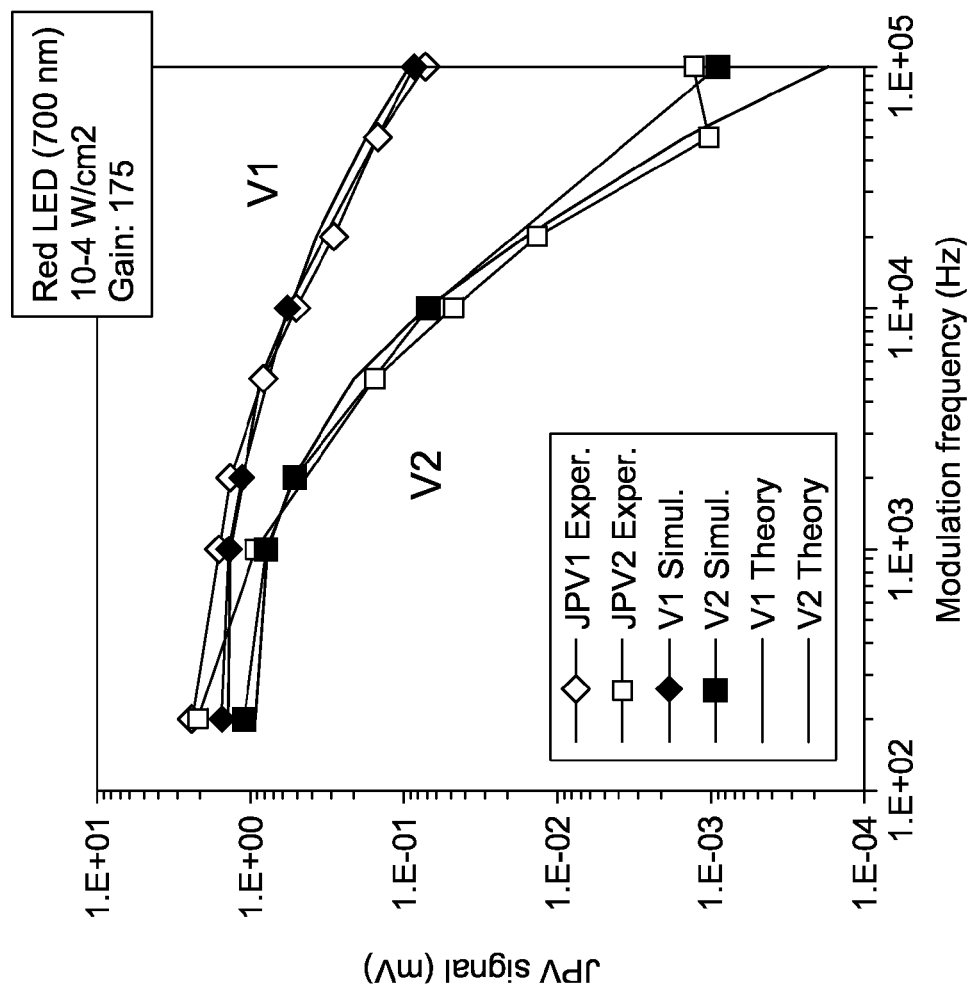
Figure 41:
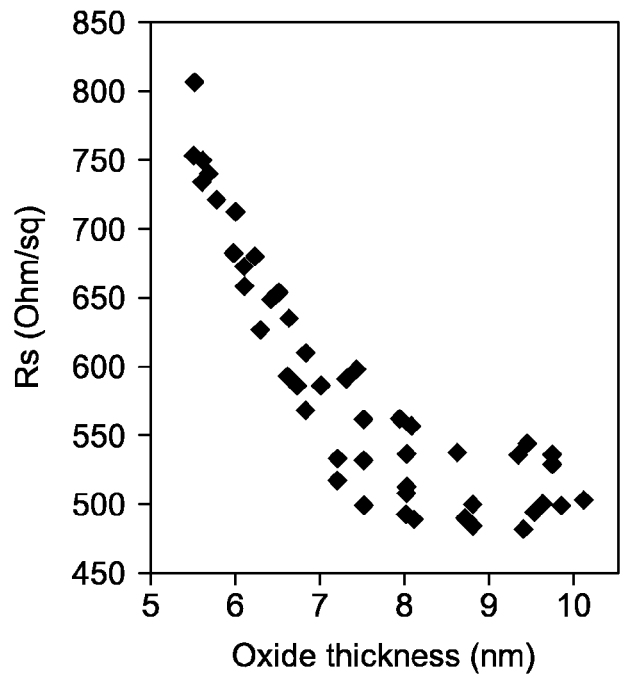
FIG. 41 illustrates RsL sheet resistance map whole wafer with oxide measured with UV light, same measured with Violet light, XPS oxide thickness map (in nm), RsL sheet resistance map on wafer piece after oxide removal (black spots are measured on the chuck, and correlation apparent $R_s$ value versus oxide thickness.
Figure 42:
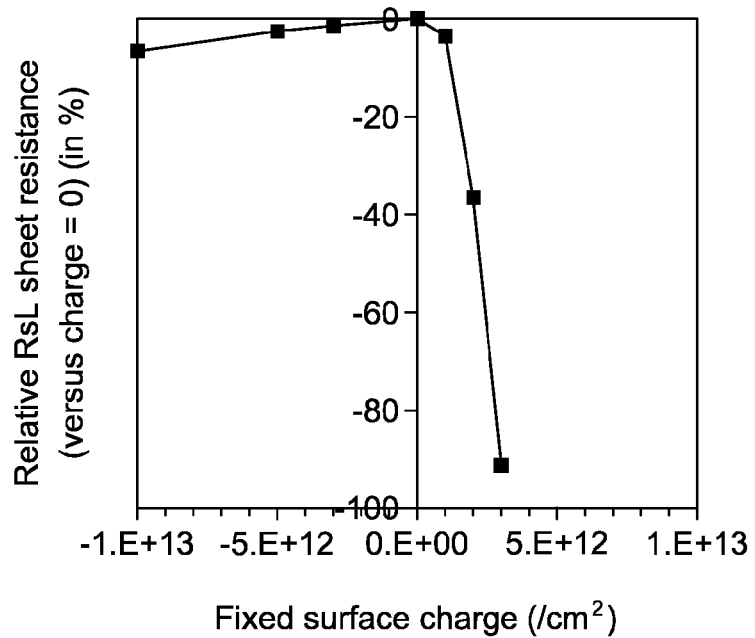
FIG. 42 illustrates relative variation of apparent sheet resistance versus fixed oxide charge from simulations using UV light.
Figure 43A:
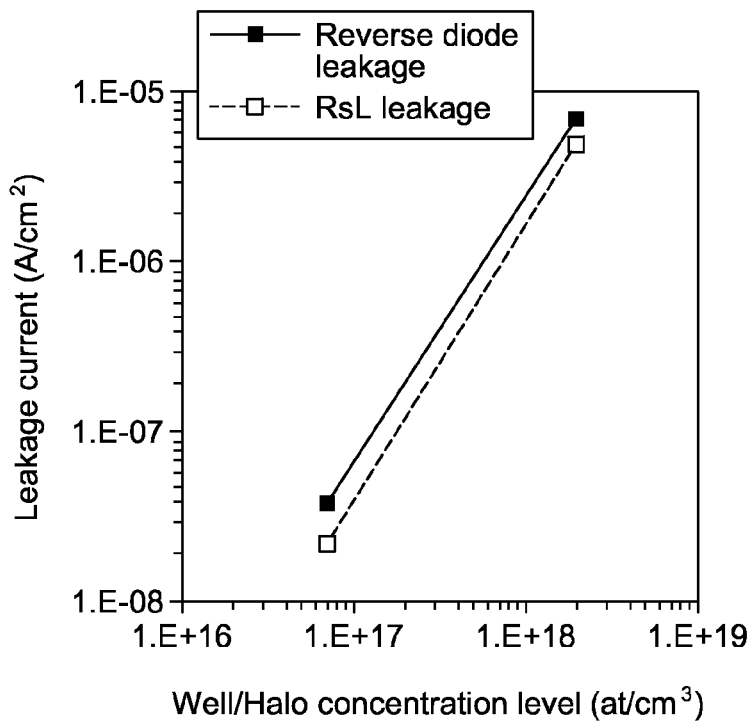
FIG. 43a-b illustrate (a) Reverse bias leakage versus dopant level underlying n-type layer (well/halo), and (b) correlation RsL and reverse bias leakage currents for 3e19 p-type doped 7 nm thick box profile.
Figure 43B:
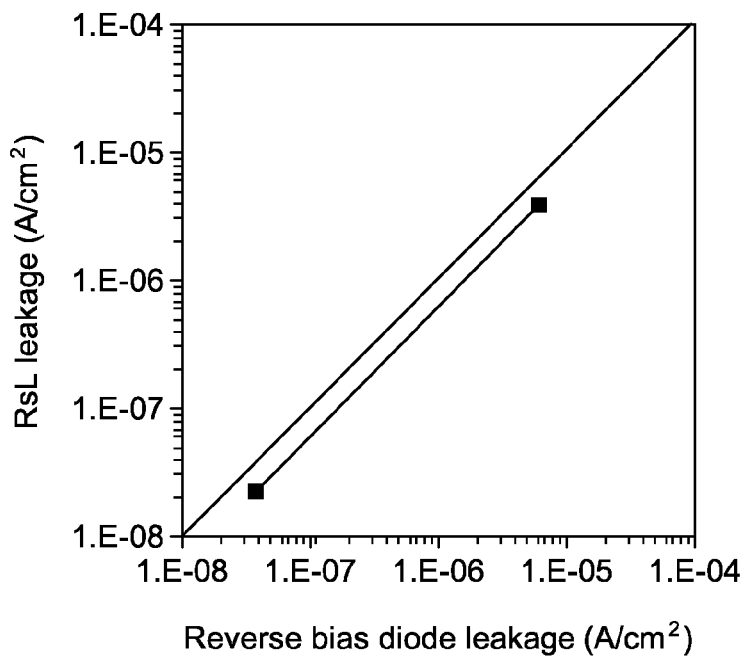

As indicated above, one embodiment also provides a computing unit for calculating an electrical and/or physical parameter of the semiconductor structure based on the first photo-voltage and on the second photo-voltage. The computation unit may include a computing device, e.g. microprocessor. Any of the methods described above according to one embodiment or claimed may be implemented in a computation unit 40 such as shown in FIG. 5. FIG. 5 shows one configuration of computation unit 40 that includes at least one customizable or programmable processor 41 coupled to a memory subsystem 42 that includes at least one form of memory, e.g., RAM, ROM, and so forth. It is to be noted that the processor 41 or processors may be a general purpose, or a special purpose processor, and may be for inclusion in a device, e.g., a chip that has other components that perform other functions. Thus, one or more aspects of the method according to embodiments of the present invention can be implemented in digital electronic circuitry, or in computer hardware, firmware, software, or in combinations of them. The computation unit may include a storage subsystem 43 that has at least one disk drive and/or CD-ROM drive and/or DVD drive. In some implementations, a display system, a keyboard, and a pointing device may be included as part of a user interface subsystem 44 to provide for a user to manually input information, such as parameter values. Ports for inputting and outputting data also may be included. More elements such as network connections, interfaces to various devices, and so forth, may be included, but are not illustrated in FIG. 5. The various elements of the computation unit 40 may be coupled in various ways, including via a bus subsystem 45 shown in FIG. 5 for simplicity has a single bus, but will be understood to those in the art to include a system of at least one bus. The memory of the memory subsystem 42 may at some time hold part or all (in either case shown as 46) of a set of instructions that when executed on the processing system 40 implement the processes of the method embodiments described herein.

Another embodiment relates to a computer program product which provides the functionality of any of the methods described herein when executed on a computing device. The computer program product includes software with code segments for calculating an electrical and/or physical parameter of the semiconductor structure based on the first photo-voltage and on the second photo-voltage which are received as inputs to the calculation. Such computer program product can be tangibly embodied in a carrier medium carrying machine-readable code for execution by a programmable processor. One embodiment thus relates to a carrier medium carrying a computer program product that, when executed on computing means, provides instructions for executing any of the methods as described above. The term "carrier medium" refers to any medium that participates in providing instructions to a processor for execution. Such a medium may take many forms, including but not limited to, non-volatile media, and transmission media. Non-volatile media includes, for example, optical or magnetic disks, such as a storage device which is part of mass storage. Common forms of computer readable media include, a CD-ROM, a DVD, a flexible disk or floppy disk, a tape, a memory chip or cartridge or any other medium from which a computer can read. Various forms of computer readable media may be involved in carrying one or more sequences of one or more instructions to a processor for execution. The computer program product can also be transmitted via a carrier wave in a network, such as a LAN, a WAN or the Internet. Transmission media can take the form of acoustic or light waves, such as those generated during radio wave and infrared data communications. Transmission media include coaxial cables, copper wire and fiber optics, including the wires that comprise a bus within a computer.

Further detail on the foregoing embodiments may be found in the Appendix which has totally 35 pages.

The foregoing description details certain embodiments of the invention. It will be appreciated, however, that no matter how detailed the foregoing appears in text, the invention may be practiced in many ways. It should be noted that the use of particular terminology when describing certain features or aspects of the invention should not be taken to imply that the terminology is being re-defined herein to be restricted to including any specific characteristics of the features or aspects of the invention with which that terminology is associated.

While the above detailed description has shown, described, and pointed out novel features of the invention as applied to various embodiments, it will be understood that various omissions, substitutions, and changes in the form and details of the device or process illustrated may be made by those skilled in the technology without departing from the spirit of the invention. The scope of the invention is indicated by the appended claims rather than by the foregoing description. All changes which come within the meaning and range of equivalency of the claims are to be embraced within their scope.

What is claimed is:

1. A junction-photovoltage method of contactlessly determining a physical parameter of a semiconductor structure comprising at least one p-n junction located at a surface, comprising:
   a) illuminating the surface with the p-n junction of the semiconductor structure with a light beam of a first wavelength to create excess carriers at the surface;
   b) modulating the light intensity of the light beam at a single predefined frequency;
   c) contactlessly determining a first photo-voltage at a first position inside the illuminated area and contactlessly determining a second photo-voltage at a second position outside the illuminated area;
   d) contactlessly determining a third and a fourth photo-voltage by illuminating the surface with the p-n junction by a light beam having another wavelength and repeating the process b) and/or by selecting further measurements positions outside the illumination area; and
   e) calculating a physical parameter of the semiconductor structure based on the first, the second, the third, and the fourth photo-voltage.

2. The method according to claim 1, further comprising modulating the light intensity of the light beam at a second predefined frequency different from the single predefined frequency and performing processes c) and d).

3. The method according to claim 1, wherein the processes a), b), c), d), and e) are carried out on a calibration wafer comprising the semiconductor structure and a substrate.

4. The method according to claim 1, wherein the physical parameter comprises at least one of the following: a sheet resistance, a leakage current, a junction capacitance, a junction conductance, and a carrier separation rate.

5. The method according to claim 1, wherein the semiconductor structure comprises a layer of an opposite dopant type for separating at least two layers of the same dopant type.

6. The method according to claim 1, wherein the semiconductor structure further comprises a substrate comprising a bulk semiconductor or a semiconductor-on-insulator.

7. The method according to claim 1, wherein the calculation in process d) is performed with the first photo-voltage $V_1$ and the second photo-voltage $V_2$ for at least one p-n junction according to $$V_1 = \left| \frac{qFR_s}{\beta^2} [1 - 2I_1(\beta R_0) K_1(\beta R_0)] \right|, \text{ and}$$

$$V_2 = \left| \frac{\theta}{2\pi} \frac{2qFR_s}{\beta^2 R_0} I_1(\beta R_0)[R_1 K_1(\beta R_1) - R_2 K_1(\beta R_2)] \right|, \text{ with}$$

$$\beta = \sqrt{R_s G_s + i\omega R_s C_s}$$

where Rs is the sheet resistance of the top layer of the junction, Gs is the conductance of the junction at zero bias, Cs is the capacitance of the junction, $\omega = 2\pi f$ with f the intensity modulation frequency of the light beam, q is the elementary charge, F is the electron-hole pair separation rate, I and K are modified Bessel functions of respectively the first and second kind, and i is the imaginary unit, R0 radius of the first probe, R1 and R2 are the inner and outer radii of the second probe while $\theta$ is the angle thereof.

8. The method according to claim 7, wherein the calculation in process d) is performed with the first photo-voltage V1 and the second photo-voltage V2 for at least two p-n junctions.

9. The method according to claim 1, wherein the calculation in process d) is performed with the first photo-voltage $V_1$ and the second photo-voltage $V_2$ for at least one p-n junction according to $$V_1 = \frac{(1 - x_-) V_1^+ - (1 - x_+) V_1^-}{x_+ - x_-}$$

-continued $$V_2 = \frac{(1-x_-)V_2^+ - (1-x_+)V_2^-}{x_+ - x_-}$$

where $$V_1^{\pm} = -\frac{\zeta_1 + x_{\pm}\zeta_2}{\beta_{\pm}^2}[1 - 2K_1(\beta_{\pm}R_0)I_1(\beta_{\pm}R_0)]$$

$$V_2^{\pm} = -\frac{\theta}{\pi R_0}\frac{\zeta_1 + x_{\pm}\zeta_2}{\beta_{\pm}^2}I_1(\beta_{\pm}R_0)[R_1K_1(\beta_{\pm}R_1) - R_2K_1(\beta_{\pm}R_2)]$$

and where $$\Phi_{tot}(r) = \frac{(1-x_-)\Phi_{x_+}(r) - (1-x_+)\Phi_{x_-}(r)}{x_+ - x_-}$$

where $$x_{\pm} = \frac{\beta_1^2 + \beta_{12}^2 - \beta_2^2}{2\beta_{12}^2} \pm \left(\left(\frac{\beta_1^2 + \beta_{12}^2 - \beta_2^2}{2\beta_{12}^2}\right)^2 + \frac{\beta_2^2}{\beta_{12}^2}\right)^{1/2}$$

$$\Phi_{x_{\pm}}(r) = \begin{cases} -\frac{\zeta_1 + x_{\pm}\zeta_2}{\beta_{\pm}^2}[1 - a\beta_{\pm}K_1(\beta_{\pm}a)I_0(\beta_{\pm}r)], & r \le a \\ -\frac{\zeta_1 + x_{\pm}\zeta_2}{\beta_{\pm}^2}\beta_{\pm}aI_1(\beta_{\pm}a)K_0(\beta_{\pm}r), & r > a \end{cases}$$

$$\beta_1 = \sqrt{R_{sp}G_{s1} + i\omega R_{sp}C_{s1}}$$

$$\beta_2 = \sqrt{R_{sn}G_{s2} + i\omega R_{sn}C_{s2}}$$

$$\beta_{12} = \sqrt{R_{sn}G_{s1} + i\omega R_{sn}C_{s1}}$$

$$\zeta_1 = -R_{sp}qF_1 - R_{sn}q(F_1 + F_2)$$

$$\zeta_2 = R_{sn}q(F_1 + F_2)$$

$$\beta_{\pm} = \beta_2\sqrt{1 - \frac{1}{x_{\pm}}}$$

and where
$R_{sp}$ and $R_{sn}$ are, respectively, the sheet resistance of a first layer and a second, deeper layer, $G_{s1}$ and $G_{s2}$ are the conductance of a first and second junction, $C_{s1}$ and $C_{s2}$ are the capacitances of the first and second junction, $F_1$ and $F_2$ are the electron-hole pair separation rates of the first and second junctions, a is the light beam radius, r is the lateral distance from the light beam center.

10. The method according to claim 9, wherein the calculation in process d) is performed with the first photo-voltage V1 and the second photo-voltage V2 for at least two p-n junctions.

11. A junction-photovoltage apparatus for contactless determination of a physical parameter of a semiconductor structure comprising at least one p-n junction located at a surface, comprising:

a light source configured to illuminate the surface with the p-n junction of the semiconductor structure with a light beam of a first wavelength to create excess carriers at the surface;
a modulator configured to modulate the light intensity of the light beam at a single predefined frequency;
a measuring unit configured to contactlessly determine a first photo-voltage at a first position inside the illuminated area, to contactlessly determine a second photo-voltage at at least a second position outside the illuminated area, to contactlessly determine a third and a fourth photo-voltage by illuminating the surface with the p-n junction by a modulated light beam having another wavelength and/or by selecting further measurements positions outside the illumination area; and
a computing unit configured to calculate a physical parameter of the semiconductor structure based on the first, the second, the third, and the fourth photo-voltage.

12. The apparatus according to claim 11, wherein the measuring unit comprises at least two electrodes at at least two different positions outside the illuminated area.

13. The apparatus according to claim 11, wherein the measuring unit comprises at least one electrode that is moveable over the semiconductor structure outside the illuminated area.

14. The junction-photovoltage apparatus according to claim 11, wherein the semiconductor structure comprises a layer of an opposite dopant type for separating at least two layers of the same dopant type.

15. The junction-photovoltage apparatus according to claim 11, wherein the physical parameter comprises at least one of the following: a sheet resistance, a leakage current, a junction capacitance, a junction conductance, and a carrier separation rate.

16. The junction-photovoltage apparatus according to claim 11, wherein the semiconductor structure further comprises a layer of an opposite dopant type for separating at least two layers of the same dopant type.

17. The junction-photovoltage apparatus according to claim 11, wherein the semiconductor structure further comprises a substrate comprising a bulk semiconductor or a semiconductor-on-insulator.

18. A method of use for an apparatus according to claim 11 for a semiconductor structure comprising a layer of an opposite dopant type for separating at least two layers of the same dopant type and/or for a semiconductor structure comprising a substrate that comprises a bulk semiconductor or a semiconductor-on-insulator.

* * * * *